United States Patent
Van Zwet et al.

(10) Patent No.: US 9,235,140 B2
(45) Date of Patent: Jan. 12, 2016

(54) LITHOGRAPHIC APPARATUS AND DEVICE MANUFACTURING METHOD

(75) Inventors: Erwin John Van Zwet, Pijnacker (NL); Pieter Willem Herman De Jager, Middelbeers (NL); Johannes Onvlee, 's-Hertogenbosch (NL); Erik Christiaan Fritz, The Hague (NL)

(73) Assignee: ASML NETHERLANDS B.V., Veldhoven (NL)

(*) Notice: Subject to any disclaimer, the term of this patent is extended or adjusted under 35 U.S.C. 154(b) by 686 days.

(21) Appl. No.: 13/579,539

(22) PCT Filed: Feb. 18, 2011

(86) PCT No.: PCT/EP2011/052408
§ 371 (c)(1),
(2), (4) Date: Aug. 16, 2012

(87) PCT Pub. No.: WO2011/104180
PCT Pub. Date: Sep. 1, 2011

(65) Prior Publication Data
US 2012/0307223 A1 Dec. 6, 2012

Related U.S. Application Data

(60) Provisional application No. 61/307,421, filed on Feb. 23, 2010, provisional application No. 61/322,482, filed on Apr. 9, 2010.

(51) Int. Cl.
*G03B 27/54* (2006.01)
*G03F 7/20* (2006.01)

(52) U.S. Cl.
CPC ............ *G03F 7/704* (2013.01); *G03F 7/70275* (2013.01); *G03F 7/70391* (2013.01)

(58) Field of Classification Search
CPC .. G03F 7/70275; G03F 7/70391; G03F 7/704
See application file for complete search history.

(56) References Cited

U.S. PATENT DOCUMENTS

| 4,090,206 A | 5/1978 | Pfeifer |
| 4,447,126 A | 5/1984 | Heidrich |

(Continued)

FOREIGN PATENT DOCUMENTS

| DE | 4315580 | 11/1994 |
| DE | 4315581 | 11/1994 |

(Continued)

OTHER PUBLICATIONS

Taiwan Office Action dated Aug. 12, 2013 in corresponding Taiwan Patent Application No. 100106098.

(Continued)

*Primary Examiner* — Deoram Persaud
(74) *Attorney, Agent, or Firm* — Pillsbury Winthrop Shaw Pittman LLP

(57) ABSTRACT

A lithographic apparatus having an optical column capable of projecting a beam on a target portion on a substrate held by the substrate support. The optical column may have a self-emissive contrast device to emit the beam. The optical column may include a projection system to project the beam onto the target portion. The target portion has a height in a scanning direction of the substrate and a tangential width mainly perpendicular to the scanning direction, wherein a scanning speed of the substrate in the scanning direction divided by the height substantially corresponds with a rotating speed of the optical column or a part thereof divided by the tangential width of the target portion.

20 Claims, 42 Drawing Sheets

(56) References Cited

U.S. PATENT DOCUMENTS

| | | |
|---|---|---|
| 4,520,472 A | 5/1985 | Reno |
| 4,525,729 A | 6/1985 | Agulnek |
| 4,640,573 A | 2/1987 | Kataoka |
| 4,780,730 A | 10/1988 | Dodge |
| 4,796,038 A | 1/1989 | Allen |
| 4,844,568 A | 7/1989 | Suzuki |
| 4,864,216 A | 9/1989 | Kalata |
| 4,952,949 A | 8/1990 | Uebbing |
| 5,051,762 A | 9/1991 | Lea |
| 5,216,247 A | 6/1993 | Wang |
| 5,216,534 A | 6/1993 | Boardman |
| 5,229,872 A | 7/1993 | Mumola |
| 5,296,891 A | 3/1994 | Vogt |
| 5,457,488 A | 10/1995 | Nakamura |
| 5,481,392 A | 1/1996 | Damer |
| 5,523,193 A | 6/1996 | Nelson |
| 5,568,320 A | 10/1996 | Rees |
| 5,589,973 A | 12/1996 | King |
| 5,610,754 A | 3/1997 | Gheen |
| 5,668,587 A | 9/1997 | Hammond |
| 5,705,788 A | 1/1998 | Beyer |
| 5,838,024 A | 11/1998 | Masuda |
| 5,840,451 A | 11/1998 | Moore |
| 6,037,965 A | 3/2000 | Gross |
| 6,133,986 A | 10/2000 | Johnson |
| 6,204,875 B1 | 3/2001 | De Loor |
| 6,268,613 B1 | 7/2001 | Cantu |
| 6,310,710 B1 | 10/2001 | Shahar |
| 6,313,862 B1 | 11/2001 | Berner |
| 6,466,352 B1 | 10/2002 | Shahar |
| 6,531,681 B1 | 3/2003 | Markle |
| 6,559,438 B1 | 5/2003 | Drobot |
| 6,683,727 B1 | 1/2004 | Goring |
| 6,765,647 B1 | 7/2004 | Nishi |
| 6,795,169 B2 | 9/2004 | Tanaka |
| 6,967,711 B2 | 11/2005 | Gui |
| 7,116,402 B2 | 10/2006 | Gui |
| 7,440,078 B2 | 10/2008 | Bleeker et al. |
| 7,969,636 B2 | 6/2011 | Naito |
| 2002/0115021 A1 | 8/2002 | Piao |
| 2002/0126479 A1 | 9/2002 | Zhai |
| 2002/0171047 A1 | 11/2002 | Chan |
| 2003/0043582 A1 | 3/2003 | Chan |
| 2003/0091277 A1 | 5/2003 | Mei |
| 2004/0124372 A1 | 7/2004 | Gil |
| 2004/0135159 A1 | 7/2004 | Siegel |
| 2004/0257629 A1 | 12/2004 | Noehte |
| 2005/0167508 A1 | 8/2005 | Syms |
| 2006/0001855 A1 | 1/2006 | Lof |
| 2006/0103719 A1 | 5/2006 | Katzir |
| 2006/0108508 A1 | 5/2006 | Khalid |
| 2007/0034890 A1 | 2/2007 | Daschner |
| 2007/0182808 A1 | 8/2007 | Stiblert |
| 2007/0296936 A1 | 12/2007 | Kato |
| 2008/0042969 A1 | 2/2008 | Baker |
| 2008/0047445 A1 | 2/2008 | Berner |
| 2008/0137051 A1 | 6/2008 | Maly |
| 2008/0160211 A1 | 7/2008 | Siegel |
| 2008/0210888 A1 | 9/2008 | Inoue |
| 2009/0296063 A1 | 12/2009 | Opower |
| 2010/0142757 A1 | 6/2010 | Sandstrom |
| 2010/0265557 A1 | 10/2010 | Sallander |
| 2011/0051211 A1 | 3/2011 | Walther |
| 2011/0188016 A1 | 8/2011 | De Jager |

FOREIGN PATENT DOCUMENTS

| | | |
|---|---|---|
| DE | 19813127 | 10/1998 |
| EP | 1 835 347 | 9/2007 |
| JP | 57-152273 | 9/1982 |
| JP | S64-005016 | 1/1989 |
| JP | H01-308022 | 12/1989 |
| JP | H03-179723 | 8/1991 |
| JP | 06-275936 | 9/1994 |
| JP | 2003-220484 | 8/2003 |
| KR | 92-0002820 | 4/1992 |
| KR | 10-0856102 | 9/2008 |
| WO | 97/34171 | 9/1997 |
| WO | 98/33096 | 7/1998 |
| WO | 98/38597 | 9/1998 |
| WO | 2005/006082 | 1/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |

OTHER PUBLICATIONS

Korean Office Action mailed Dec. 31, 2013 in corresponding Korean Patent Application No. 10-2012-7024045.

Japanese Office Action mailed Nov. 27, 2013 in corresponding Japanese Patent Application No. 2012-553328.

International Search Report mailed Jun. 14, 2011 in International Patent Application No. PCT/EP2011/052408.

LOT-Oriel Group Europe, "MicroWriter™ Laser Lithography System," www.LOT-Oriel.com (2 pp, date unknown, obtained Jul. 2010).

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.

International Preliminary Report on Patentability and Written Opinion mailed Sep. 7, 2012 in corresponding International Patent Application No. PCT/EP2011/052408.

Korean Office Action dated Jun. 28, 2013 in corresponding Korean Patent Application No. 10-2012-7024045.

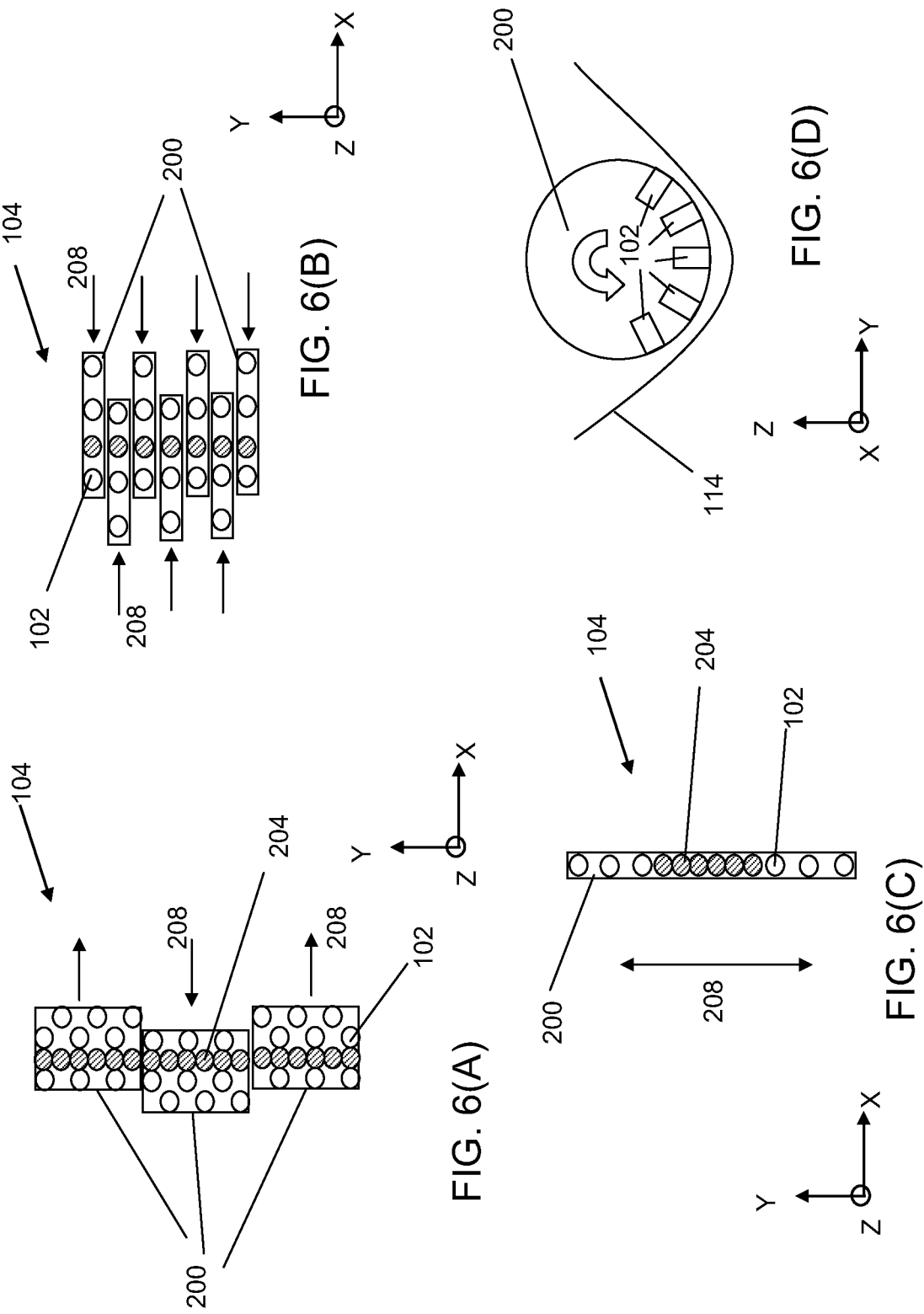

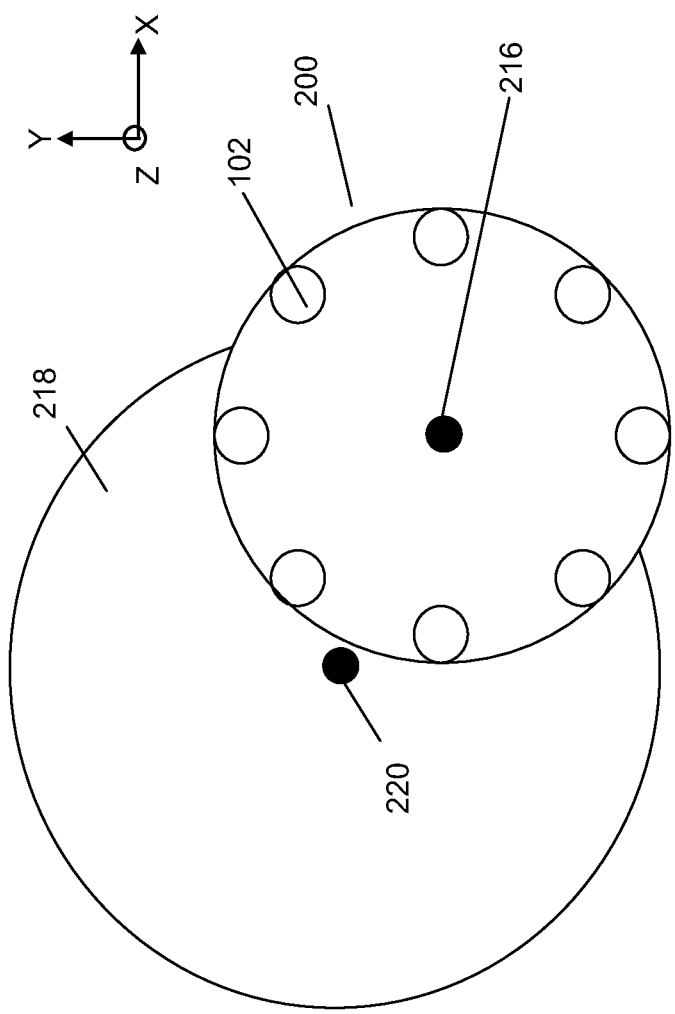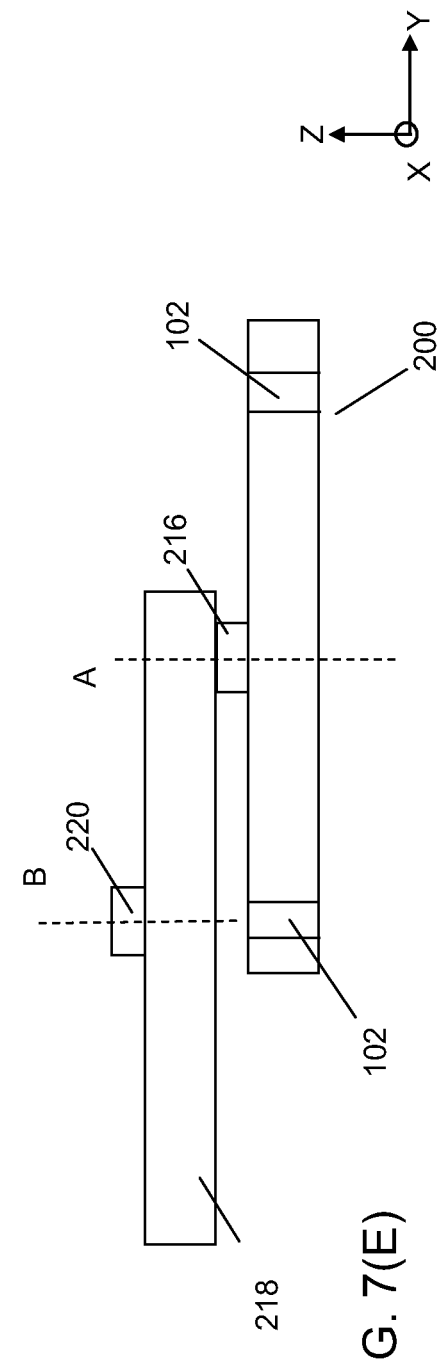

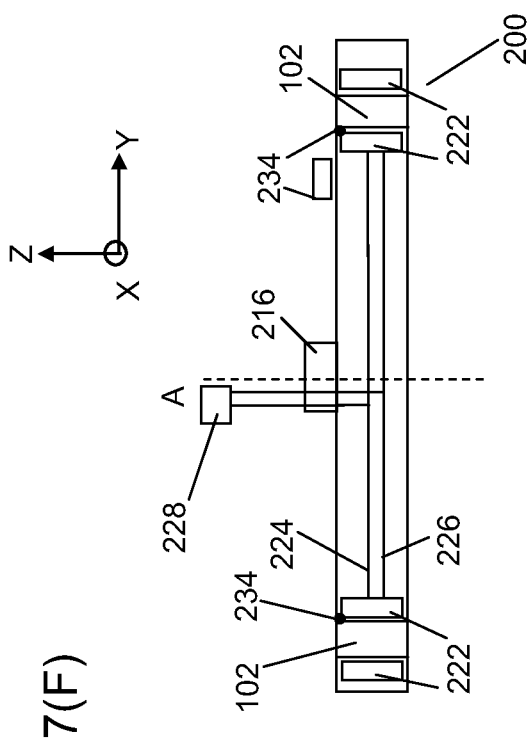
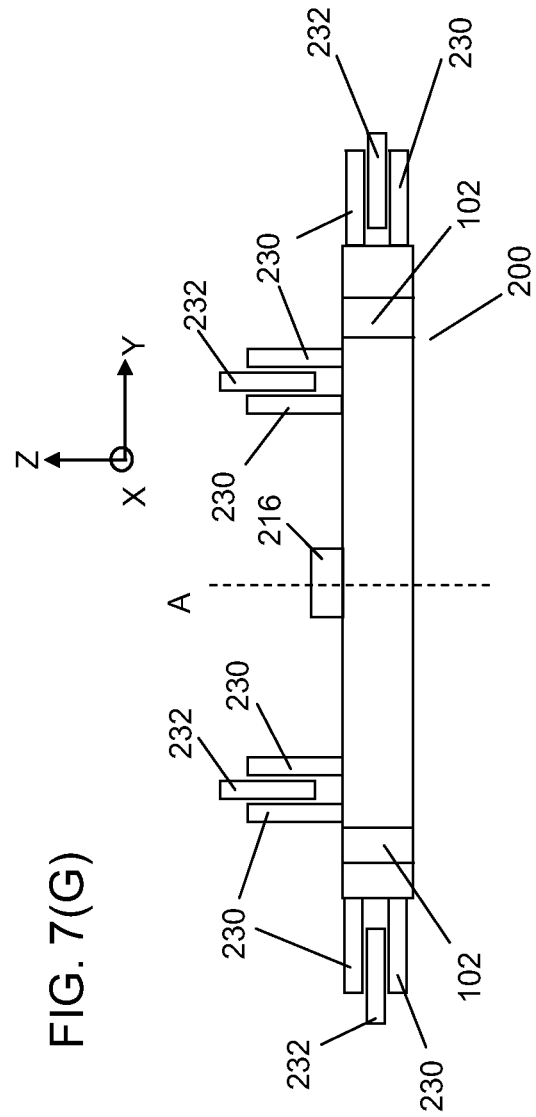

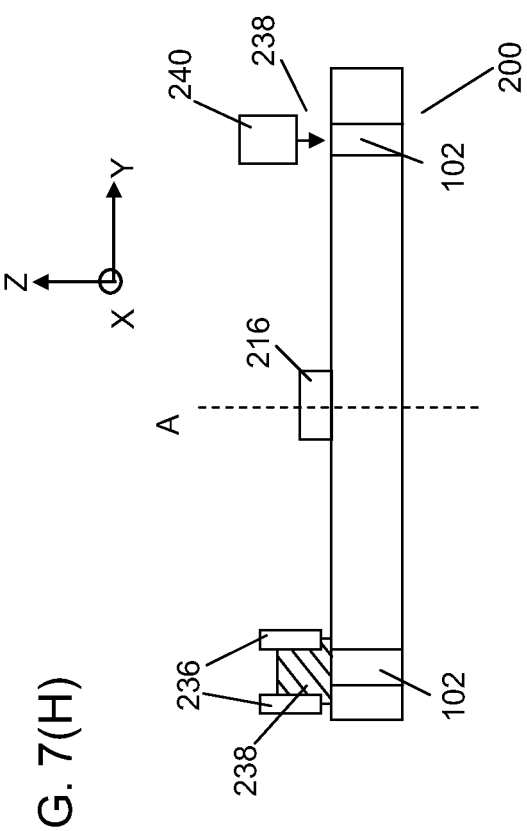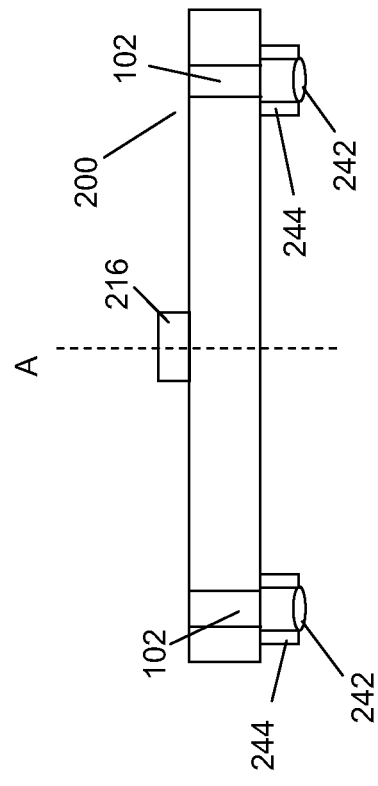

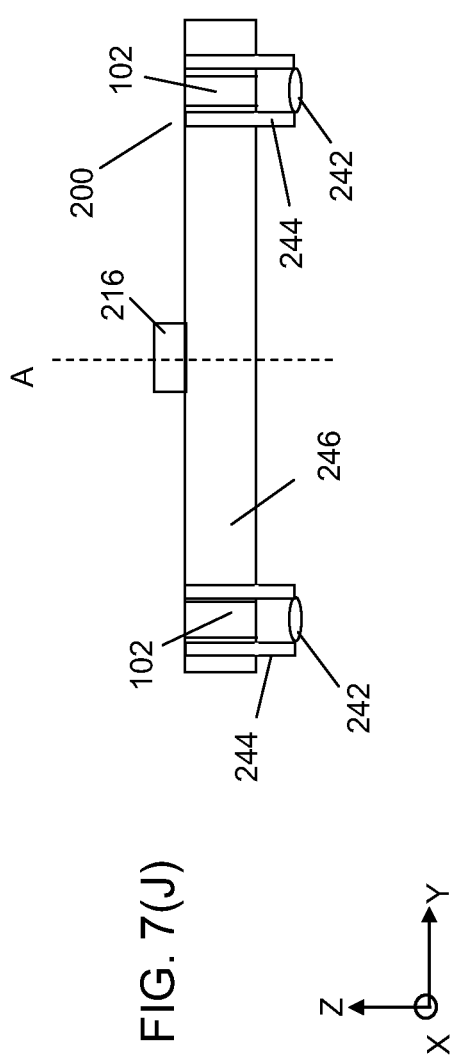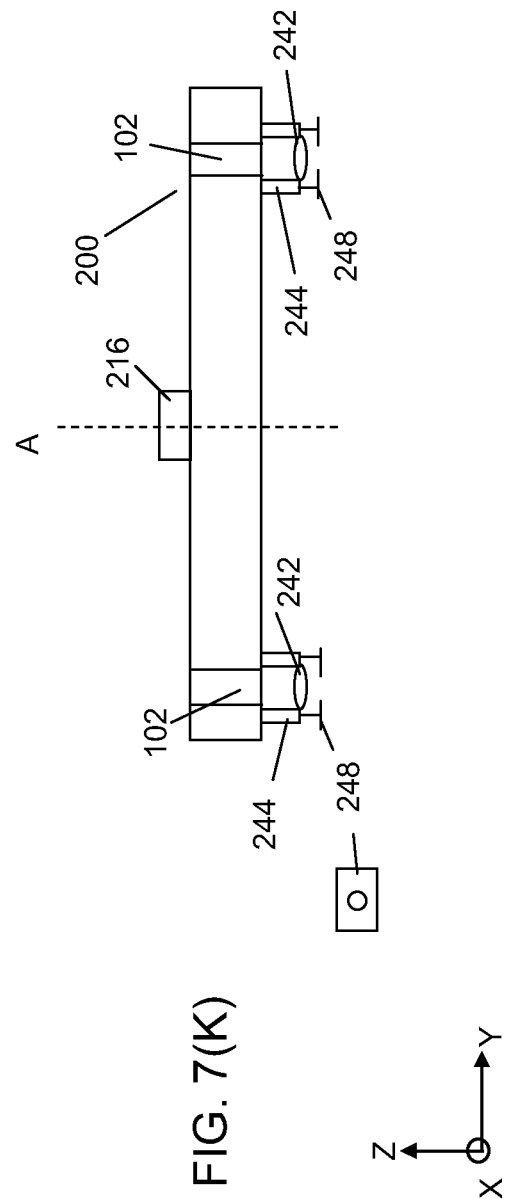

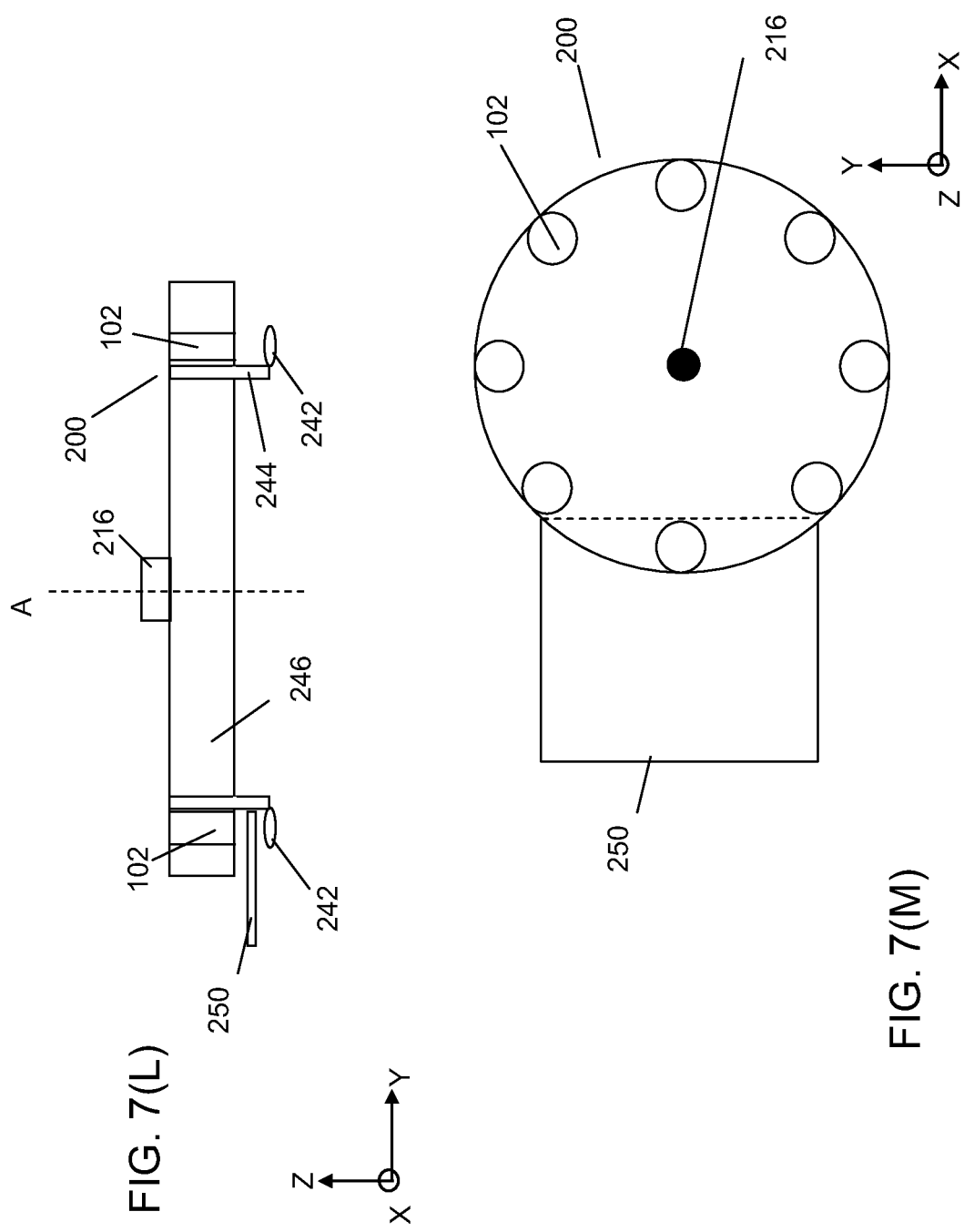

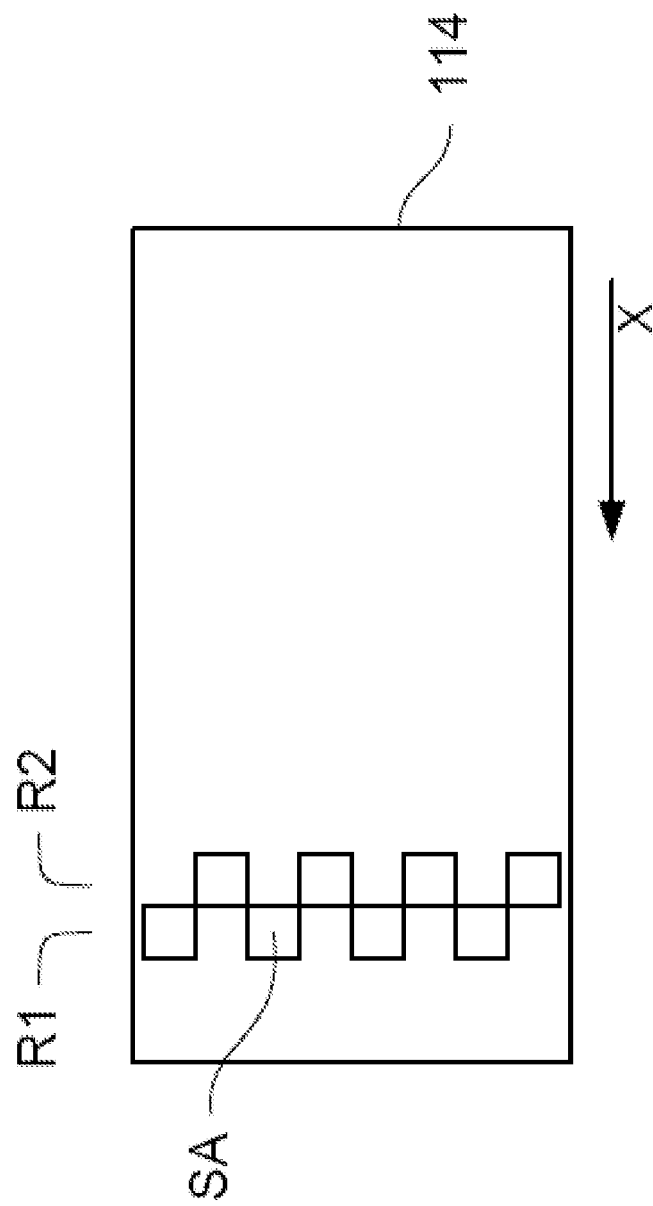

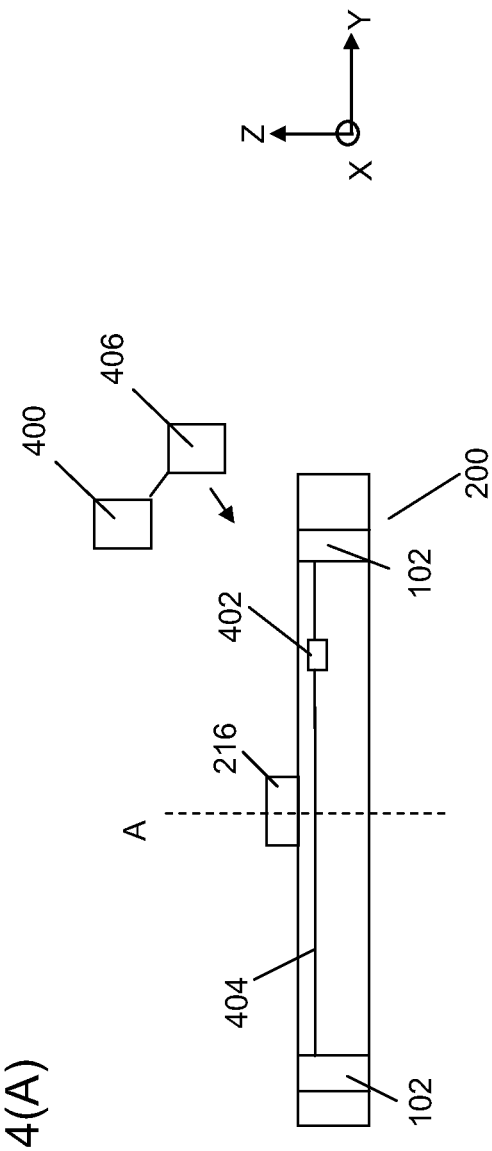
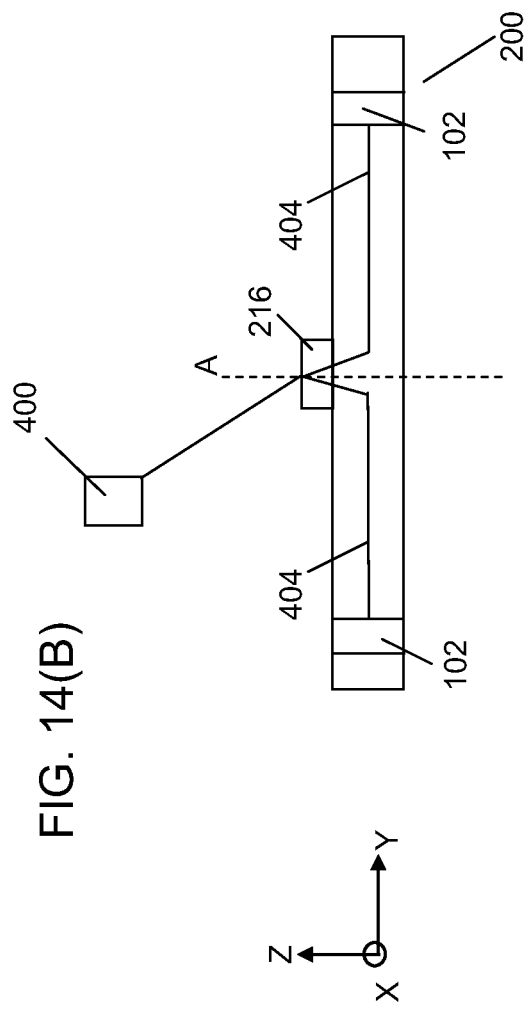
FIG. 14(A)
FIG. 14(B)

LITHOGRAPHIC APPARATUS AND DEVICE MANUFACTURING METHOD

CROSS-REFERENCE TO RELATED APPLICATIONS

This application is the United States national phase entry of PCT patent application no. PCT/EP2011/052408, filed Feb. 18, 2011 (published as PCT Patent Application Publication No. WO 2011/104180), which claims the benefit of U.S. provisional patent application 61/307,421, filed on Feb. 23, 2010 and the benefit of U.S. provisional patent application 61/322,482, filed on Apr. 9, 2010, the contents of each of the foregoing documents incorporated herein in its entirety by reference.

FIELD

The present invention relates to a lithographic apparatus, a programmable patterning device, and a device manufacturing method.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device. This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micromirror arrays, liquid crystal display (LCD) arrays, grating light valve arrays, and the like.

SUMMARY

It is desirable, for example, to provide a flexible, low-cost lithography apparatus that includes a programmable patterning device.

In an embodiment, a lithographic apparatus is disclosed that includes a modulator configured to expose an exposure area of the substrate to a plurality of beams modulated according to a desired pattern and a projection system configured to project the modulated beams onto the substrate. The modulator may be moveable with respect the exposure area and/or the projection system may have an array of lenses to receive the plurality of beams, the array of lenses moveable with respect to the exposure area.

In an embodiment, a lithographic apparatus may be provided with, for example, an optical column capable of creating a pattern onto a target portion of a substrate. The optical column may be provided with: a self-emissive contrast device configured to emit a beam and a projection system configured to project at least a portion of the beam onto the target portion. The apparatus may be provided with an actuator to move the optical column or a part thereof with respect to the substrate. By switching "on" or "off" the self-emissive contrast device during the movement, a pattern on the substrate may be created.

Generally, it is desirable that throughput and/or resolution of a lithographic apparatus is continuously improved. The throughput performance of the lithographic apparatus has to be adapted to the production process in which, for instance, flat panel displays or chips are manufactured. To streamline the production process it is desirable that the production time of the lithographic apparatus, i.e. the time to create a pattern on the whole surface of the substrate, is substantially equal, or does not exceed to a great extent the time required for other stages of the production process.

For some production processes, the production time for each stage of the production process is, for instance, limited to 60 seconds. In these 60 seconds, a pattern with the desired resolution has to be provided on the complete substrate.

Further, the size of substrates to be used in lithographic processes is continuously increasing. So, within the same production time, the greater substrate surface of such a larger substrate should be provided with a pattern; larger substrates can more efficiently be processed in other stages of the production process. Also, there is a demand for larger substrates in the market, for instance larger panel displays for the production of large flat screen TV's or computer monitors.

An increasing size of substrates and/or an increasing resolution of the pattern provided on the substrate generally requires an increase in the efficiency of the lithographic process.

It is desirable, for example, to provide a lithographic apparatus which is capable of efficiently creating a pattern on a substrate. It is desirable, for example, to provide a method of decreasing the relative exposure time of a substrate, i.e. the exposure time divided by the length of a substrate in such a lithographic apparatus.

According to an embodiment of the invention, there is provided an apparatus comprising:

an optical column capable of projecting a beam on a target portion of a substrate, the optical column comprising a projection system configured to project the beam onto the target portion;

a scanning movement actuator to move the substrate with a scanning speed in a scanning direction with respect to the optical column; and a rotating movement actuator to rotate the optical column or a part thereof with a rotating frequency resulting in a tangential rotation speed of the beam on the target portion, wherein the target portion has a height in the scanning direction and a tangential width mainly perpendicular to the scanning direction, wherein the scanning speed divided by the height substantially corresponds with the rotation speed of the beam divided by the tangential width.

According to an embodiment of the invention, there is provided a method of decreasing an exposure time divided by a substrate length in the above lithographic apparatus, the method comprising one or more selected from the following:

increasing the number of self-emissive contrast devices per optical column, increasing the radius of the central axis of the optical column on the rotatable part, increasing the rotating frequency of the rotatable part, decreasing the width of a target portion, minimizing the distance between a plurality of optical columns in the scanning direction, and decreasing the width of a target portion in the tangential direction.

BRIEF DESCRIPTION OF THE DRAWINGS

The accompanying drawings, which are incorporated herein and form a part of the specification, illustrate an embodiment of the present invention and, together with the description, further serve to explain the principles of the invention and to enable a person skilled in the pertinent art to make and use the invention. In the drawings, like reference numbers may indicate identical or functionally similar elements.

FIGS. 6(A)-(D) depict schematic top views and a side view of a part of a lithographic apparatus according to an embodiment of the present invention.

FIG. 13 depicts a schematic arrangement of optical engines.

FIGS. 14(A) and (B) depict schematic side views of a part of a lithographic apparatus according to an embodiment of the present invention.

DETAILED DESCRIPTION

One or more embodiments of a maskless lithographic apparatus, a maskless lithographic method, a programmable patterning device and other apparatus, articles of manufacture and methods are described herein. In an embodiment, a low cost and/or flexible maskless lithographic apparatus is provided. As it is maskless, no conventional mask is needed to expose, for example, ICs or flat panel displays. Similarly, one or more rings are not needed for packaging applications; the programmable patterning device can provide digital edge-processing "rings" for packaging applications to avoid edge projection. Maskless (digital patterning) can enable use with flexible substrates.

In an embodiment, the lithographic apparatus is capable of super-non-critical applications. In an embodiment, the lithographic apparatus is capable of ≥0.1 µm resolution, e.g. ≥0.5 µm resolution or ≥1 µm resolution. In an embodiment, the lithographic apparatus is capable of ≤20 µm resolution, e.g. ≤10 µm resolution, or ≤5 µm resolution. In an embodiment, the lithographic apparatus is capable of ~0.1-10 µm resolution. In an embodiment, the lithographic apparatus is capable of ≥50 nm overlay, e.g. ≥100 nm overlay, ≥200 nm overlay, or ≥300 nm overlay. In an embodiment, the lithographic apparatus is capable of ≤500 nm overlay, e.g. ≤400 nm overlay, ≤300 nm overlay, or ≤200 nm overlay. These overlay and resolution values may be regardless of substrate size and material.

In an embodiment, the lithographic apparatus is highly flexible. In an embodiment, the lithographic apparatus is scalable to substrates of different sizes, types and characteristics. In an embodiment, the lithographic apparatus has a virtually unlimited field size. Thus, the lithographic apparatus can enable multiple applications (e.g., IC, flat panel display, packaging, etc.) with a single lithographic apparatus or using multiple lithographic apparatus using a largely common lithographic apparatus platform. In an embodiment, the lithographic apparatus allows automated job generation to provide for flexible manufacture. In an embodiment, the lithographic apparatus provides 3D integration.

In an embodiment, the lithographic apparatus is low cost. In an embodiment, only common off-the-shelf components are used (e.g., radiation emitting diodes, a simple movable substrate holder, and a lens array). In an embodiment, pixel-grid imaging is used to enable simple projection optics. In an embodiment, a substrate holder having a single scan direction is used to reduce cost and/or reduce complexity.

Figure 1:
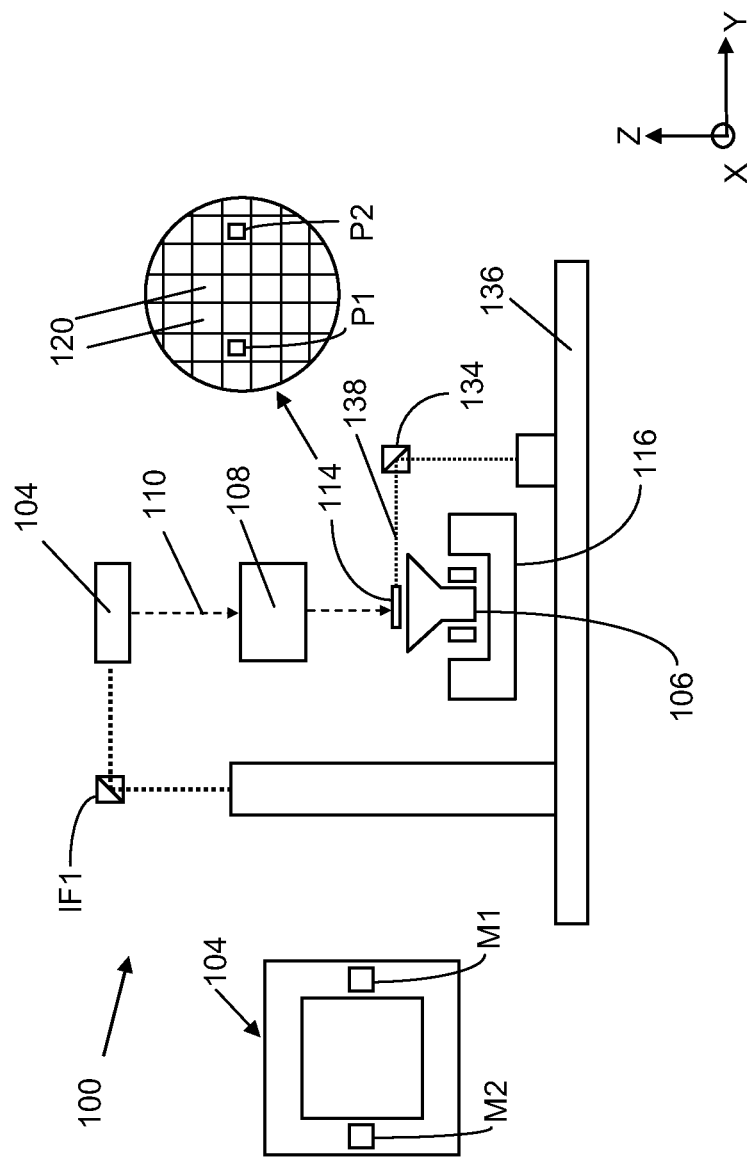
FIG. 1 depicts a schematic side view of a lithographic apparatus according to an embodiment of the present invention.

FIG. 1 schematically depicts a lithographic projection apparatus 100 according to an embodiment of the invention. Apparatus 100 includes a patterning device 104, an object holder 106 (e.g., an object table, for instance a substrate table), and a projection system 108.

In an embodiment, the patterning device 104 comprises a plurality of individually controllable elements 102 to modulate radiation to apply a pattern to beam 110. In an embodiment, the position of the plurality of individually controllable elements 102 can be fixed relative to projection system 108. However, in an alternative arrangement, a plurality of individually controllable elements 102 may be connected to a positioning device (not shown) to accurately position one or more of them in accordance with certain parameters (e.g., with respect to projection system 108).

In an embodiment, the patterning device 104 is a self-emissive contrast device. Such a patterning device 104 obviates the need for a radiation system, which can reduce, for example, cost and size of the lithographic apparatus. For example, each of the individually controllable elements 102 is a radiation emitting diode, such a light emitting diode (LED), an organic LED (OLED), a polymer LED (PLED), or a laser diode (e.g., solid state laser diode). In an embodiment, each of the individually controllable elements 102 is a laser diode. In an embodiment, each of the individually controllable elements 102 is a blue-violet laser diode (e.g., Sanyo model no. DL-3146-151). Such diodes are supplied by companies such as Sanyo, Nichia, Osram, and Nitride. In an embodiment, the diode emits radiation having a wavelength of about 365 nm or about 405 nm. In an embodiment, the diode can provide an output power selected from the range of 0.5-100 mW. In an embodiment, the size of laser diode (naked die) is selected from the range of 250-600 micrometers. In an embodiment, the laser diode has an emission area selected from the range of 1-5 micrometers. In an embodiment, the laser diode has a divergence angle selected from the range of 7-44 degrees. In an embodiment, the patterning device 104 has about $1 \times 10^5$ diodes having a configuration (e.g., emission area, divergence angle, output power, etc.) to provide a total brightness more than or equal to about $6.4 \times 10^8$ W/(m$^2$·sr).

In an embodiment, the self-emissive contrast device comprises more individually addressable elements 102 than needed to allow a "redundant" individually controllable element 102 to be used if another individually controllable element 102 fails to operate or doesn't operate properly. In an embodiment, redundant individually controllable elements may be used advantageously in an embodiment using movable individually controllable elements 102 as discussed, for example, with respect to FIG. 5 below.

In an embodiment, the individually controllable elements 102 of a self-emissive contrast device are operated in the steep part of the power/forward current curve of the individually controllable elements 102 (e.g., a laser diode). This may be more efficient and lead to less power consumption/heat. In an embodiment, the optical output per individually controllable element, when in use, is at least 1 mW, e.g. at least 10 mW, at least 25 mW, at least 50 mW, at least 100 mW, or at least 200 mW. In an embodiment, the optical output per individually controllable element, when in use, is less than 300 mW, less than 250 mW, less than 200 mW, less than 150 mW, less than 100 mW, less than 50 mW, less than 25 mW, or less than 10 mW. In an embodiment, the power consumption per programmable patterning device, when in use, to operate the individually controllable elements is less than 10 kW, e.g. less than 5 kW, less than 1 kW, or less than 0.5 kW. In an embodiment, the power consumption per programmable patterning device, when in use, to operate the individually controllable elements is at least 100 W, e.g. at least 300 W, at least 500 W, or at least 1 kW.

The lithographic apparatus 100 comprises an object holder 106. In this embodiment, the object holder comprises an object table 106 to hold a substrate 114 (e.g., a resist-coated silicon wafer or glass substrate). The object table 106 may be movable and be connected to a positioning device 116 to accurately position substrate 114 in accordance with certain parameters. For example, positioning device 116 may accurately position substrate 114 with respect to projection system 108 and/or the patterning device 104. In an embodiment, movement of object table 106 may be realized with a positioning device 116 comprising a long-stroke module (coarse positioning) and optionally a short-stroke module (fine positioning), which are not explicitly depicted in FIG. 1. In an embodiment, the apparatus is absent at least a short stroke module to move the object table 106. A similar system may be used to position the individually controllable elements 102. It will be appreciated that beam 110 may alternatively/additionally be moveable, while the object table 106 and/or the individually controllable elements 102 may have a fixed position to provide the required relative movement. Such an arrangement may assist in limiting the size of the apparatus. In an embodiment, which may e.g. be applicable in the manufacture of flat panel displays, the object table 106 may be stationary and positioning device 116 is configured to move substrate 114 relative to (e.g., over) object table 106. For example, the object table 106 may be provided with a system to scan the substrate 114 across it at a substantially constant velocity. Where this is done, object table 106 may be provided with a multitude of openings on a flat uppermost surface, gas being fed through the openings to provide a gas cushion which is capable of supporting substrate 114. This is conventionally referred to as a gas bearing arrangement. Substrate 114 is moved over object table 106 using one or more actuators (not shown), which are capable of accurately positioning substrate 114 with respect to the path of beam 110. Alternatively, substrate 114 may be moved with respect to the object table 106 by selectively starting and stopping the passage of gas through the openings. In an embodiment, the object holder 106 can be a roll system onto which a substrate is rolled and positioning device 116 may be a motor to turn the roll system to provide the substrate onto an object table 106.

Projection system 108 (e.g., a quartz and/or $CaF_2$ lens system or a catadioptric system comprising lens elements made from such materials, or a mirror system) can be used to project the patterned beam modulated by the individually controllable elements 102 onto a target portion 120 (e.g., one or more dies) of substrate 114. Projection system 108 may project image the pattern provided by the plurality of individually controllable elements 102 such that the pattern is coherently formed on the substrate 114. Alternatively, projection system 108 may project images of secondary sources for which the elements of the plurality of individually controllable elements 102 act as shutters.

In this respect, the projection system may comprise a focusing element, or a plurality of focusing elements (herein referred to generically as a lens array) e.g., a micro-lens array (known as an MLA) or a Fresnel lens array, e.g. to form the secondary sources and to image spots onto the substrate 114. In an embodiment, the lens array (e.g., MLA) comprises at least 10 focusing elements, e.g. at least 100 focusing elements, at least 1,000 focusing elements, at least 10,000 focusing elements, at least 100,000 focusing elements, or at least 1,000,000 focusing elements. In an embodiment, the number of individually controllable elements in the patterning device is equal to or greater than the number of focusing elements in the lens array. In an embodiment, the lens array comprises a focusing element that is optically associated with one or more of the individually controllable elements in the array of individually controllable elements, e.g. with only one of the individually controllable elements in the array of individually controllable elements, or with 2 or more of the individually controllable elements in the array of individually controllable elements, e.g., 3 or more, 5 or more, 10 or more, 20 or more, 25 or more, 35 or more, or 50 or more; in an embodiment, the focusing element is optically associated with less than 5,000 individually controllable elements, e.g. less than 2,500, less than 1,000, less than 500, or less than 100. In an embodiment, the lens array comprises more than one focusing element (e.g. more than 1,000, the majority, or about all) that is optically associated with one or more of the individually controllable elements in the array of individually controllable elements.

In an embodiment, the lens array is movable at least in the direction to and away from the substrate, e.g. with the use of one or more actuators. Being able to move the lens array to and away from the substrate allows, e.g., for focus adjustment without having to move the substrate. In an embodiment, individual lens element in the lens array, for instance each individual lens element in the lens array, are movable at least in the direction to and away from the substrate (e.g. for local focus adjustments on non-flat substrates or to bring each optical column into the same focus distance).

In an embodiment, the lens array comprises plastic focusing elements (which may be easy to make, e.g. injection molding, and/or affordable), where, for example, the wavelength of the radiation is greater than or equal to about 400 nm (e.g. 405 nm). In an embodiment, the wavelength of the radiation is selected from the range of about 400 nm-500 nm. In an embodiment, the lens array comprises quartz focusing elements. In an embodiment, each or a plurality of the focusing elements may be an asymmetrical lens. The asymmetry may be the same for each of the plurality of focusing elements or may be different for one or more focusing elements of a plurality of focusing elements than for one or more different focusing elements of a plurality of focusing elements. An asymmetrical lens may facilitate converting an oval radiation output into a circular projected spot, or vice versa.

In an embodiment, the focusing element has a high numerical aperture (NA) that is arranged to project radiation onto the substrate out of the focal point to obtain low NA for system. A higher NA lens may be more economic, prevalent and/or better quality than an available low NA lens. In an embodiment, low NA is less than or equal to 0.3, in an embodiment 0.18, 0.15 or less. Accordingly, a higher NA lens has a NA greater than the design NA for the system, for example, greater than 0.3, greater than 0.18, or greater than 0.15.

While, in an embodiment, the projection system 108 is separate from the patterning device 104, it need not be. The projection system 108 may be integral with the patterning device 108. For example, a lens array block or plate may be attached to (integral with) with a patterning device 104. In an embodiment, the lens array may be in the form of individual spatially separated lenslets, each lenslet attached to (integral with) with an individually addressable element of the patterning device 104 as discussed in more detail below.

Optionally, the lithographic apparatus may comprise a radiation system to supply radiation (e.g., ultraviolet (UV) radiation) to the plurality of individually controllable elements 102. If the patterning device is a radiation source itself, e.g. a laser diode array or a LED array, the lithographic apparatus may be designed without a radiation system, i.e. without a radiation source other than the patterning device itself, or at least a simplified radiation system.

The radiation system includes an illumination system (illuminator) configured to receive radiation from a radiation source. The illumination system includes one or more of the following elements: a radiation delivery system (e.g., suitable directing mirrors), a radiation conditioning device (e.g., a beam expander), an adjusting device to set the angular intensity distribution of the radiation (generally, at least the outer and/or inner radial extent (commonly referred to as σ-outer and σ-inner, respectively) of the intensity distribution in a pupil plane of the illuminator can be adjusted), an integrator, and/or a condenser. The illumination system may be used to condition the radiation that will be provided to the individually controllable elements 102 to have a desired uniformity and intensity distribution in its cross-section. The illumination system may be arranged to divide radiation into a plurality of sub-beams that may, for example, each be associated with one or more of the plurality of the individually controllable elements. A two-dimensional diffraction grating may, for example, be used to divide the radiation into sub-beams. In the present description, the terms "beam of radiation" and "radiation beam" encompass, but are not limited to, the situation in which the beam is comprised of a plurality of such sub-beams of radiation.

The radiation system may also include a radiation source (e.g., an excimer laser) to produce the radiation for supply to or by the plurality of individually controllable elements 102. The radiation source and the lithographic apparatus 100 may be separate entities, for example when the radiation source is an excimer laser. In such cases, the radiation source is not considered to form part of the lithographic apparatus 100 and the radiation is passed from the source to the illuminator. In other cases the radiation source may be an integral part of the lithographic apparatus 100, for example when the source is a mercury lamp. It is to be appreciated that both of these scenarios are contemplated within the scope of the present invention.

In an embodiment, the radiation source, which in an embodiment may be the plurality of individually controllable elements 102, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365 nm, 405 nm and 436 nm. A 355 nm laser source could be used. In an embodiment, the radiation has a wavelength of about 405 nm.

In an embodiment, radiation is directed from the illumination system at the patterning device 104 at an angle between 0 and 90°, e.g. between 5 and 85°, between 15 and 75°, between 25 and 65°, or between 35 and 55°. The radiation from the illumination system may be provided directly to the patterning device 104. In an alternative embodiment, radiation may be directed from the illumination system to the patterning device 104 by means of a beam splitter (not shown) configured such that the radiation is initially reflected by the beam splitter and directed to the patterning device 104. The patterning device 104 modulates the beam and reflects it back to the beam splitter which transmits the modulated beam toward the substrate 114. It will be appreciated, however, that alternative arrangements may be used to direct radiation to the patterning device 104 and subsequently to the substrate 114. In particular, an illumination system arrangement may not be required if a transmissive patterning device 104 (e.g. a LCD array) is used or the patterning device 104 is self-emissive (e.g., a plurality of diodes).

In operation of the lithographic apparatus 100, where the patterning device 104 is not radiation emissive (e.g., comprising LEDs), radiation is incident on the patterning device 104 (e.g., a plurality of individually controllable elements) from a radiation system (illumination system and/or radiation source) and is modulated by the patterning device 104. The patterned beam 110, after having been created by the plurality of individually controllable elements 102, passes through projection system 108, which focuses beam 110 onto a target portion 120 of the substrate 114.

With the aid of positioning device 116 (and optionally a position sensor 134 on a base 136 (e.g., an interferometric measuring device that receives an interferometric beam 138, a linear encoder or a capacitive sensor)), substrate 114 can be moved accurately, e.g., so as to position different target portions 120 in the path of beam 110. Where used, the positioning device for the plurality of individually controllable elements 102 can be used to accurately correct the position of the plurality of individually controllable elements 102 with respect to the path of beam 110, e.g., during a scan.

Although lithography apparatus 100 according to an embodiment of the invention is herein described as being for exposing a resist on a substrate, it will be appreciated that apparatus 100 may be used to project a patterned beam 110 for use in resistless lithography.

As here depicted, the lithographic apparatus 100 is of a reflective type (e.g. employing reflective individually controllable elements). Alternatively, the apparatus may be of a transmissive type (e.g. employing transmissive individually controllable elements).

The depicted apparatus 100 can be used in one or more modes e.g.:

1. In step mode, the individually controllable elements 102 and the substrate 114 are kept essentially stationary, while an entire patterned radiation beam 110 is projected onto a target portion 120 at one go (i.e. a single static exposure). The substrate 114 is then shifted in the X- and/or Y-direction so that a different target portion 120 can be exposed to the patterned radiation beam 110. In step mode, the maximum size of the exposure field limits the size of the target portion 120 imaged in a single static exposure.

2. In scan mode, the individually controllable elements 102 and the substrate 114 are scanned synchronously while a pattern radiation beam 110 is projected onto a target portion 120 (i.e. a single dynamic exposure). The velocity and direction of the substrate relative to the individually controllable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the individually controllable elements 102 are kept essentially stationary and the entire pattern is projected onto a target portion 120 of the substrate 114 using pulsing (e.g., provided by a pulsed radiation source or by pulsing the individually controllable elements). The substrate 114 is moved with an essentially constant speed such that the patterned beam 110 is caused to scan a line across the substrate 114. The pattern provided by the individually controllable elements is updated as required between pulses and the pulses are timed such that successive target portions 120 are exposed at the required locations on the substrate 114. Consequently, patterned beam 110 can scan across the substrate 114 to expose the complete pattern for a strip of the substrate 114. The process is repeated until the complete substrate 114 has been exposed line by line.

4. In continuous scan mode, essentially the same as pulse mode except that the substrate 114 is scanned relative to the modulated beam of radiation B at a substantially constant speed and the pattern on the array of individually controllable elements is updated as the patterned beam 110 scans across the substrate 114 and exposes it. A substantially constant radiation source or a pulsed radiation source, synchronized to the updating of the pattern on the array of individually controllable elements may be used.

Combinations and/or variations on the above described modes of use or entirely different modes of use may also be employed.

Figure 2:
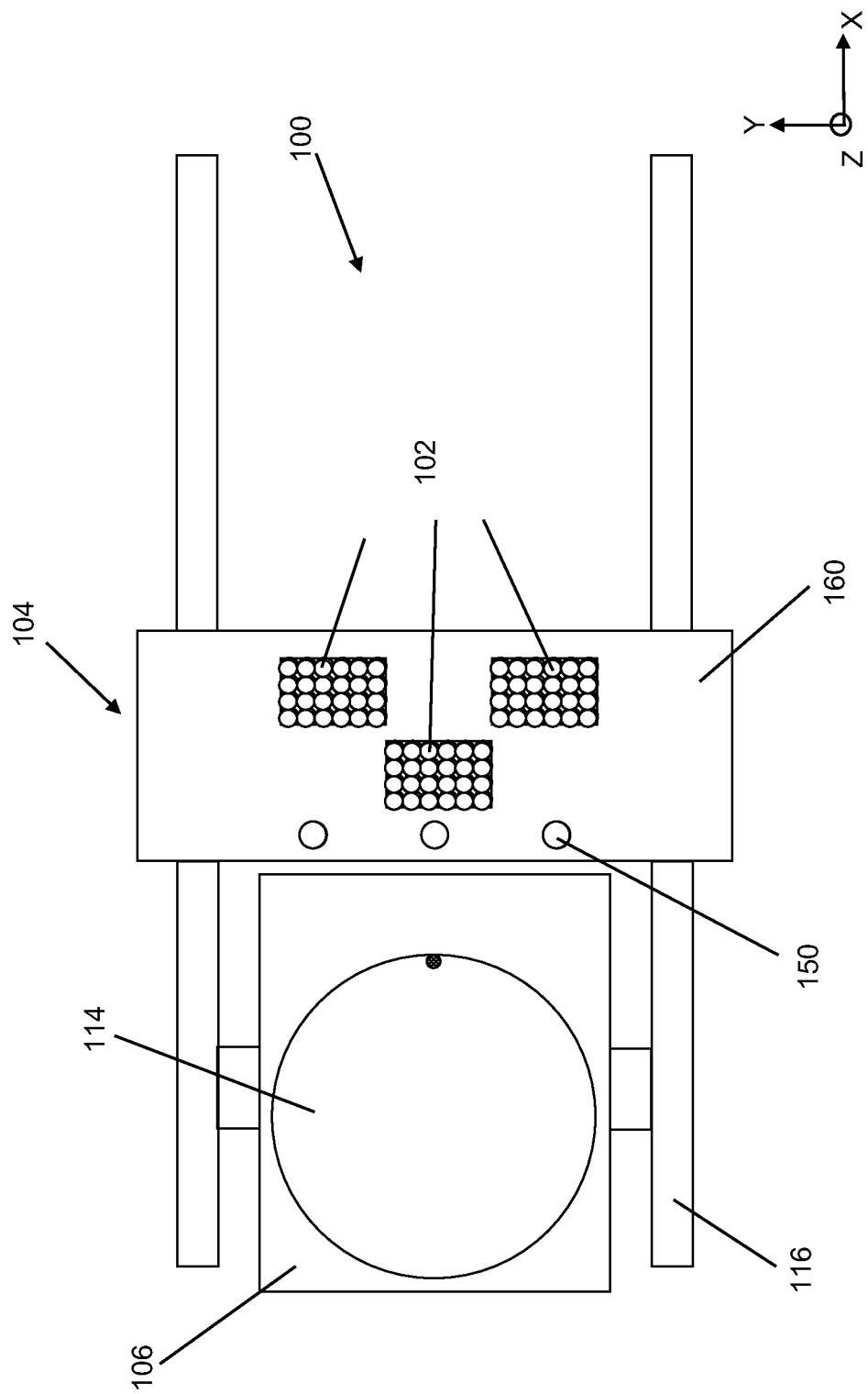
FIG. 2 depicts a schematic top view of a lithographic apparatus according to an embodiment of the present invention.

FIG. 2 depicts schematic top view of a lithographic apparatus according to an embodiment of the invention for use with wafers (e.g., 300 mm wafers). As shown in FIG. 2, the lithographic apparatus 100 comprises a substrate table 106 to hold a wafer 114. Associated with the substrate table 106 is a positioning device 116 to move the substrate table 106 in at least the X-direction. Optionally, the positioning device 116 may move the substrate table 106 in the Y-direction and/or Z-direction. The positioning device 116 may also rotate the substrate table 106 about the X-, Y- and/or Z-directions. Accordingly, the positioning device 116 may provide motion in up to 6 degrees of freedom. In an embodiment, the substrate table 106 provides motion only in the X-direction, an advantage of which is lower costs and less complexity. In an embodiment, the substrate table 106 comprises relay optics.

The lithographic apparatus 100 further comprises a plurality of individually addressable elements 102 arranged on a frame 160. Frame 160 may be mechanically isolated from the substrate table 106 and its positioning device 116. Mechanical isolation may be provided, for example, by connecting the frame 160 to ground or a firm base separately from the frame for the substrate table 106 and/or its positioning device 116. In addition or alternatively, dampers may be provided between frame 160 and the structure to which it is connected, whether that structure is ground, a firm base or a frame supporting the substrate table 106 and/or its positioning device 116.

In this embodiment, each of the individually addressable elements 102 is a radiation emitting diode, e.g., a blue-violet laser diode. As shown in FIG. 2, the individually addressable elements 102 may be arranged into at least 3 separate arrays of individually addressable elements 102 extending along the Y-direction. In an embodiment, an array of individually addressable elements 102 is staggered in the X-direction from an adjacent array of individually addressable elements 102. The lithographic apparatus 100, particularly the individually addressable elements 102, may be arranged to provide pixel-grid imaging as described in more detail herein.

Each of the arrays of individually addressable elements 102 may be part of an individual optical engine component, which may be manufactured as a unit for easy replication. Moreover, frame 160 may be configured to be expandable and configurable to easily adopt any number of such optical engine components. The optical engine component may comprise a combination of an array of individually addressable elements 102 and lens array 170 (see, e.g., FIG. 8). For example, in FIG. 2, there are depicted 3 optical engine components (with an associated lens array 170 below each respective array of individually addressable elements 102). Accordingly, in an embodiment, a multi-column optical arrangement may be provided, with each optical engine forming a column.

Further, the lithographic apparatus 100 comprises an alignment sensor 150. The alignment sensor is used to determine alignment between the individually addressable elements 102 and the substrate 114 before and/or during exposure of the substrate 114. The results of the alignment sensor 150 can be used by a controller of the lithographic apparatus 100 to control, for example, the positioning device 116 to position the substrate table 106 to improve alignment. In addition or alternatively, the controller may control, for example, a positioning device associated with the individually addressable elements 102 to position one or more of the individually addressable elements 102 to improve alignment. In an embodiment, the alignment sensor 150 may include pattern recognition functionality/software to perform alignment.

The lithographic apparatus 100, in addition or alternatively, comprises a level sensor 150. The level sensor 150 is used to determine whether the substrate 106 is level with respect to the projection of the pattern from the individually addressable elements 102. The level sensor 150 can determine level before and/or during exposure of the substrate 114. The results of the level sensor 150 can be used by a controller of the lithographic apparatus 100 to control, for example, the positioning device 116 to position the substrate table 106 to improve leveling. In addition or alternatively, the controller may control, for example, a positioning device associated with a projection system 108 (e.g., a lens array) to position an element of the projection system 108 (e.g., a lens array) to improve leveling. In an embodiment, the level sensor may operate by projecting an ultrasonic beam at the substrate 106 and/or operate by projecting an electromagnetic beam of radiation at the substrate 106.

In an embodiment, results from the alignment sensor and/or the level sensor may be used to alter the pattern provided by the individually addressable elements 102. The pattern may be altered to correct, for example, distortion, which may arise from, e.g., optics (if any) between the individually addressable elements 102 and the substrate 114, irregularities in the positioning of the substrate 114, unevenness of the substrate 114, etc. Thus, results from the alignment sensor and/or the level sensor can be used to alter the projected pattern to effect a non-linear distortion correction. Non-linear distortion correction may be useful, for example, for flexible displays, which may not have consistent linear or non-linear distortion.

In operation of the lithographic apparatus 100, a substrate 114 is loaded onto the substrate table 106 using, for example, a robot handler (not shown). The substrate 114 is then displaced in the X-direction under the frame 160 and the individually addressable elements 102. The substrate 114 is measured by the level sensor and/or the alignment sensor 150 and then is exposed to a pattern using individually addressable elements 102. For example, the substrate 114 is scanned through the focal plane (image plane) of the projection system 108, while the sub-beams, and hence the image spots S (see, e.g., FIG. 12), are switched at least partially ON or fully ON or OFF by the patterning device 104. Features corresponding to the pattern of the patterning device 104 are formed on the substrate 114. The individually addressable elements 102 may be operated, for example, to provide pixel-grid imaging as discussed herein.

In an embodiment, the substrate 114 may be scanned completely in the positive X direction and then scanned completely in the negative X direction. In such an embodiment, an additional level sensor and/or alignment sensor 150 on the opposite side of the individually addressable elements 102 may be required for the negative X direction scan.

Figure 3:
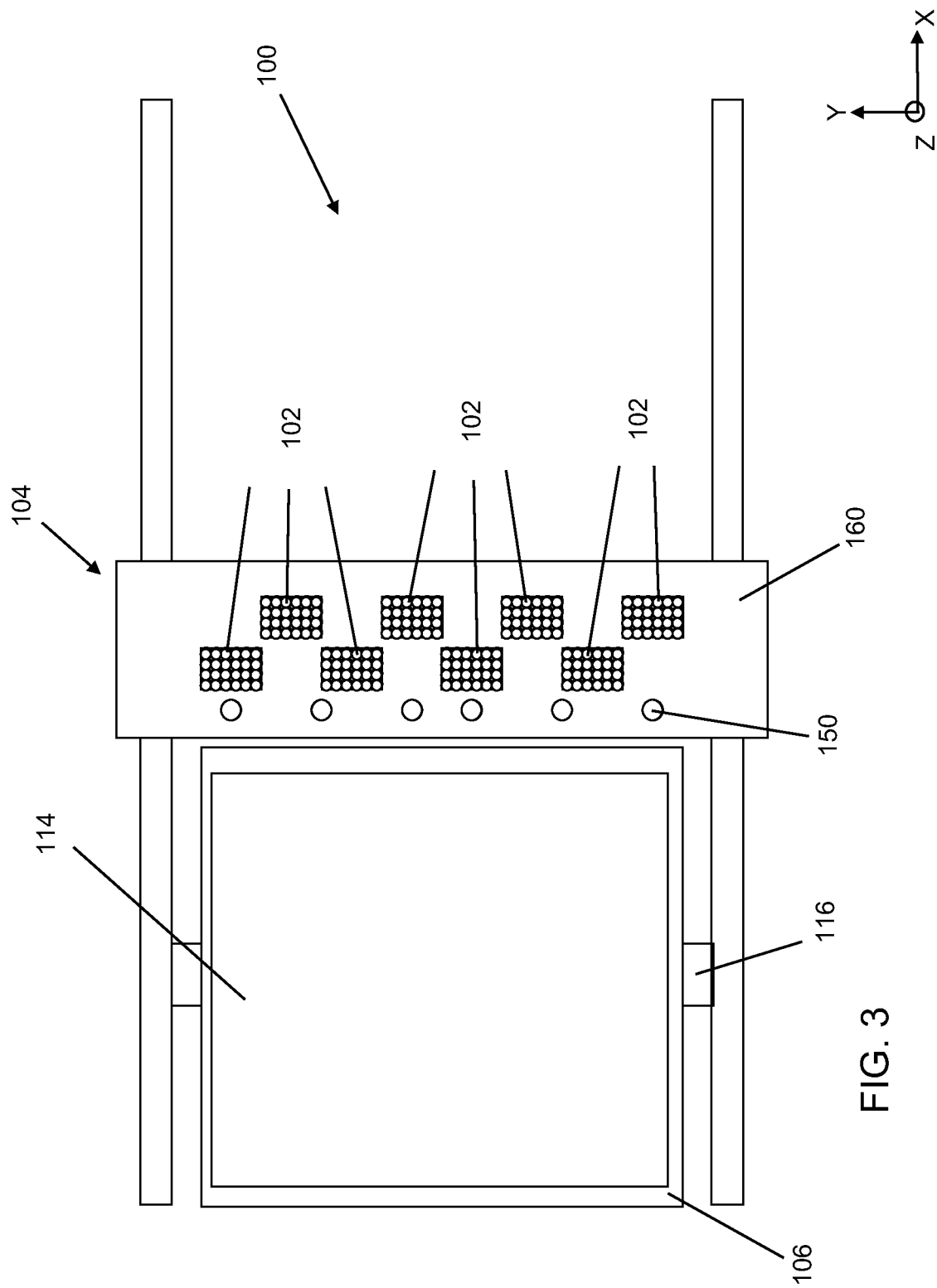
FIG. 3 depicts a schematic top view of a lithographic apparatus according to an embodiment of the present invention.

FIG. 3 depicts a schematic top view of a lithographic apparatus according to an embodiment of the invention for exposing substrates in the manufacture of, for instance, flat panel displays (e.g., LCDs, OLED displays, etc.). Like the lithographic apparatus 100 shown in FIG. 2, the lithographic apparatus 100 comprises a substrate table 106 to hold a flat panel display substrate 114, a positioning device 116 to move the substrate table 106 in up to 6 degrees of freedom, an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus 100 further comprises a plurality of individually addressable elements 102 arranged on a frame 160. In this embodiment, each of the individually addressable elements 102 is a radiation emitting diode, e.g., a blue-violet laser diode. As shown in FIG. 3, the individually addressable elements 102 are arranged into a number (e.g., at least 8) of stationary separate arrays of individually addressable elements 102 extending along the Y-direction. In an embodiment, the arrays are substantially stationary, i.e., they do not move significantly during projection. Further, in an embodiment, a number of the arrays of individually addressable elements 102 are staggered in the X-direction from adjacent array of individually addressable elements 102 in an alternating fashion. The lithographic apparatus 100, particularly the individually addressable elements 102, may be arranged to provide pixel-grid imaging.

In operation of the lithographic apparatus 100, a panel display substrate 114 is loaded onto the substrate table 106 using, for example, a robot handler (not shown). The substrate 114 is then displaced in the X-direction under the frame 160 and the individually addressable elements 102. The substrate 114 is measured by the level sensor and/or the alignment sensor 150 and then is exposed to a pattern using individually addressable elements 102. The individually addressable elements 102 may be operated, for example, to provide pixel-grid imaging as discussed herein.

Figure 4:
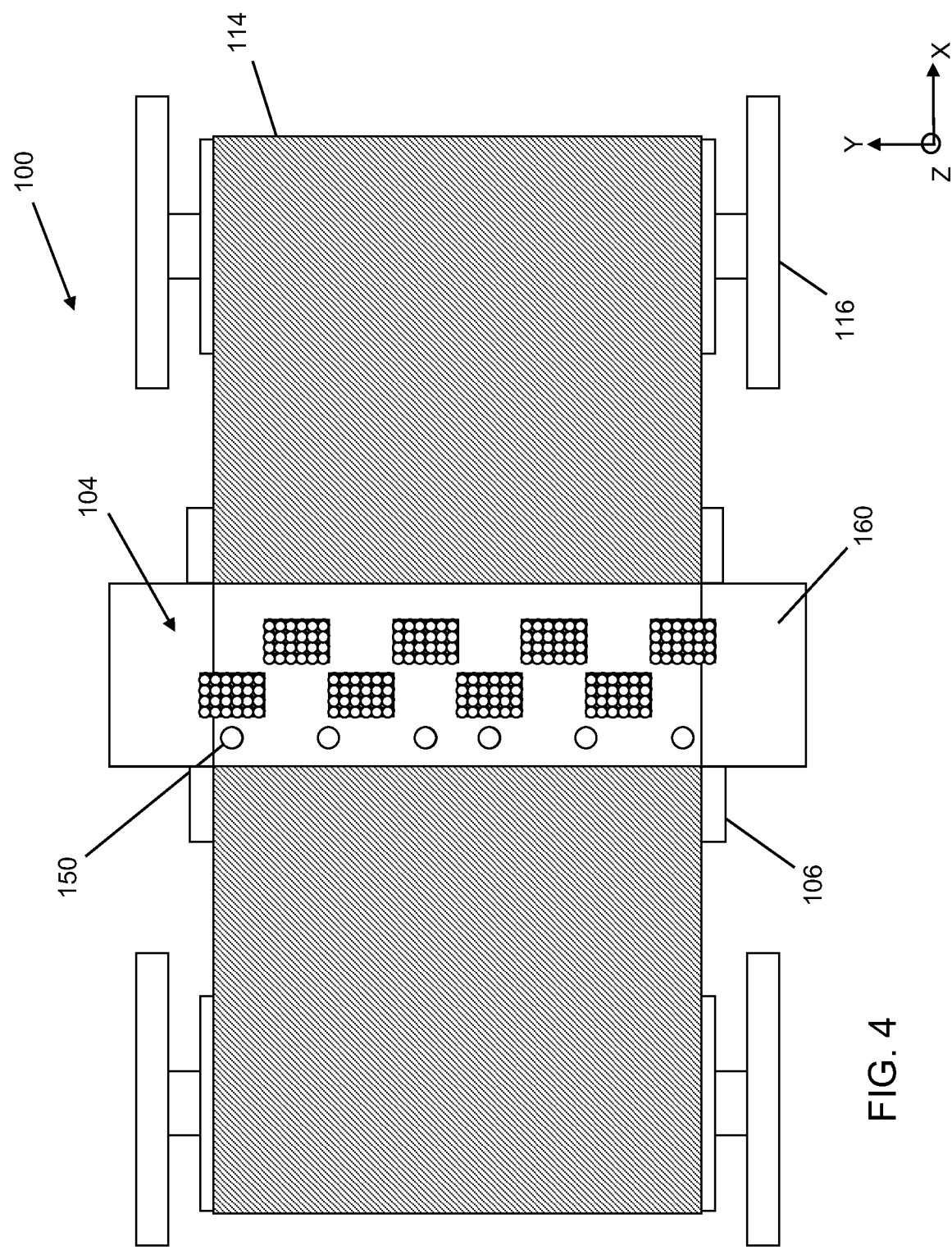
FIG. 4 depicts a schematic top view of a lithographic apparatus according to an embodiment of the present invention.

FIG. 4 depicts a schematic top view of a lithographic apparatus according to an embodiment of the invention for use with roll-to-roll flexible displays/electronics. Like the lithographic apparatus 100 shown in FIG. 3, the lithographic apparatus 100 comprises a plurality of individually addressable elements 102 arranged on a frame 160. In this embodiment, each of the individually addressable elements 102 is a radiation emitting diode, e.g., a blue-violet laser diode. Further, the lithographic apparatus comprises an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus may also comprise an object holder having an object table 106 over which a substrate 114 is moved. The substrate 114 is flexible and is rolled onto a roll connected to positioning device 116, which may be a motor to turn the roll. In an embodiment, the substrate 114 may, in addition or alternatively, be rolled from a roll connected to positioning device 116, which may be a motor to turn the roll. In an embodiment, there are at least two rolls, one from which the substrate is rolled and another onto which the substrate is rolled. In an embodiment, object table 106 need not be provided if, for example, substrate 114 is stiff enough between the rolls. In such a case, there would still be an object holder, e.g., one or more rolls. In an embodiment, the lithographic apparatus can provide substrate carrier-less (e.g., carrier-less-foil (CLF)) and/or roll to roll manufacturing. In an embodiment, the lithographic apparatus can provide sheet to sheet manufacturing.

In operation of the lithographic apparatus 100, flexible substrate 114 is rolled onto, and/or from a roll, in the X-direction under the frame 160 and the individually addressable elements 102. The substrate 114 is measured by the level sensor and/or the alignment sensor 150 and then is exposed to a pattern using individually addressable elements 102. The individually addressable elements 102 may be operated, for example, to provide pixel-grid imaging as discussed herein.

Figure 5:
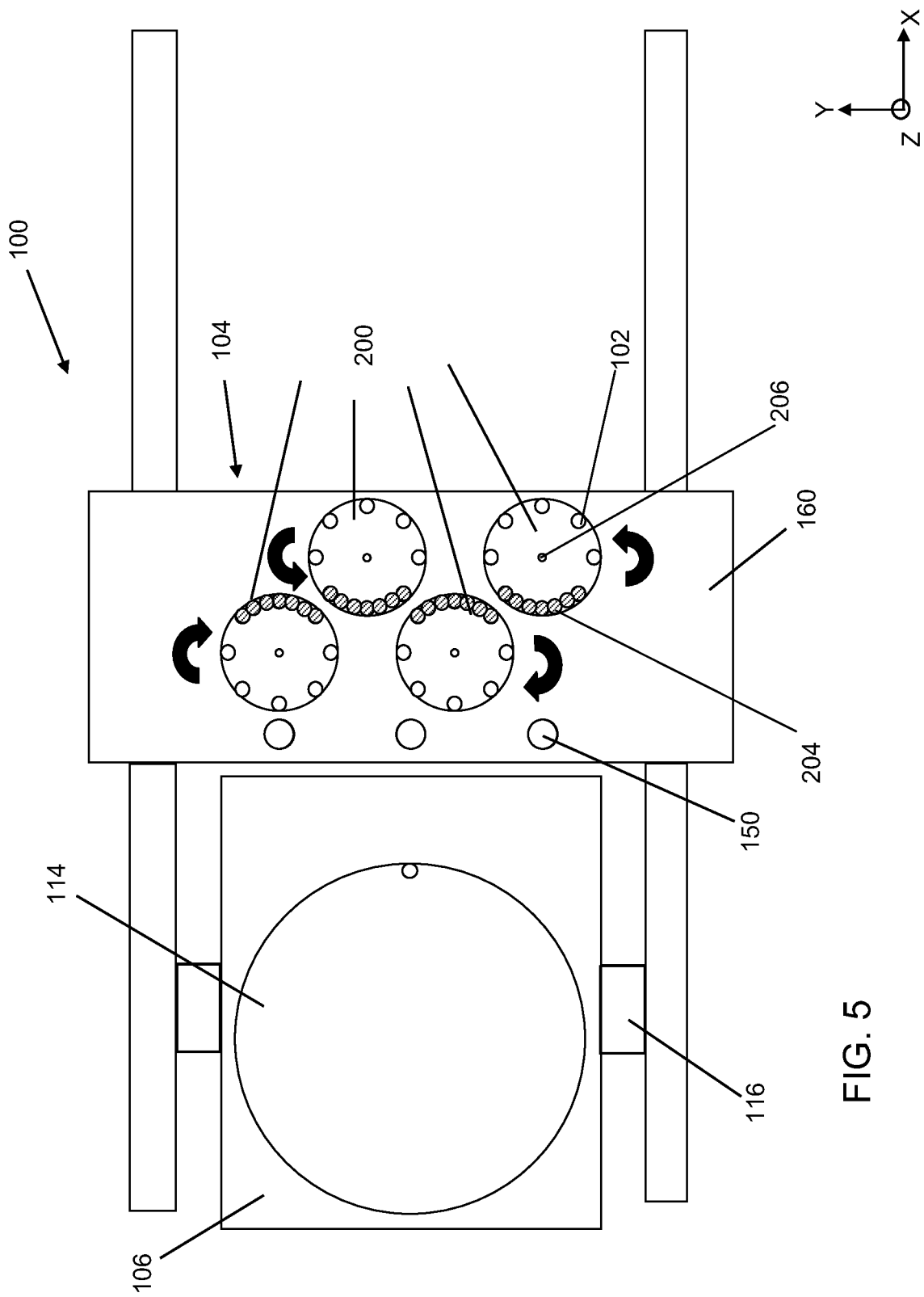
FIG. 5 depicts a schematic top view of a lithographic apparatus according to an embodiment of the present invention.

FIG. 5 depicts a schematic top view of a lithographic apparatus according to an embodiment of the invention having movable individually addressable elements 102. Like the lithographic apparatus 100 shown in FIG. 2, the lithographic apparatus 100 comprises a substrate table 106 to hold a substrate 114, a positioning device 116 to move the substrate table 106 in up to 6 degrees of freedom, an alignment sensor 150 to determine alignment between the individually addressable elements 102 and the substrate 114, and a level sensor 150 to determine whether the substrate 114 is level with respect to the projection of the pattern from the individually addressable elements 102.

The lithographic apparatus 100 further comprises a plurality of individually addressable elements 102 arranged on a frame 160. In this embodiment, each of the individually addressable elements 102 is a radiation emitting diode, e.g., a laser diode, for instance a blue-violet laser diode. As shown in FIG. 5, the individually addressable elements 102 are arranged into a number of separate arrays 200 of individually addressable elements 102 extending along the Y-direction. Further, in an embodiment, a number of the arrays 200 of individually addressable elements 102 are staggered in the X-direction from an adjacent array 200 of individually addressable elements 102 in an alternating fashion. The lithographic apparatus 100, particularly the individually addressable elements 102, may be arranged to provide pixel-grid imaging. However, in an embodiment, the lithographic apparatus 100 need not provide pixel-grid imaging. Rather, the lithographic apparatus 100 may project the radiation of the diodes onto the substrate in a manner that does not form individual pixels for projection onto the substrate but rather a substantially continuous image for projection onto the substrate.

In an embodiment, one or more of the plurality of individually addressable elements 102 are movable between an exposure region wherein the one or more individually addressable elements are used to project all or part of the beam 110, and a location outside of the exposure region wherein the one or more individually addressable elements do not project any of the beam 110. In an embodiment, the one or more individually addressable elements 102 are radiation emitting devices that are turned ON or at least partly ON, i.e., they emit radiation, in the exposure region 204 (the light shaded region in FIG. 5) and are turned OFF, i.e., they do not emit radiation, when located outside of the exposure region 204.

In an embodiment, the one or more individually addressable elements 102 are radiation emitting devices that may be turned ON in the exposure region 204 and outside of the exposure region 204. In such a circumstance, one or more individually addressable elements 102 may be turned on outside of the exposure region 204 to provide a compensating exposure if, for example, the radiation was not properly projected in the exposure region 204 by one or more individually addressable elements 102. For example, referring to FIG. 5, one or more of the individually addressable elements 102 of an array opposite to the exposure region 204 may be turned ON to correct for a failed or improper radiation projection in the exposure region 204.

In an embodiment, the exposure region 204 is an elongate line. In an embodiment, the exposure region 204 is a single dimensional array of one or more individually addressable elements 102. In an embodiment, the exposure region 204 is a two dimensional array of one or more individually addressable elements 102. In an embodiment, the exposure region 204 is elongate.

In an embodiment, each of the movable individually addressable elements 102 may be movable separately and not necessarily together as a unit.

In an embodiment, the one or more individually addressable elements are movable, and in use move, in a direction transverse to a direction of propagation of the beam 110 at least during projection of the beam 110. For example, in an embodiment, the one or more individually addressable elements 102 are radiation emitting devices that move in a direction substantially perpendicular to a direction of propagation of the beam 110 during projection of the beam 110.

In an embodiment, each of the arrays 200 is a laterally displaceable plate having a plurality of spatially separated individually addressable elements 102 arranged along the plate as shown in FIG. 6. In use, each plate translates along direction 208. In use, the motion of the individually addressable elements 102 are appropriately timed to be located in the exposure region 204 (shown as the dark shaded region in FIG. 6) so as to project all or part of the beam 110. For example, in an embodiment, the one or more individually addressable elements 102 are radiation emitting devices and the turning ON or OFF of the individually addressable elements 102 is timed so that one or more individually addressable elements 102 are turned ON when they are in exposure region 204 and turned OFF when they are outside of region 204. For example, in FIG. 6(A), a plurality of two-dimensional arrays of radiation emitting diodes 200 are translated in direction 208—two arrays in positive direction 208 and an intermediate one between the two arrays in negative direction 208. The turning ON or OFF of the radiation emitting diodes 102 is timed so that certain radiation emitting diodes 102 of each array 200 are turned ON when they are in exposure region 204 and turned OFF when they are outside of region 204. Of course, the arrays 200 can travel in the opposite direction, i.e., the two arrays in negative direction 208 and the intermediate one between the two arrays in positive direction 208, when, for example, the arrays 200 reach the end of their travel. In a further example, in FIG. 6(B), a plurality of interleaved single dimensional arrays of radiation emitting diodes 200 are translated in direction 208—alternating in positive direction 208 and negative direction 208. The turning ON or OFF of the radiation emitting diodes 102 is timed so that certain radiation emitting diodes 102 of each array 200 are turned ON when they are in exposure region 204 and turned OFF when they are outside of region 204. Of course, the arrays 200 can travel in the opposite direction. In a further example, in FIG. 6(C), a single array of radiation emitting diodes 200 (shown as one-dimensional but it doesn't need to be) is translated in direction 208. The turning ON or OFF of the radiation emitting diodes 102 is timed so that certain radiation emitting diodes 102 of each array 200 are turned ON when they are in exposure region 204 and turned OFF when they are outside of region 204.

In an embodiment, each of the arrays 200 is a rotatable plate having a plurality of spatially separated individually addressable elements 102 arranged around the plate. In use, each plate rotates about its own axis 206, for example, in the directions shown by the arrows in FIG. 5. That is, the arrays 200 may alternately rotate in clockwise and anti-clockwise directions as shown in FIG. 5. Alternatively, each of the arrays 200 may rotate in a clockwise direction or rotate in an anti-clockwise direction. In an embodiment, the array 200 rotates completely around. In an embodiment, the array 200 rotates an arc less than completely around. In an embodiment, the array 200 may rotate about an axis extending in the X- or Y-direction if, for example, the substrate scans in the Z-direction. In an embodiment, referring to FIG. 6(D), the individually addressable elements 102 of the array 200 may be arranged at the edge and project in a radial direction out toward the substrate 114. The substrate 114 may extend around at least part of the side of the array 200. In this case, the array 200 rotates about an axis extending in the X-direction and the substrate 114 moves in the X-direction.

In use, the motion of the individually addressable elements 102 are appropriately timed to be located in the exposure region 204 so as to project all or part of the beam 110. For example, in an embodiment, the one or more individually addressable elements 102 are radiation emitting devices and the turning ON or OFF of the individually addressable elements 102 is timed so that one or more individually addressable elements 102 are turned ON when they are in exposure region 204 and turned OFF when they are outside of region 204. So, in an embodiment, the radiating emitting devices 102 could be all kept on during motion and then certain ones of the radiation emitting devices 102 are modulated off in the exposure region 204. An appropriate shield between the radiation emitting devices 102 and the substrate and outside of the exposure region 204 may be required to shield the exposure region 204 from turned on radiation emitting devices 102 outside of the exposure region 204. Having the radiation emitting devices 102 consistently on can facilitate having the radiation emitting devices 102 at a substantially uniform temperature during use. In an embodiment, the radiation emitting devices 102 could kept off most of the time and one or more of the radiation emitting devices 102 turned on when in the exposure region 204.

In an embodiment, the rotatable plate may have configuration as shown in FIG. 7. For example, in FIG. 7(A), a schematic top view of a rotatable plate is shown. The rotatable plate may have an array 200 having multiple subarrays 210 of individually addressable elements 102 arranged around the plate (compared with the rotatable plate of FIG. 5, which shows schematically a single array 200 of individually addressable elements 102 arranged around the plate). In FIG. 7(A), the subarrays 210 are shown as staggered with respect to each other such that an individually addressable element 102 of one subarray 210 is between two individually addressable elements 102 of an other subarray 210. However, the individually addressable elements 102 of the subarrays 210 may be aligned with each other. The individually addressable elements 102 may be rotated, individually or together, by motor 216 about an axis, in this example, running in the Z-direction in FIG. 7(A) through motor 216. The motor 216 may be attached to the rotatable plate and connected to a frame, e.g. frame 160, or attached to a frame, e.g., frame 160, and connected to the rotatable plate. In an embodiment, motor 216 (or, for example, some motor located elsewhere) may cause other movement of the individually addressable elements 102, whether individually or together. For example, motor 216 may cause translation of one or more of the individually addressable elements 102 in the X-, Y-, and/or Z-directions. In addition or alternatively, the motor 216 may cause motor 216 may cause rotation of one or more of the individually addressable elements 102 about the X- and/or Y-directions (i.e., $R_x$ and/or $R_y$ motion).

Figure 7A:
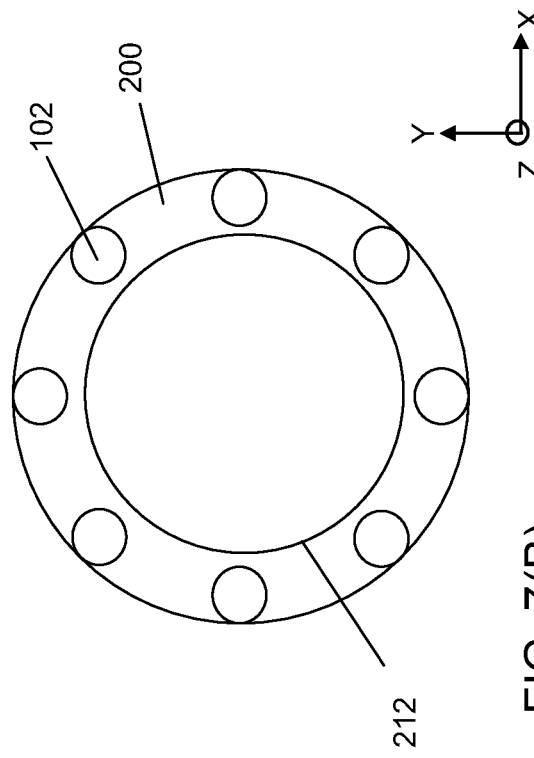
FIGS. 7(A)-(O) depict schematic top and side views of a part of a lithographic apparatus according to an embodiment of the present invention.
Figure 7B:
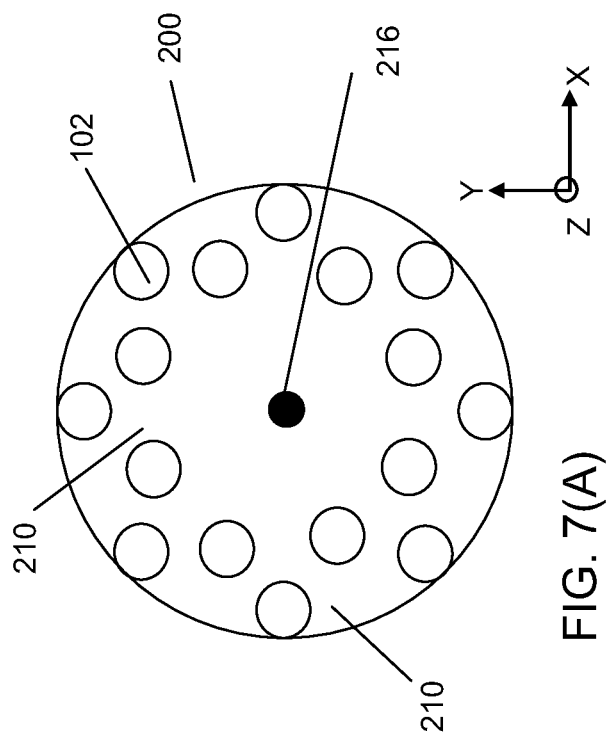
FIG. 7(P) depicts a power/forward current graph of an individually addressable element according to an embodiment of the present invention.
Figure 7C:
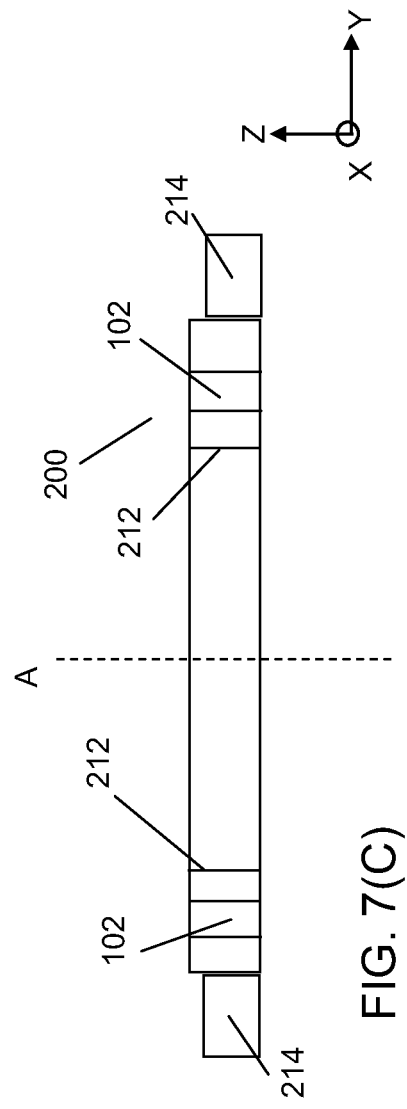

In an embodiment of a rotatable plate, shown schematically in FIG. 7(B) as a top view, the rotatable plate may have an opening 212 in its central area with the array 200 of individually addressable elements 102 arranged on the plate outside of the opening 212. So, for example, the rotatable plate may form an annular disk as shown in FIG. 7(B) with the array 200 of individually addressable elements 102 arranged around the disk. An opening can reduce the weight of the rotatable plate and/or facilitate cooling of the individually addressable elements 102.

In an embodiment, the rotatable plate may be supported at an outer periphery using a support 214. The support 214 may be a bearing, such a roller bearing or a gas bearing. Rotation (and/or other movement e.g., translation in X-, Y-, and/or Z-directions and/or $R_x$ motion and/or $R_y$ motion) may be provided by a motor 216 as shown in FIG. 7(A). Additionally or alternatively, the support 214 may include a motor to cause the individually addressable elements 102 to rotate about axis A (and/or provide other movement e.g., translation in X-, Y-, and/or Z-directions and/or $R_x$ motion and/or $R_y$ motion).

In an embodiment, referring to FIGS. 7(D) and 7(E), the rotatable plate having an array 200 of individually addressable elements 102 may be attached to a rotatable structure 218. The rotatable structure 218 may be rotated by motor 220 about axis B. Further, the rotatable plate may be rotated relative to the rotatable structure 218 by motor 216, the motor 216 causing the rotatable plate to rotate about axis A. In an embodiment, the rotation axes A and B do not coincide and thus the axes are spatially separated as shown in FIGS. 7(D) and 7(E). In an embodiment, the rotation axes A and B are substantially parallel to each other. In use during exposure, both the rotatable structure 218 and the rotatable plate rotate. The rotation may be coordinated so that the individually addressable elements 102 in the exposure region 204 may be aligned in a substantially straight line. This can be compared with, for example, the embodiment of FIG. 5 where the individually addressable elements 102 in the exposure region 204 may not be aligned in a substantially straight line.

Having movable individually addressable elements as described above, the number of individually addressable elements may be reduced by moving into exposure region 204 individually addressable elements when needed. Accordingly, a thermal load may be reduced.

In an embodiment, more movable individually addressable elements than theoretically needed (e.g. on a rotatable plate) may be provided. A possible advantage of this arrangement is that if one or more movable individually addressable elements break or fail to operate, one or more other of the movable individually addressable elements can be used instead. In addition or alternatively, extra movable individually addressable elements may have an advantage for controlling thermal load on the individually addressable elements as the more movable individually addressable elements there are, the more opportunity there is for movable individually addressable elements outside of the exposure region 204 to cool off.

In an embodiment, the movable individually addressable elements 102 are embedded in a material comprising low thermal conductivity. For example, the material may be a ceramic e.g., cordierite or a cordierite-based ceramic and/or Zerodur ceramic. In an embodiment, the movable individually addressable elements 102 are embedded in a material comprising high thermal conductivity, for instance a metal, e.g. a metal of relatively light weight, for instance aluminum or titanium.

In an embodiment, the arrays 200 may comprise a temperature control arrangement. For example, referring to FIG. 7(F), an array 200 may have a fluid (e.g., liquid) conducting channel 222 to transport cooling fluid on, near or through array 200 to cool the array. The channel 222 may be connected to an appropriate heat exchanger and pump 228 to circulate fluid through the channel. A supply 224 and return 226 connected between the channel 222 and heat exchanger and pump 228 can facilitate circulation and temperature control of the fluid. A sensor 234 may be provided in, on or near the array, to measure a parameter of the array 200, which measurement may be used to control, e.g., the temperature of the fluid flow provided by the heat exchanger and pump. In an embodiment, sensor 234 may measure the expansion and/or contraction of the array 200 body, which measurement may be used to control the temperature of the fluid flow provided by the heat exchanger and pump. Such expansion and/or contraction may be a proxy for temperature. In an embodiment, the sensor 234 may be integrated with the array 200 (as shown by the sensor 234 in the form of a dot) and/or may be separate from the array 200 (as shown by the sensor 234 in the form of a box). The sensor 234 separate from the array 200 may be an optical sensor.

In an embodiment, referring to FIG. 7(G), an array 200 may have one or more fins 230 to increase the surface area for heat dissipation. The fin(s) 230 may be, for example, on a top surface of the array 200 and/or on a side surface of the array 200. Optionally, one or more further fins 232 may be provided to cooperate with the fin(s) 230 to facilitate heat dissipation. For example, the fin(s) 232 is able to absorb heat from the fin(s) 230 and may comprise a fluid (e.g., liquid) conducting channel and an associated heat exchanger/pump similar to as shown in and described with respect to FIG. 7(F).

In an embodiment, referring to FIG. 7(H), an array 200 may be located at or near a fluid confinement structure 236 configured to maintain a fluid 238 in contact with the array 200 body to facilitate heat dissipation via the fluid. In an embodiment, the fluid 238 may be a liquid, e.g., water. In an embodiment, the fluid confinement structure 236 provides a seal between it and the array 200 body. In an embodiment, the seal may be a contactless seal provided through, for example, a flow of gas or capillary force. In an embodiment, the fluid 238 is circulated, akin to as discussed with respect to the fluid conducting channel 222, to promote heat dissipation. The fluid 238 may be supplied by a fluid supply device 240.

In an embodiment, referring to FIG. 7(H), an array 200 may be located at or near a fluid supply device 240 configured to project a fluid 238 toward the array 200 body to facilitate heat dissipation via the fluid. In an embodiment, the fluid 238 is a gas, e.g., clean dry air, $N_2$, an inert gas, etc. While the fluid confinement structure 236 and the fluid supply device 240 are shown together in FIG. 7(H), they need not be provided together.

In an embodiment, the array 200 body is a substantially solid structure with, for example, a cavity for the fluid conducting channel 222. In an embodiment, the array 200 body is a substantially frame like structure that is mostly open and to which are attached the various components, e.g., the individually addressable elements 102, the fluid conducting channel 222, etc. This open like structure facilitates gas flow and/or increases the surface area. In an embodiment, the array 200 body is a substantially solid structure with a plurality of cavities into or through the body to facilitate gas flow and/or increase the surface area.

While embodiments have been described above to provide cooling, the embodiments alternatively or in addition may provide heating.

In an embodiment, the array 200 is desirably kept at a substantially constant steady state temperature during exposure use. So, for example, all or many of the individually addressable elements 102 of array 200 may be powered on, before exposure, to reach at or near a desired steady state temperature and during exposure, any one or more temperature control arrangements may be used to cool and/or heat the array 200 to maintain the steady state temperature. In an embodiment, any one or more temperature control arrangements may be used to heat the array 200 prior to exposure to reach at or near a desired steady state temperature. Then, during exposure, any one or more temperature control arrangements may be used to cool and/or heat the array 200 to maintain the steady state temperature. A measurement from sensor 234 can be used in a feedforward and/or feedback manner to maintain the steady state temperature. In an embodiment, each of a plurality of arrays 200 may have the same steady state temperature or one or more arrays 200 of a plurality of arrays 200 may have a different steady state temperature than one or more other arrays 200 of a plurality of arrays 200. In an embodiment, the array 200 is heated to a temperature higher than the desired steady state temperature and then falls during exposure because of cooling applied by any one or more temperature control arrangements and/or because the usage of the individually addressable elements 102 isn't sufficient to maintain the temperature higher than the desired steady state temperature.

In an embodiment, to improve thermal control and overall cooling, the number of array 200 bodies is increased along and/or across the exposure region. So, for example, instead of four arrays 200 shown in FIG. 5, five, six, seven, eight, nine, ten or more arrays 200 may be provided. Less arrays may be provided, e.g. one array 200, for instance a single large array covering the full width of the substrate.

In an embodiment, a lens array as described herein is associated or integrated with the movable individually addressable elements. For example, a lens array plate may be attached to each of the movable arrays 200 and thus movable (e.g., rotatable) with the individually addressable elements 102. As discussed above, the lens array plate may be displaceable with respect to the individually addressable elements 102 (e.g., in the Z-direction). In an embodiment, a plurality of lens array plates may be provided for an array 200, each lens array plate being associated with different subset of the plurality of individually addressable elements 102.

In an embodiment, referring to FIG. 7(I), a single separate lens 242 may be attached in front of each individually addressable element 102 and be movable with the individually addressable element 102 (e.g., rotatable about axis A). Further, the lens 242 may be displaceable with respect to the individually addressable element 102 (e.g., in the Z-direction) through the use of actuator 244. In an embodiment, referring to FIG. 7(J), the individually addressable element 102 and the lens 242 may be displaced together relative to the body 246 of the array 200 by actuator 244. In an embodiment, the actuator 244 is configured to only displace lens 242 (i.e., with respect to individually addressable element 102 or together with individually addressable element 102) in the Z-direction.

In an embodiment, the actuator 244 is configured to displace lens 242 in up to 3 degrees of freedom (the Z-direction, rotation about the X-direction, and/or rotation about the Y-direction). In an embodiment, the actuator 244 is configured to displace lens 242 in up to 6 degrees of freedom. Where the lens 242 is movable with respect to its individually addressable element 102, the lens 242 may be moved by the actuator 244 to change the position of the focus of the lens 242 with respect to the substrate. Where the lens 242 is movable with its individually addressable element 102, the focus position of the lens 242 is substantially constant but displaced with respect to the substrate. In an embodiment, the movement of lens 242 is individually controlled for each lens 242 associated with each individually addressable element 102 of the array 200. In an embodiment, a subset of a plurality of lenses 242 are movable together with respect to, or together with, their associated subset of the plurality of individually addressable elements 102. In this latter situation, fineness of focus control may be expensed for lower data overhead and/or faster response. In an embodiment, the size of the spot of radiation provided by an individually addressable element 102 may be adjusted by defocus, i.e., the more defocused, the larger the spot size.

In an embodiment, referring to FIG. 7(K), an aperture structure 248 having an aperture therein may be located below lens 242. In an embodiment, the aperture structure 248 may be located above the lens 242 between the lens 242 and the associated individually addressable element 102. The aperture structure 248 can limit diffraction effects of the lens 242, the associated individually addressable element 102, and/or of adjacent lenses 242/individually addressable elements 102.

In an embodiment, the individually addressable element 102 may be a radiation emitting device e.g., a laser diode. Such radiation emitting device may have high spatial coherence and accordingly may present a speckle problem. To avoid such a speckle problem, the radiation emitted by the radiation emitting device should be scrambled by shifting the phase of a beam portion with respect to another beam portion. In an embodiment, referring to FIGS. 7(L) and 7(M), a plate 250 may be located on, for example, frame 160 and the individually addressable elements 102 move with respect to the plate 250. As the individually addressable elements 102 move with respect to and over the plate 250, the plate 250 causes disruption of the spatial coherence of the radiation emitted by the individually addressable elements 102 toward the substrate. In an embodiment, as the individually addressable elements 102 move with respect to and over the plate 250, the plate 250 is located between a lens 242 and its associated individually addressable element 102. In an embodiment, the plate 250 may be located between the lens 242 and the substrate.

Figure 7N:
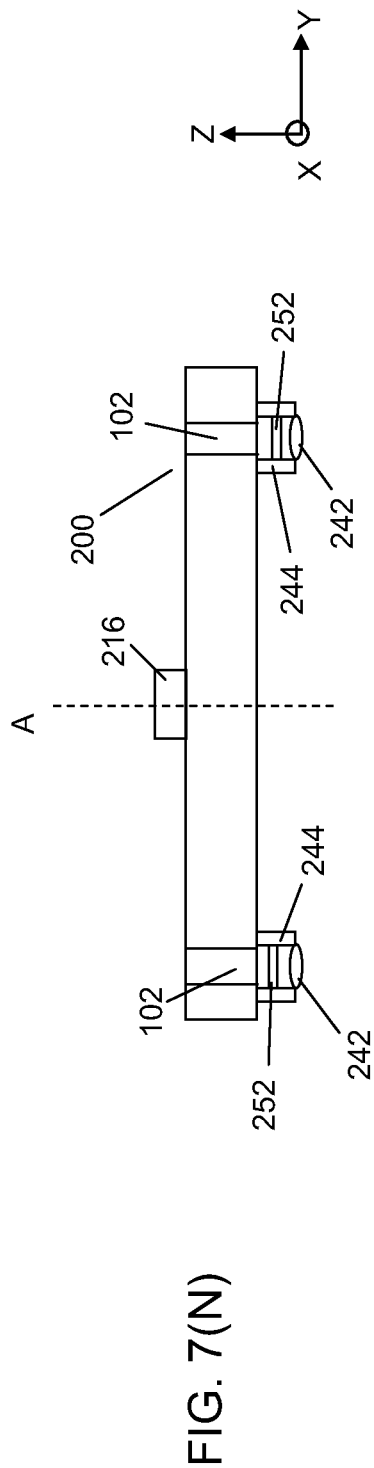

In an embodiment, referring to FIG. 7(N), a spatial coherence disrupting device 252 may be located between the substrate and at least the individually addressable elements 102 that project radiation onto the exposure region. In an embodiment, the spatial coherence disrupting device 252 is located between the individually addressable elements 102 and the lens 242 and may be attached to the body 246. In an embodiment, the spatial coherence disrupting device 252 is a phase modulator, a vibrating plate, or a rotating plate. As an individually addressable element 102 project radiation toward the substrate, the spatial coherence disrupting device 252 causes disruption of the spatial coherence of the radiation emitted by the individually addressable element 102.

In an embodiment, the lens array (whether together as unit or as individual lenses) is attached to an array 200, desirably via high thermal conductivity material, to facilitate conduction of heat from the lens array to the array 200, where cooling may be more advantageously provided.

In an embodiment, the array 200 may comprises one or more focus or level sensors 254, like level sensor 150. For example, a sensor 254 may be configured to measure focus for each individually addressable element 102 of the array 200 or for a plurality of individually addressable elements 102 of the array 200. Accordingly, if an out of focus condition is detected, the focus may be corrected for each individually addressable element 102 of the array 200 or for a plurality of individually addressable elements 102 of the array 200. Focus may be corrected by, for example, moving lens 242 in a Z-direction (and/or about the X-axis and/or about the Y-axis).

Figure 7O:
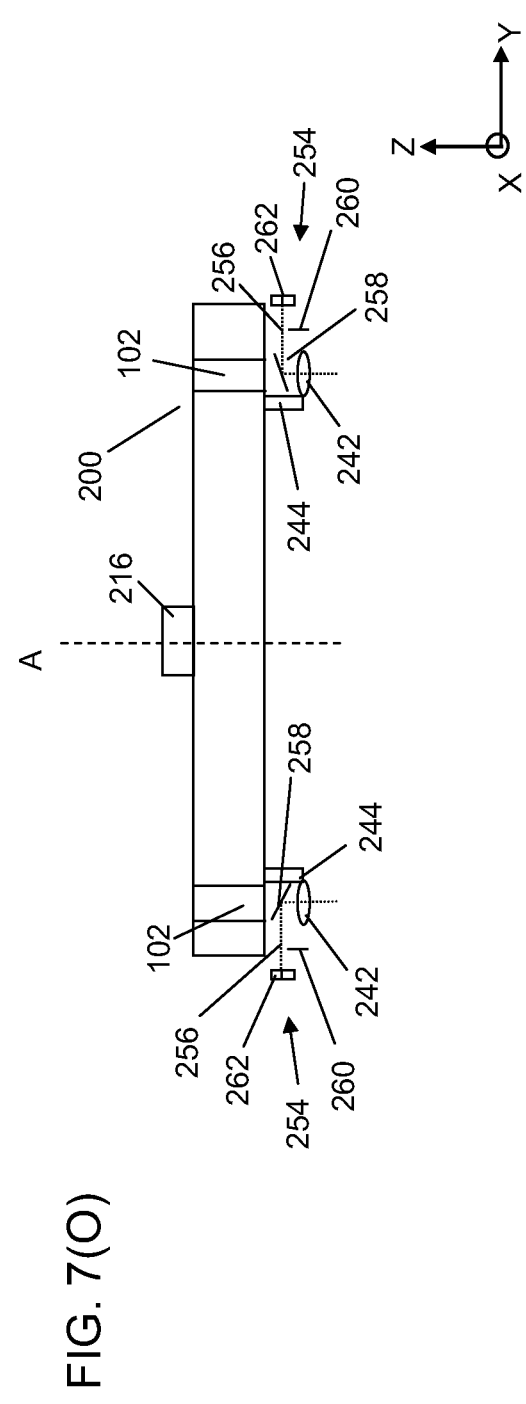
Figure 7P:
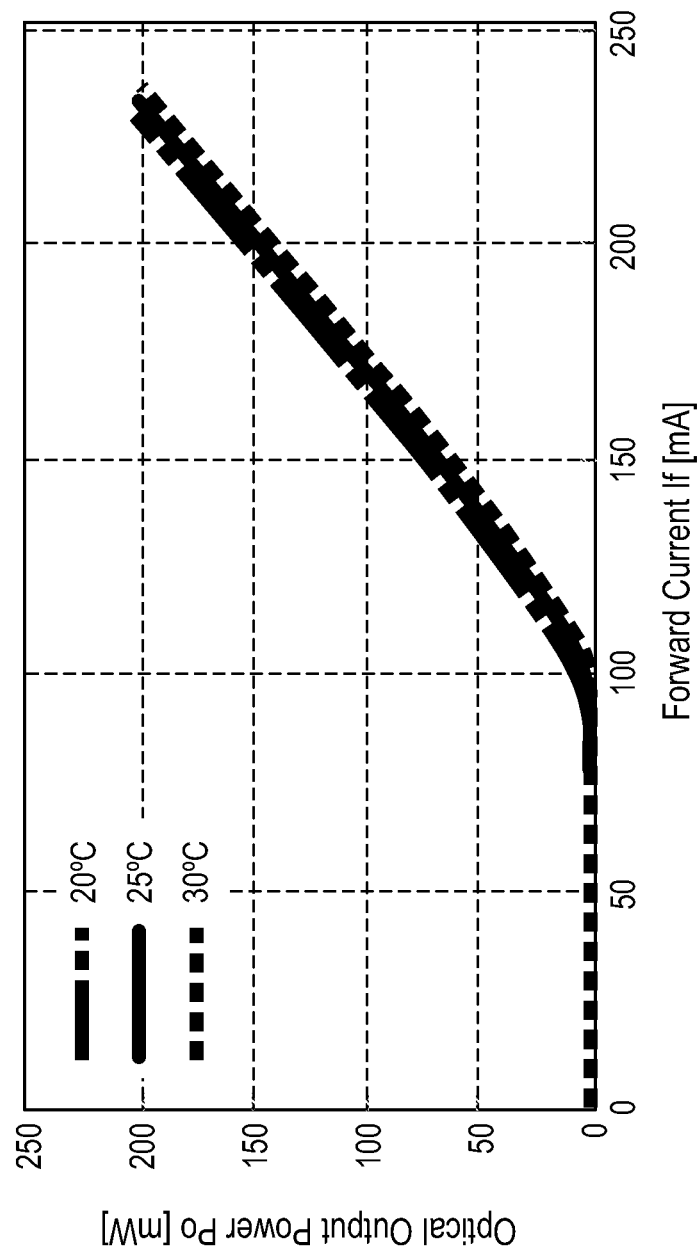

In an embodiment, the sensor 254 is integral with an individually addressable element 102 (or may be integral with a plurality of individually addressable elements 102 of the array 200). Referring to FIG. 7(O), an example sensor 254 is schematically depicted. A focus detection beam 256 is redirected (e.g., reflected) off the substrate surface, passes through the lens 242 and is directed toward a detector 262 by a half-silvered mirror 258. In an embodiment, the focus detection beam 256 may be radiation used for exposure that happens to be redirected from the substrate. In an embodiment, the focus detection beam 256 may be a dedicated beam directed at the substrate and which, upon redirected by the substrate, becomes the beam 256. A knife edge 260 (which may be an aperture) is in the path of the beam 256 before the beam 256 impinges on the detector 262. In this example, the detector 262 comprises at least two radiation-sensitive parts (e.g., areas or detectors), shown in FIG. 7(O) by the split of detector 262. When the substrate is in focus, a sharp image is formed at edge 260 and so the radiation-sensitive parts of the detector 262 receive equal amounts of radiation. When the substrate is out of focus, the beam 256 shifts and the image would form in front of or behind edge 260. Thus, the edge 260 would intercept certain parts of the beam 256 and one radiation-sensitive part of the detector 262 would receive a smaller amount of radiation than an other radiation-sensitive part of the detector 262. A comparison of the output signals from the radiation-sensitive parts of the detector 262 enables the amount by which, and the direction in which, the plane of the substrate from which the beam 256 redirected differs from a desired position. The signals may be electronically processed to give a control signal by which, for example, lens 242 may be adjusted. The mirror 258, edge 260 and detector 262 may be mounted to the array 200. In an embodiment, the detector 262 may be a quad cell.

In an embodiment, 400 individually addressable elements 102, with 133 working (at any one time), may be provided. In an embodiment, 600-1200 working individually addressable elements 102 may be provided with, optionally, additional individually addressable elements 102 as, for example, a reserve and/or for correction exposures (as, for example, discussed above). The number of working individually addressable elements 102 may depend, for example, on the resist, which requires a certain dosage of radiation for patterning. Where the individually addressable elements 102 are rotatable such a individually addressable elements 102, the individually addressable elements 102 may be rotated at a frequency of 6 Hz with the 1200 working individually addressable elements 102. The individually addressable elements 102 may be rotated at a higher frequency if there are less individually addressable elements 102; the individually addressable elements 102 may be rotated at a lower frequency if there are more individually addressable elements 102.

In an embodiment, the number of individually addressable elements 102 may be reduced using the movable individually addressable elements 102 compared with an array of individually addressable elements 102. For example, 600-1200 working (at any one time) individually addressable elements 102 may be provided. Moreover, the reduced number can yield substantially similar results as an array of individually addressable elements 102 but with one or more benefits. For example, for sufficient exposure capability using an array of violet-blue diodes, an array of 100,000 violet-blue diodes may be needed, for example, arranged at 200 diodes×500 diodes. Operating at a frequency of 10 kHz, the optical power per laser diode would be 0.33 mW. The electrical power per laser diode would be 150 mW=35 mA×4.1V. So, for the array, the electrical power would be 15 kW. In an embodiment using movable individually addressable elements, 400 violet-blue diodes, with 133 working, may be provided. Operating at a frequency of 9 Mhz, the optical power per laser diode would be 250 mW. The electrical power per laser diode would be 1000 mW=240 mA×4.2V. So, for the array, the electrical power would be 133 W. Thus, the diodes of the movable individually addressable elements arrangement may be operated in the steep part of the optical output power vs. forward current curve (240 mA v. 35 mA) as shown, e.g., in FIG. 7(P), yielding high output power per diode (250 mW v. 0.33 mW) but low electrical power for the plurality of individually addressable elements (133 W v. 15 kW). Thus, the diodes may be used more efficiently and lead to less power consumption and/or heat.

Thus, in an embodiment, diodes are operated in the steep part of the power/forward current curve. Operating in the non-steep part of the power/forward current curve may lead to incoherence of the radiation. In an embodiment, the diode is operated with an optical power of greater than 5 mW but less than or equal to 20 mW, or less than or equal to 30 mW, or less than or equal to 40 mW. In an embodiment, the diode is not operated at optical power of greater than 300 mW. In an embodiment, the diode is operated in a single mode, rather than multi-mode.

The number of individually addressable elements 102 on an array 200 may depend, inter alia (and as to an extent also noted above), on the length of the exposure region that the array 200 is intended to cover, the speed with which the array is moved during exposure, the spot size (i.e., cross-sectional dimension, e.g., width/diameter, of the spot projected on the substrate from an individually addressable element 102), the desired intensity each of the individually addressable elements should provide (e.g. whether it is desired to spread the intended dose for a spot on the substrate over more than one individually addressable element to avoid damage to the substrate or resist on the substrate), the desired scan speed of the substrate, cost considerations, the frequency with which the individually addressable elements can be turned on or off, and the desire for redundant individually addressable elements 102 (as discussed earlier; e.g. for correction exposures or as a reserve, for instance if one or more individually addressable elements break down). In an embodiment, the array 200 comprises at least 100 individually addressable elements 102, for instance at least 200 individually addressable elements, at least 400 individually addressable elements, at least 600 individually addressable elements, at least 1000 individually addressable elements, at least 1500 individually addressable elements, at least 2500 individually addressable elements, or at least 5000 individually addressable elements. In an embodiment, the array 200 comprises less than 50000 individually addressable elements 102, for instance less than 25000 individually addressable elements, less than 15000 individually addressable elements, less than 10000 individually addressable elements, less than 7500 individually addressable elements, less than 5000 individually addressable elements, less than 2500 individually addressable elements, less than 1200 individually addressable elements, less than 600 individually addressable elements, or less than 300 individually addressable elements.

In an embodiment, the array 200 comprises for each 10 cm of length of exposure region (i.e., normalizing the number of individually addressable elements in an array to 10 cm of length of exposure region) at least 100 individually addressable elements 102, for instance at least 200 individually addressable elements, at least 400 individually addressable elements, at least 600 individually addressable elements, at least 1000 individually addressable elements, at least 1500 individually addressable elements, at least 2500 individually addressable elements, or at least 5000 individually addressable elements. In an embodiment, the array 200 comprises for each 10 cm of length of exposure region (i.e., normalizing the number of individually addressable elements in an array to 10 cm of length of exposure region) less than 50000 individually addressable elements 102, for instance less than 25000 individually addressable elements, less than 15000 individually addressable elements, less than 10000 individually addressable elements, less than 7500 individually addressable elements, less than 5000 individually addressable elements, less than 2500 individually addressable elements, less than 1200 individually addressable elements, less than 600 individually addressable elements, or less than 300 individually addressable elements.

In an embodiment, the array 200 comprises less than 75% redundant individually addressable elements 102, e.g. 67% or less, 50% or less, about 33% or less, 25% or less, 20% or less, 10% or less, or 5% or less. In an embodiment the array 200 comprises at least 5% redundant individually addressable elements 102, e.g. at least 10%, at least 25%, at least 33%, at least 50%, or at least 65%. In an embodiment, the array comprises about 67% redundant individually addressable elements.

In an embodiment, spot size of an individual addressable element on the substrate is 10 microns or less, 5 microns or less, e.g. 3 microns or less, 2 microns or less, 1 micron or less, 0.5 micron or less, 0.3 micron or less, or about 0.1 micron. In an embodiment, spot size of an individual addressable element on the substrate is 0.1 micron or more, 0.2 micron or more, 0.3 micron or more, 0.5 micron or more, 0.7 micron or more, 1 micron or more, 1.5 microns or more, 2 microns or more, or 5 microns or more. In an embodiment, spot size is about 0.1 micron. In an embodiment, spot size is about 0.5 micron. In an embodiment, spot size is about 1 micron.

In operation of the lithographic apparatus 100, a substrate 114 is loaded onto the substrate table 106 using, for example, a robot handler (not shown). The substrate 114 is then displaced in the X-direction under the frame 160 and the individually addressable elements 102. The substrate 114 is measured by the level sensor and/or the alignment sensor 150 and then is exposed to a pattern using individually addressable elements 102 as described above. The individually addressable elements 102 may be operated, for example, to provide pixel-grid imaging as discussed herein.

Figure 8:
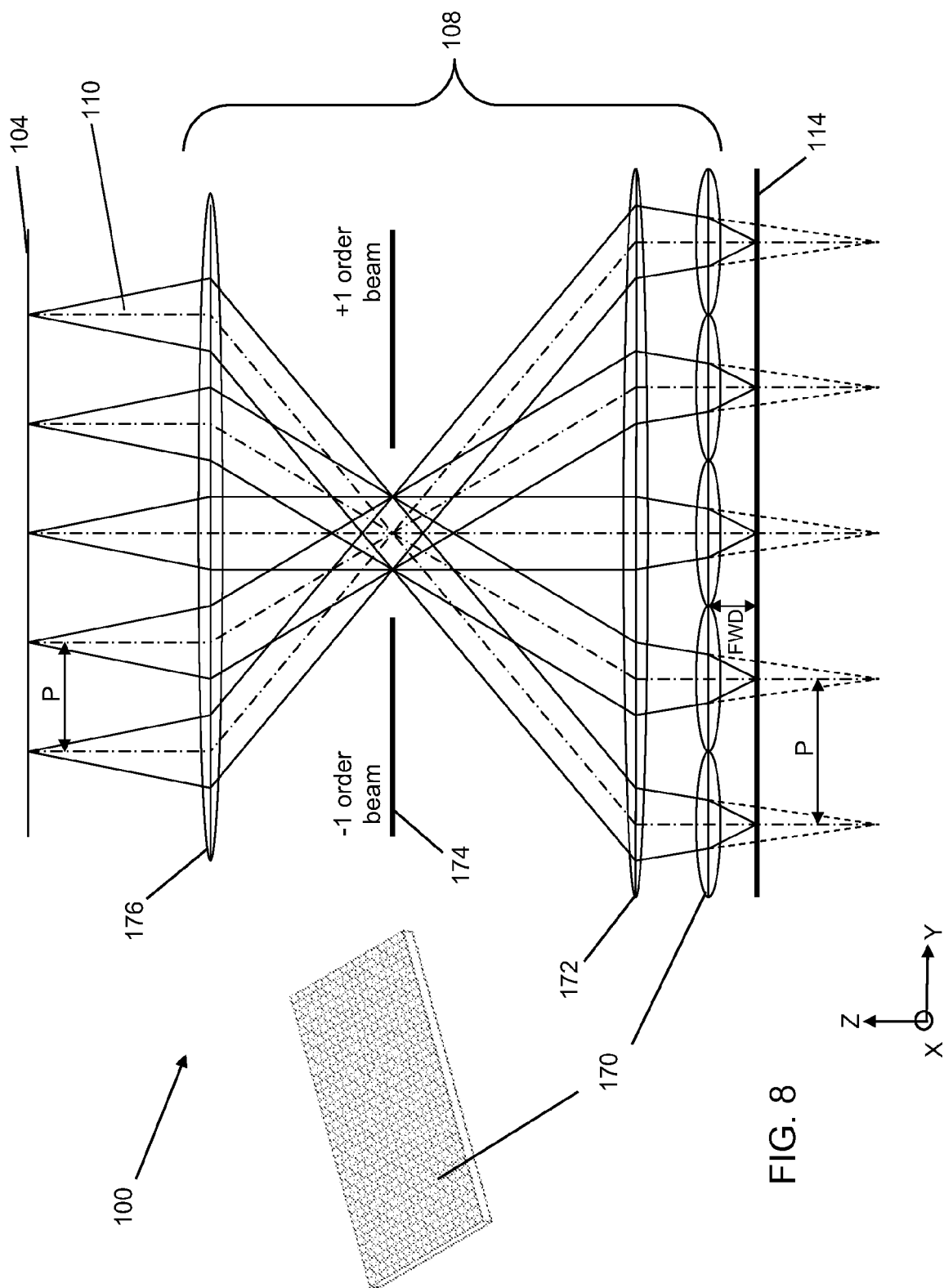
FIG. 8 depicts a schematic side view of a lithographic apparatus according to an embodiment of the present invention.

FIG. 8 depicts a schematic side view of a lithographic apparatus according to an embodiment of the invention. As shown in FIG. 8, the lithographic apparatus 100 comprises a patterning device 104 and a projection system 108. The projection system 108 comprises two lenses 176, 172. The first lens 176 is arranged to receive the modulated radiation beam 110 from patterning device 104 and focus it through a contrast aperture in an aperture stop 174. A further lens (not shown) may be located in the aperture. The radiation beam 110 then diverges and is focused by the second lens 172 (e.g., a field lens).

The projection system 108 further comprises an array of lenses 170 arranged to receive the modulated radiation beam 110. Different portions of the modulated radiation beam 110, corresponding to one or more of the individually controllable elements in the patterning device 104, pass through respective different lenses in the array of lenses 170. Each lens focuses the respective portion of the modulated radiation beam 110 to a point that lies on the substrate 114. In this way an array of radiation spots S (see FIG. 12) is exposed onto the substrate 114. It will be appreciated that, although only five lenses of the illustrated array of lenses 170 are shown, the array of lenses may comprise many hundreds or thousands of lenses (the same is true of the individually controllable elements used as the patterning device 104).

As shown in FIG. 8, a free working distance FWD is provided between the substrate 114 and the lens array 170. This distance allows the substrate 114 and/or the lens array 170 to be moved to allow, for example, focus correction. In an embodiment, the free working distance is in the range of 1-3 mm, e.g., about 1.4 mm. The individually addressable elements of the patterning device 104 are arranged at a pitch P, which results in an associated pitch P of imaging spots at substrate 114. In an embodiment, the lens array 170 can provide a NA of 0.15 or 0.18. In an embodiment, the imaging spot size is around 1.6 µm.

In this embodiment, the projection system 108 can be a 1:1 projection system in that the array spacing of the image spots on the substrate 114 is the same as the array spacing of the pixels of the patterning device 104. To provide improved resolution, the image spots can be much smaller than the pixels of the patterning device 104.

Figure 9:
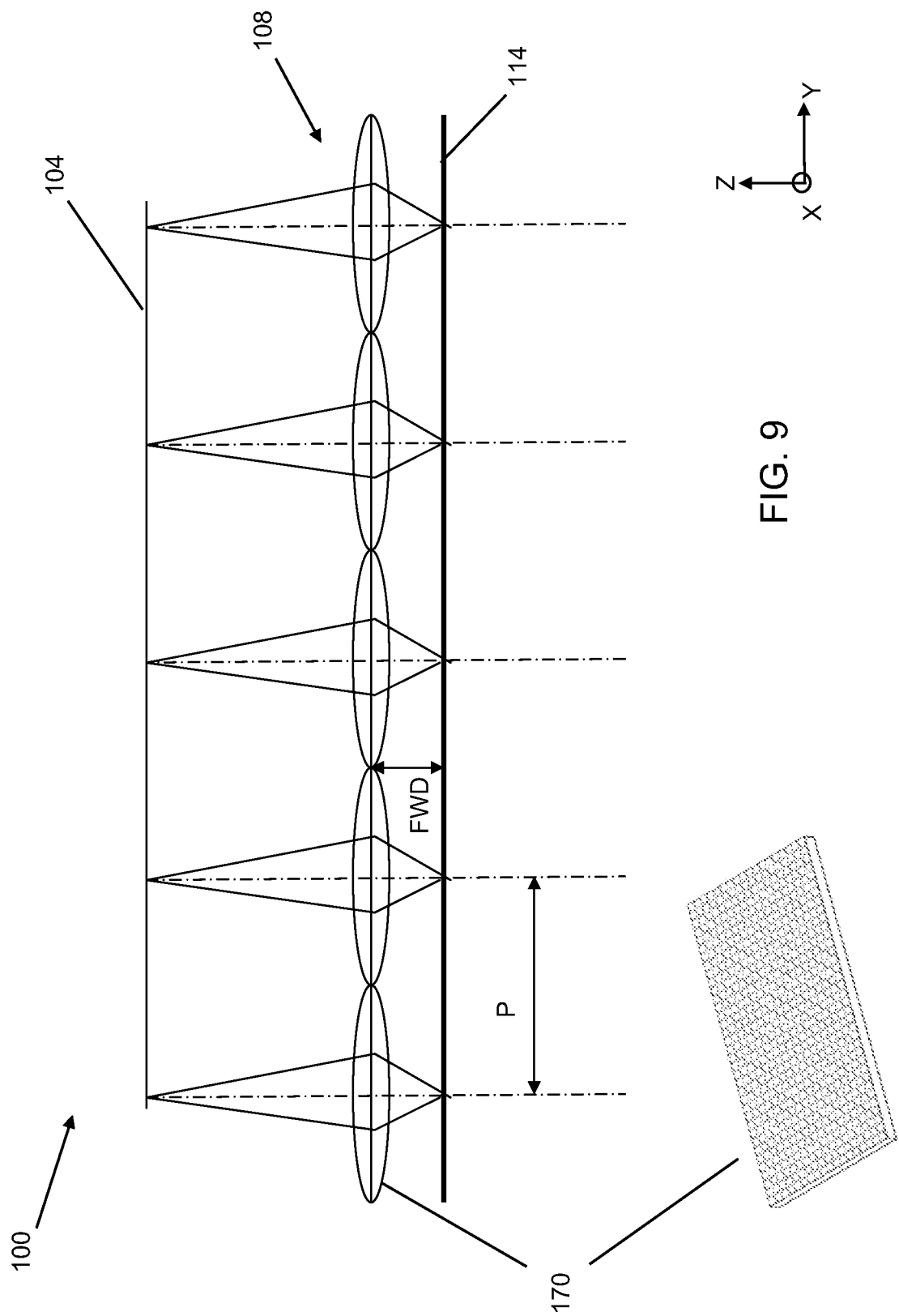
FIG. 9 depicts a schematic side view of a lithographic apparatus according to an embodiment of the present invention.

FIG. 9 depicts a schematic side view of a lithographic apparatus according to an embodiment of the invention. In this embodiment, there are no optics between the patterning device 104 and the substrate 114 other than a lens array 170.

The lithographic apparatus 100 of FIG. 9 comprises a patterning device 104 and a projection system 108. In this case, the projection system 108 only comprises an array of lenses 170 arranged to receive the modulated radiation beam 110. Different portions of the modulated radiation beam 110, corresponding to one or more of the individually controllable elements in the patterning device 104, pass through respective different lenses in the array of lenses 170. Each lens focuses the respective portion of the modulated radiation beam 110 to a point that lies on the substrate 114. In this way an array of radiation spots S (see FIG. 12) is exposed onto the substrate 114. It will be appreciated that, although only five lenses of the illustrated array of lenses 170 are shown, the array of lenses may comprise many hundreds or thousands of lenses (the same is true of the individually controllable elements used as the patterning device 104).

Like in FIG. 8, a free working distance FWD is provided between the substrate 114 and the lens array 170. This distance allows the substrate 114 and/or the lens array 170 to be moved to allow, for example, focus correction. The individually addressable elements of the patterning device 104 are arranged at a pitch P, which results in an associated pitch P of imaging spots at substrate 114. In an embodiment, the lens array 170 can provide a NA of 0.15. In an embodiment, the imaging spot size is around 1.6 µm.

Figure 10:
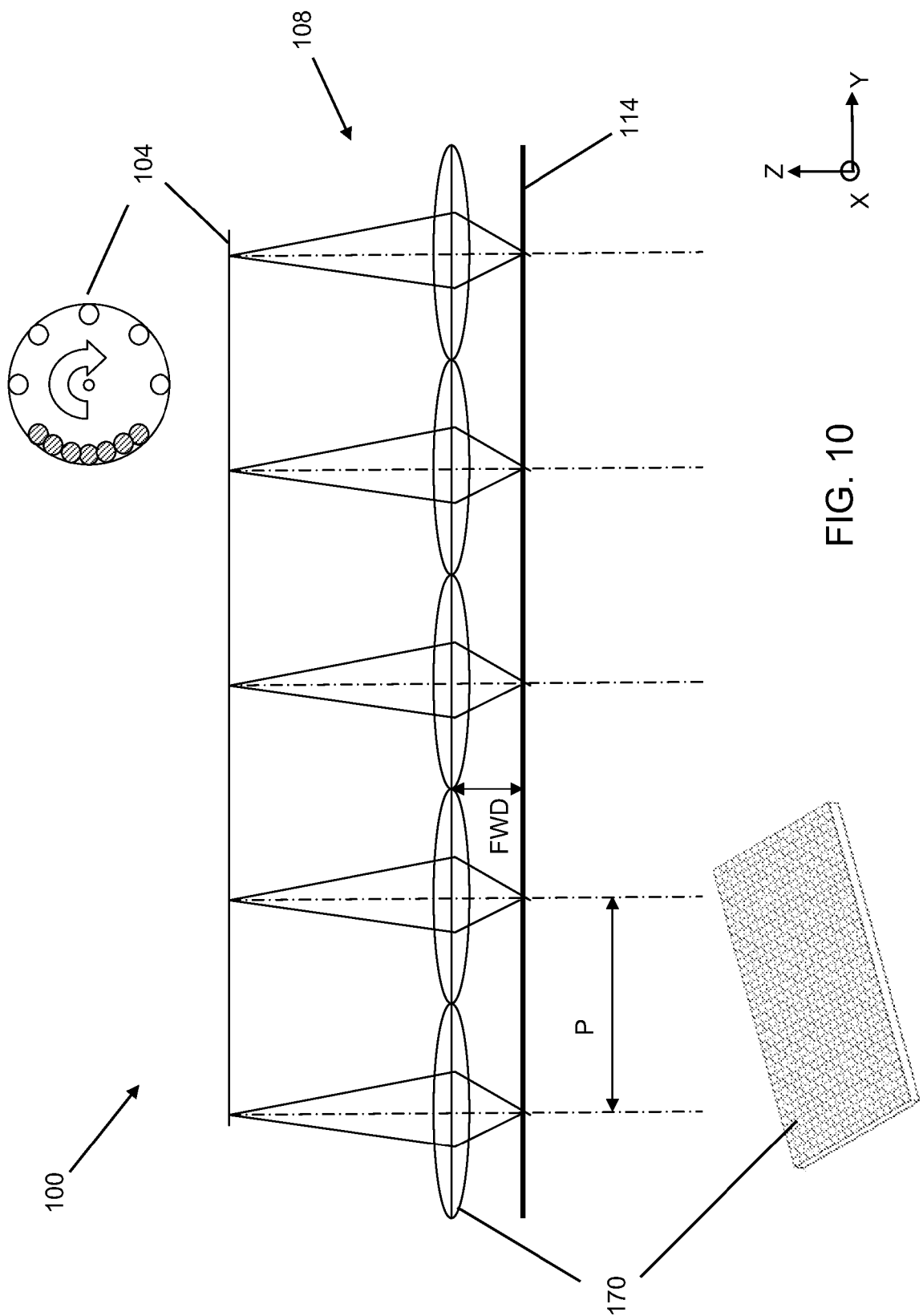
FIG. 10 depicts a schematic side view of a lithographic apparatus according to an embodiment of the present invention.

FIG. 10 depicts a schematic side view of a lithographic apparatus according to an embodiment of the invention using movable individually addressable elements 102 as described above with respect to FIG. 5. In this embodiment, there are no other optics between the patterning device 104 and the substrate 114 other than a lens array 170.

The lithographic apparatus 100 of FIG. 10 comprises a patterning device 104 and a projection system 108. In this case, the projection system 108 only comprises an array of lenses 170 arranged to receive the modulated radiation beam 110. Different portions of the modulated radiation beam 110, corresponding to one or more of the individually controllable elements in the patterning device 104, pass through respective different lenses in the array of lenses 170. Each lens focuses the respective portion of the modulated radiation beam 110 to a point that lies on the substrate 114. In this way an array of radiation spots S (see FIG. 12) is exposed onto the substrate 114. It will be appreciated that, although only five lenses of the illustrated array of lenses 170 are shown, the array of lenses may comprise many hundreds or thousands of lenses (the same is true of the individually controllable elements used as the patterning device 104).

Like in FIG. 8, a free working distance FWD is provided between the substrate 114 and the lens array 170. This distance allows the substrate 114 and/or the lens array 170 to be moved to allow, for example, focus correction. The individually addressable elements of the patterning device 104 are arranged at a pitch P, which results in an associated pitch P of imaging spots at substrate 114. In an embodiment, the lens array 170 can provide a NA of 0.15. In an embodiment, the imaging spot size is around 1.6 μm.

Figure 11:
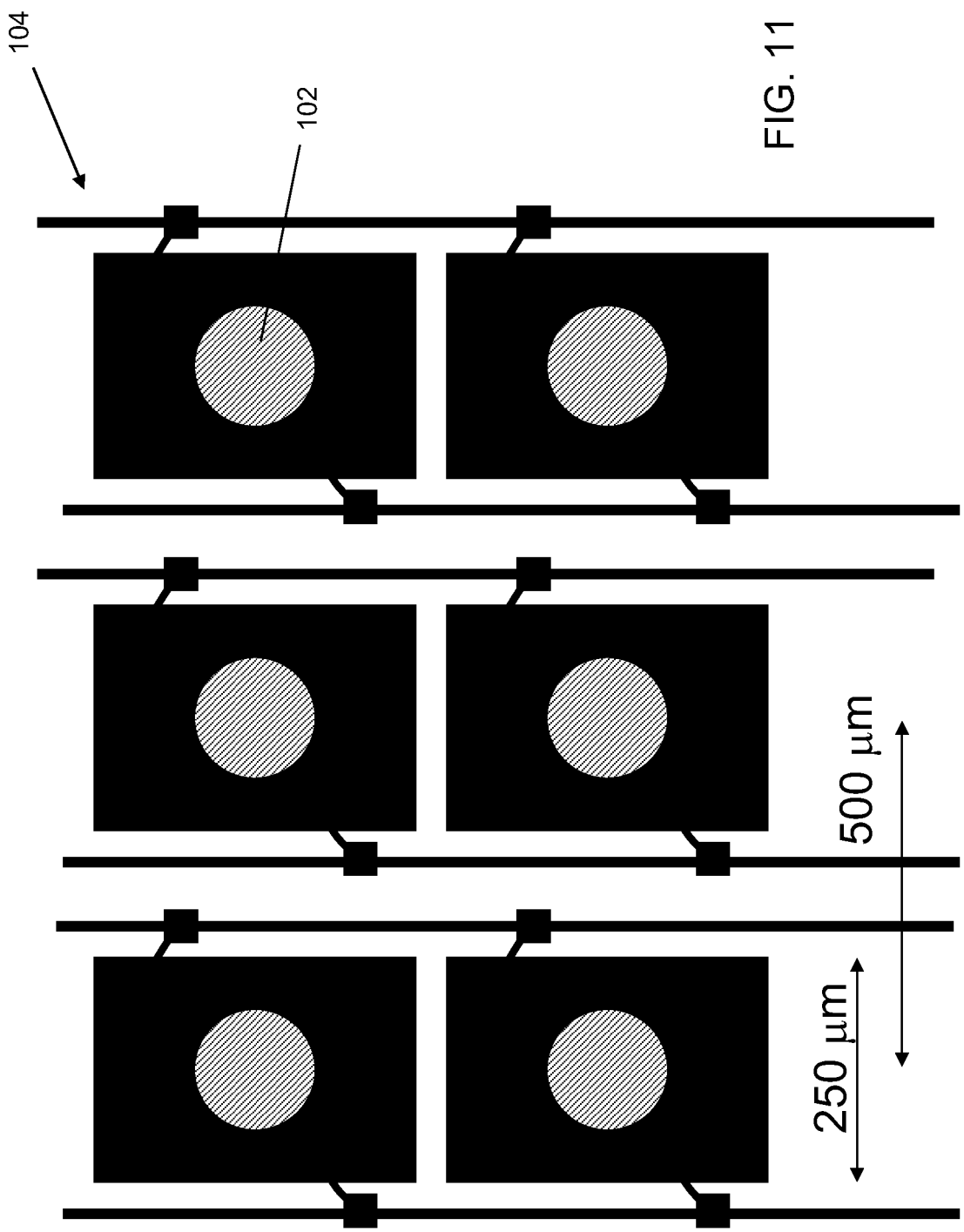
FIG. 11 depicts a schematic top view of an array of individually controllable elements for a lithographic apparatus according to an embodiment of the present invention.

FIG. 11 illustrates a plurality of individually addressable elements 102, specifically six individually addressable elements 102. In this embodiment, each of the individually addressable elements 102 is a radiation emitting diode, e.g., a blue-violet laser diode. Each radiation emitting diode bridges two electrical lines to supply electrical current to the radiation emitting diode to control the diode. Thus, the diodes form an addressable grid. A width between the two electrical lines is approximately 250 μm and the radiation emitting diodes have a pitch of approximately 500 μm.

Figure 12:
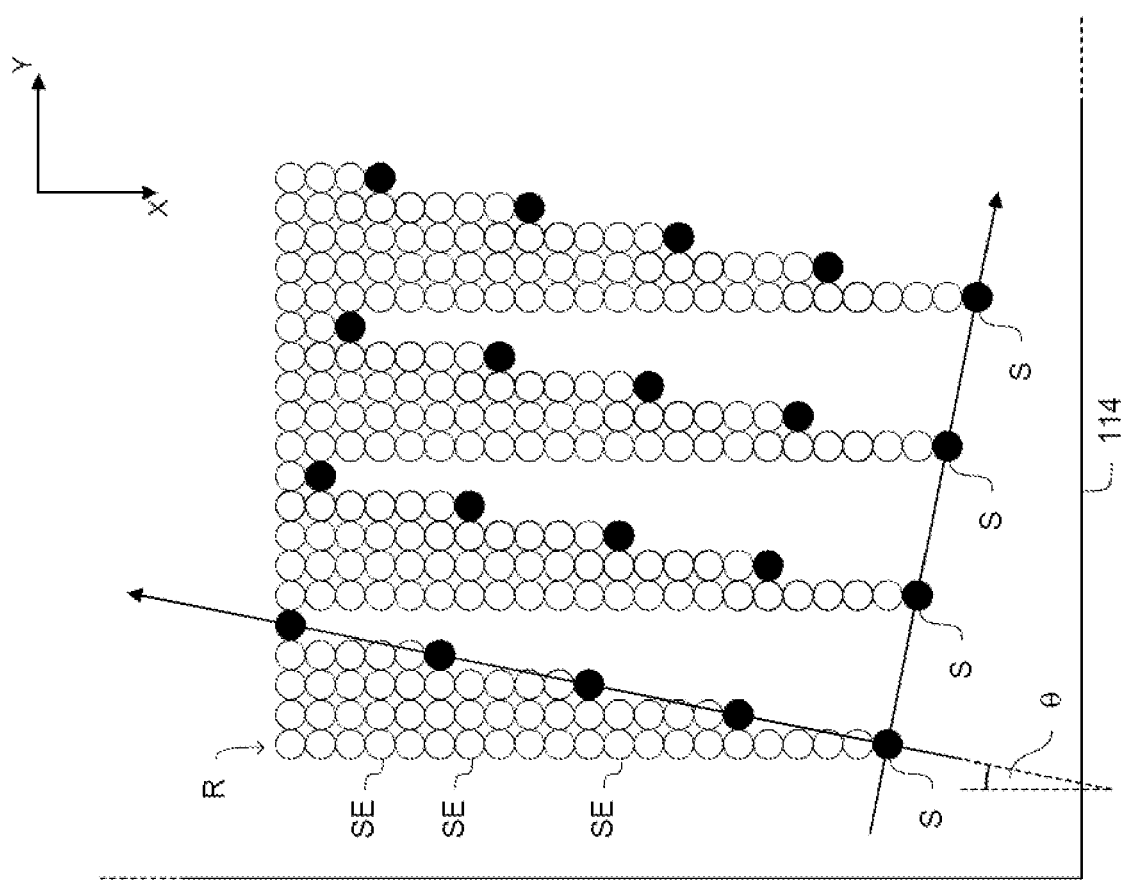
FIG. 12 depicts a mode of transferring a pattern to a substrate using an embodiment of the invention.

FIG. 12 illustrates schematically how the pattern on the substrate 114 may be generated. The filled in circles represent the array of spots S projected onto the substrate 114 by the array of lenses MLA in the projection system 108. The substrate 114 is moved relative to the projection system 108 in the X-direction as a series of exposures are exposed on the substrate. The open circles represent spot exposures SE that have previously been exposed on the substrate. As shown, each spot projected onto the substrate 114 by the array of lenses 170 within the projection system 108 exposes a row R of spot exposures on the substrate 114. The complete pattern for the substrate 114 is generated by the sum of all the rows R of spot exposures SE exposed by each of the spots S. Such an arrangement is commonly referred to as "pixel grid imaging." It will be appreciated that FIG. 12 is a schematic drawing and that spots S may overlap in practice.

It can be seen that the array of radiation spots S is arranged at an angle α relative to the substrate 114 (the edges of the substrate 114 lie parallel to the X- and Y-directions). This is done so that, when the substrate 114 is moved in the scanning direction (the X-direction), each radiation spot will pass over a different area of the substrate, thereby allowing the entire substrate to be covered by the array of radiation spots S. In an embodiment, the angle α is at most 20°, 10°, for instance at most 5°, at most 3°, at most 1°, at most 0.5°, at most 0.25°, at most 0.10°, at most 0.05°, or at most 0.01°. In an embodiment, the angle α is at least 0.0001°, e.g. at least 0.001°. The angle of inclination α and the width of the array in the scanning direction are determined in accordance with the image spot size and array spacing in the direction perpendicular to the scanning direction to ensure the whole surface area of the substrate 114 is addressed.

FIG. 13 shows schematically how an entire substrate 114 may be exposed in a single scan, by using a plurality of optical engines, each optical engine comprising one or more individually addressable elements. Eight arrays SA of radiation spots S (not shown) are produced by eight optical engines, arranged in two rows R1, R2 in a 'chess board' or staggered configuration such that the edge of one array of radiation spots S slightly overlaps with the edge of the adjacent array of radiation spots S. In an embodiment, the optical engines are arranged in at least 3 rows, for instance 4 rows or 5 rows. In this way, a band of radiation extends across the width of the substrate W, allowing exposure of the entire substrate to be performed in a single scan. Such "full width" single pass exposure helps to avoid possible stitching issues of connecting two or more passes and may also reduce machine footprint as the substrate may not need to be moved in a direction transverse to the substrate pass direction. It will be appreciated that any suitable number of optical engines may be used. In an embodiment, the number of optical engines is at least 1, for instance at least 2, at least 4, at least 8, at least 10, at least 12, at least 14, or at least 17. In an embodiment, the number of optical engines is less than 40, e.g. less than 30 or less than 20. Each optical engine may comprise a separate patterning device 104 and optionally a separate projection system 108 and/or radiation system as described above. It is to be appreciated, however, that two or more optical engines may share at least a part of one or more of the radiation system, patterning device 104, and/or projection system 108.

In the embodiments described herein, a controller is provided to control the individually addressable elements. For example, in an example where the individually addressable elements are radiation emitting devices, the controller may control when the individually addressable elements are turned ON or OFF and enable high frequency modulation of the individually addressable elements. The controller may control the power of the radiation emitted by one or more of the individually addressable elements. The controller may modulate the intensity of radiation emitted by one or more of the individually addressable elements. The controller may control/adjust intensity uniformity across all or part of an array of individually addressable elements. The controller may adjust the radiation output of the individually addressable elements to correct for imaging errors, e.g., etendue and optical aberrations (e.g., coma, astigmatism, etc.)

In lithography, a desired feature may be created on a substrate by selectively exposing a layer of resist on a substrate to radiation, e.g. by exposing the layer of resist to patterned radiation. Areas of the resist receiving a certain minimum radiation dose ("dose threshold") undergo a chemical reaction, whereas other areas remain unchanged. The thus created chemical differences in the resist layer allow for developing the resist, i.e. selectively removing either the areas having received at least the minimum dose or removing the areas that did not receive the minimum dose. As a result, part of the substrate is still protected by a resist whereas the areas of the substrate from which resist is removed are exposed, allowing e.g. for additional processing steps, for instance selective etching of the substrate, selective metal deposition, etc. thereby creating the desired feature. Patterning the radiation may be effected by setting the individually controllable elements in a patterning device such that the radiation that is transmitted to an area of the resist layer on the substrate within the desired feature is at a sufficiently high intensity that the area receives a dose of radiation above the dose threshold during the exposure, whereas other areas on the substrate receive a radiation dose below the dose threshold by setting the corresponding individually controllable elements to provide a zero or significantly lower radiation intensity.

In practice, the radiation dose at the edges of the desired feature may not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose may drop off across a transition zone. The position of the boundary of the desired feature ultimately formed after developing the resist is then determined by the position at which the received dose drops below the radiation dose threshold. The profile of the drop-off of radiation dose across the transition zone, and hence the precise position of the feature boundary, can be controlled more precisely by setting the individually controllable elements that provide radiation to points on the substrate that are on or near the feature boundary not only to maximum or minimum intensity levels but also to intensity levels between the maximum and minimum intensity levels. This is commonly referred to as "grayscaling" or "grayleveling".

Grayscaling may provide greater control of the position of the feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g. at least 4 radiation intensity values, at least 8 radiation intensity values, at least 16 radiation intensity values, at least 32 radiation intensity values, at least 64 radiation intensity values, at least 100 radiation intensity values, at least 128 radiation intensity values, or at least 256 radiation intensity values. If the patterning device is a radiation source itself (e.g. an array of light emitting diodes or laser diodes), grayscaling may be effected, e.g., by controlling the intensity levels of the radiation being transmitted. If the contrast device is a micromirror device, grayscaling may be effected, e.g., by controlling the tilting angles of the micromirrors. Also, grayscaling may be effected by grouping a plurality of programmable elements in the contrast device and controlling the number of elements within the group that are switched on or off at a given time.

In one example, the patterning device may have a series of states including: (a) a black state in which radiation provided is a minimum, or even a zero contribution to the intensity distribution of its corresponding pixel; (b) a whitest state in which the radiation provided makes a maximum contribution; and (c) a plurality of states in between in which the radiation provided makes intermediate contributions. The states are divided into a normal set, used for normal beam patterning/printing, and a compensation set, used for compensating for the effects of defective elements. The normal set comprises the black state and a first group of the intermediate states. This first group will be described as gray states, and they are selectable to provide progressively increasing contributions to corresponding pixel intensity from the minimum black value up to a certain normal maximum. The compensation set comprises the remaining, second group of intermediate states together with the whitest state. This second group of intermediate states will be described as white states, and they are selectable to provide contributions greater than the normal maximum, progressively increasing up to the true maximum corresponding to the whitest state. Although the second group of intermediate states is described as white states, it will be appreciated that this is simply to facilitate the distinction between the normal and compensatory exposure steps. The entire plurality of states could alternatively be described as a sequence of gray states, between black and white, selectable to enable grayscale printing.

It should be appreciated that grayscaling may be used for additional or alternative purposes to that described above. For example, the processing of the substrate after the exposure may be tuned such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling may be used to provide a radiation dose profile across the substrate having more than two desired dose levels. In an embodiment, the radiation dose profile has at least 2 desired dose levels, e.g. at least 3 desired radiation dose levels, at least 4 desired radiation dose levels, at least 6 desired radiation dose levels or at least 8 desired radiation dose levels.

It should further be appreciated that the radiation dose profile may be controlled by methods other than by merely controlling the intensity of the radiation received at each point on the substrate, as described above. For example, the radiation dose received by each point on the substrate may alternatively or additionally be controlled by controlling the duration of the exposure of said point. As a further example, each point on the substrate may potentially receive radiation in a plurality of successive exposures. The radiation dose received by each point may, therefore, be alternatively or additionally controlled by exposing said point using a selected subset of said plurality of successive exposures.

In order to form the pattern on the substrate, it is necessary to set each of the individually controllable elements in the patterning device to the requisite state at each stage during the exposure process. Therefore control signals, representing the requisite states, must be transmitted to each of the individually controllable elements. Desirably, the lithographic apparatus includes a controller 400 that generates the control signals. The pattern to be formed on the substrate may be provided to the lithographic apparatus in a vector-defined format e.g., GDSII. In order to convert the design information into the control signals for each individually controllable element, the controller includes one or more data manipulation devices, each configured to perform a processing step on a data stream that represents the pattern. The data manipulation devices may collectively be referred to as the "datapath".

The data manipulation devices of the datapath may be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

In an embodiment, the control signals may be supplied to the individually controllable elements 102 and/or one or more other devices (e.g., a sensor) by wired or wireless communication. Further, signals from the individually controllable elements 102 and/or from one or more other devices (e.g., a sensor) may be communicated to the controller 400.

Referring to FIG. 14(A), in a wireless embodiment, a transceiver (or merely a transmitter) 406 emits a signal embodying the control signal for receipt by a transceiver (or merely a receiver) 402. The control signal is transmitted to the respective individually controllable elements 102 by one or more lines 404. In an embodiment, the signal from the transceiver 406 may embody multiple control signals and transceiver 402 can demultiplex the signal into the multiple control signals for the respective individually controllable elements 102 and/or one or more other devices (e.g., a sensor). In an embodiment, the wireless transmission may be by radio frequency (RF).

Referring to FIG. 14(B), in a wired embodiment, one or more lines 404 may connect the controller 400 to the individually controllable elements 102 and/or one or more other devices (e.g., a sensor). In an embodiment, a single line 404 may be provided to carry each of the control signals to and/or from the array 200 body. At the array 200 body, the control signals may be then individually provided to the individually controllable elements 102 and/or one or more other devices (e.g., a sensor)). For example, like the wireless example, the control signals may be multiplexed for transmission on the single line and then be demultiplexed for provision to the individually controllable elements 102 and/or one or more other devices (e.g., a sensor)). In an embodiment, a plurality of lines 404 may be provided to carry the respective control signals of the individually controllable elements 102 and/or one or more other devices (e.g., a sensor)). In embodiment where the array 200 is rotatable, the line(s) 404 may be provided along the axis of rotation A. In an embodiment, signals may be provided to or from the array 200 body through a sliding contact at or around motor 216. This may be advantageous for a rotatable embodiment. The sliding contact can be through, for example, a brush contacting a plate.

In an embodiment, the line(s) 404 may be an optical line. In that case, the signal may be an optical signal where, for example, different control signals may be carried at different wavelengths.

In a similar manner to the control signals, power may be supplied to the individually controllable elements 102 or one or more other devices (e.g., a sensor) by wired or wireless means. For example, in a wired embodiment, power may be supplied by one or more lines 404, whether the same as the ones that carry the signals or different. A sliding contact arrangement may be provided as discussed above to transmit power. In a wireless embodiment, power may be delivered by RF coupling.

While the previous discussion focused on the control signals supplied to the individually controllable elements 102 and/or one or more other devices (e.g., a sensor), they should be understood to encompass in addition or alternatively, through appropriate configuration, transmission of signals from the individually controllable elements 102 and/or from one or more other devices (e.g., a sensor) to the controller 400. So, communication may be one-way (e.g., only to or from the individually controllable elements 102 and/or one or more other devices (e.g., a sensor)) or two-way (i.e., from and to the individually controllable elements 102 and/or one or more other devices (e.g., a sensor)). For example, the transceiver 402 may multiplex multiple signals from the individually controllable elements 102 and/or from one or more other devices (e.g., a sensor) for transmission to transceiver 406, where it can be demultiplexed into individual signals.

In an embodiment, the control signals to provide the pattern may be altered to account for factors that may influence the proper supply and/or realization of the pattern on the substrate. For example, a correction may be applied to the control signals to account for the heating of one or more of the arrays 200. Such heating may cause changed pointing direction of the individually controllable elements 102, change in uniformity of the radiation from the individually controllable elements 102, etc. In an embodiment, a measured temperature and/or expansion/contraction associated with an array 200 (e.g., of one or more of the individually controllable elements 102) from, e.g., sensor 234 may used to alter the control signals that would have been otherwise provided to form the pattern. So, for example, during exposure, the temperature of the individually controllable elements 102 may vary, the variance causing a change of the projected pattern that would be provided at a single constant temperature. Accordingly, the control signals may be altered to account for such variance. Similarly, in an embodiment, results from the alignment sensor and/or the level sensor 150 may be used to alter the pattern provided by the individually controllable elements 102. The pattern may be altered to correct, for example, distortion, which may arise from, e.g., optics (if any) between the individually controllable elements 102 and the substrate 114, irregularities in the positioning of the substrate 114, unevenness of the substrate 114, etc.

In an embodiment, the change in the control signals may be determined based on theory of the physical/optical results on the desired pattern arising from the measured parameter (e.g., measured temperature, measured distance by a level sensor, etc.). In an embodiment, the change in the control signals may be determined based on an experimental or empirical model of the physical/optical results on the desired pattern arising from the measured parameter. In an embodiment, the change of the control signals may be applied in a feedforward and/or feedback manner.

In an embodiment, the lithographic apparatus may comprise a sensor 500 to measure a characteristic of the radiation that is or to be transmitted toward the substrate by one or more individually controllable elements 102. Such a sensor may be a spot sensor or a transmission image sensor. The sensor may be used to, for example, determine the intensity of radiation from an individually controllable element 102, uniformity of radiation from an individually controllable element 102, a cross-sectional size or area of the spot of radiation from an individually controllable element 102, and/or the location (in the X-Y plane) of the spot of radiation from an individually controllable element 102.

Figure 15:
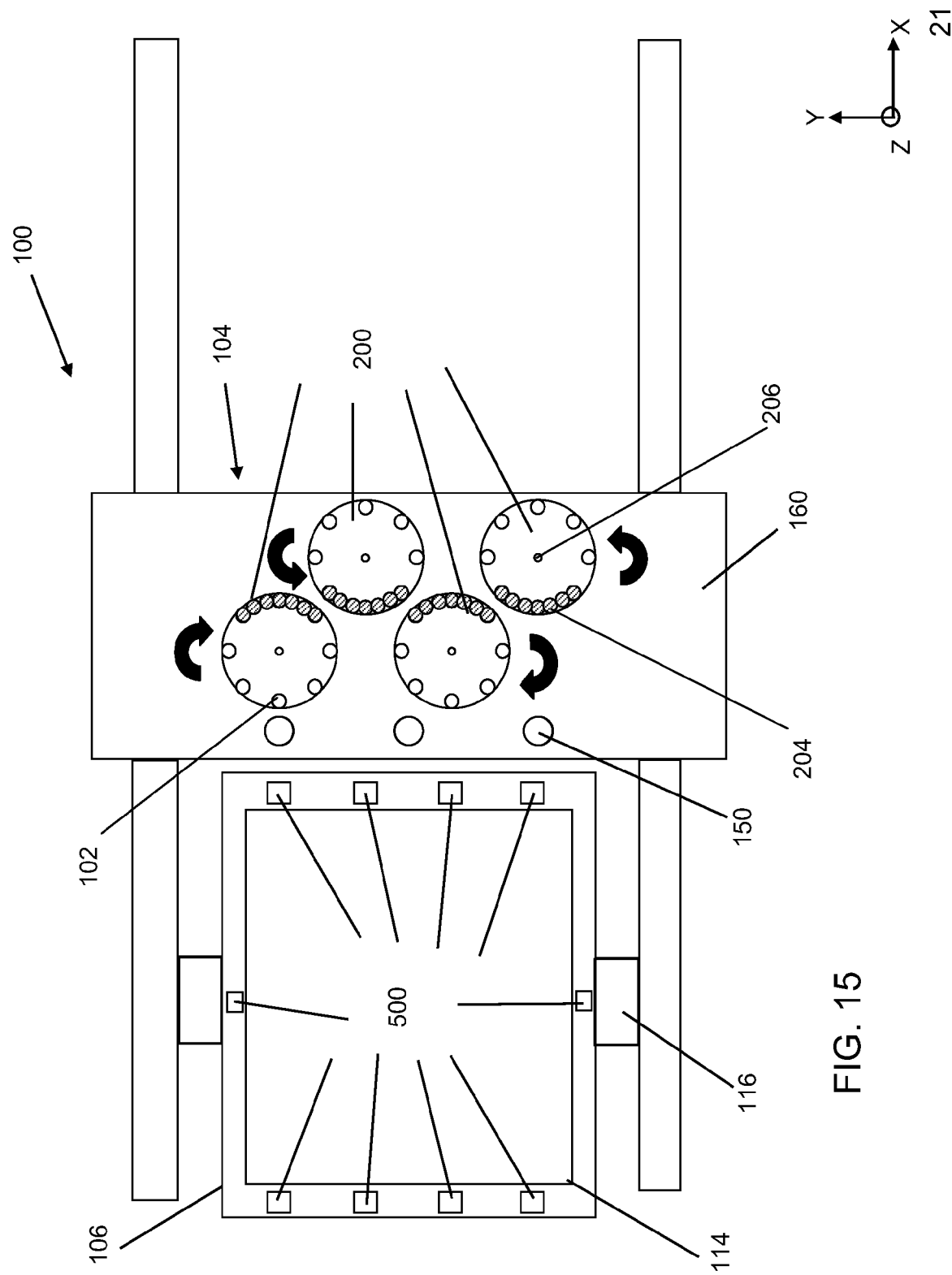
FIG. 15 depicts a schematic top view of a lithographic apparatus according to an embodiment of the present invention.

FIG. 15 depicts a schematic top view of a lithographic apparatus according to an embodiment of the invention showing some example locations of the sensor 500. In an embodiment, one or more sensors 500 are provided in or on the substrate table 106 to hold substrate 114. For example, a sensor 500 may be provided at the leading edge of the substrate table 106 and/or the trailing edge of the substrate table 106. In this example, four sensors 500 are shown, one for each array 200. Desirably, they are located at position that would not be covered by the substrate 116. In an alternative or additional example, a sensor may be provided at a side edge of the substrate table 106, desirably at a location that would not be covered by the substrate 116. The sensor 500 at the leading edge of the substrate table 106 can be used for pre-exposure detection of an individually controllable element 102. The sensor 500 at the trailing edge of the substrate table 106 can be used for post-exposure detection of an individually controllable element 102. The sensor 500 at the side edge of the substrate table 106 can be used for detection during exposure ("on-the-fly" detection) of an individually controllable element 102.

Figures 16A, 16B:
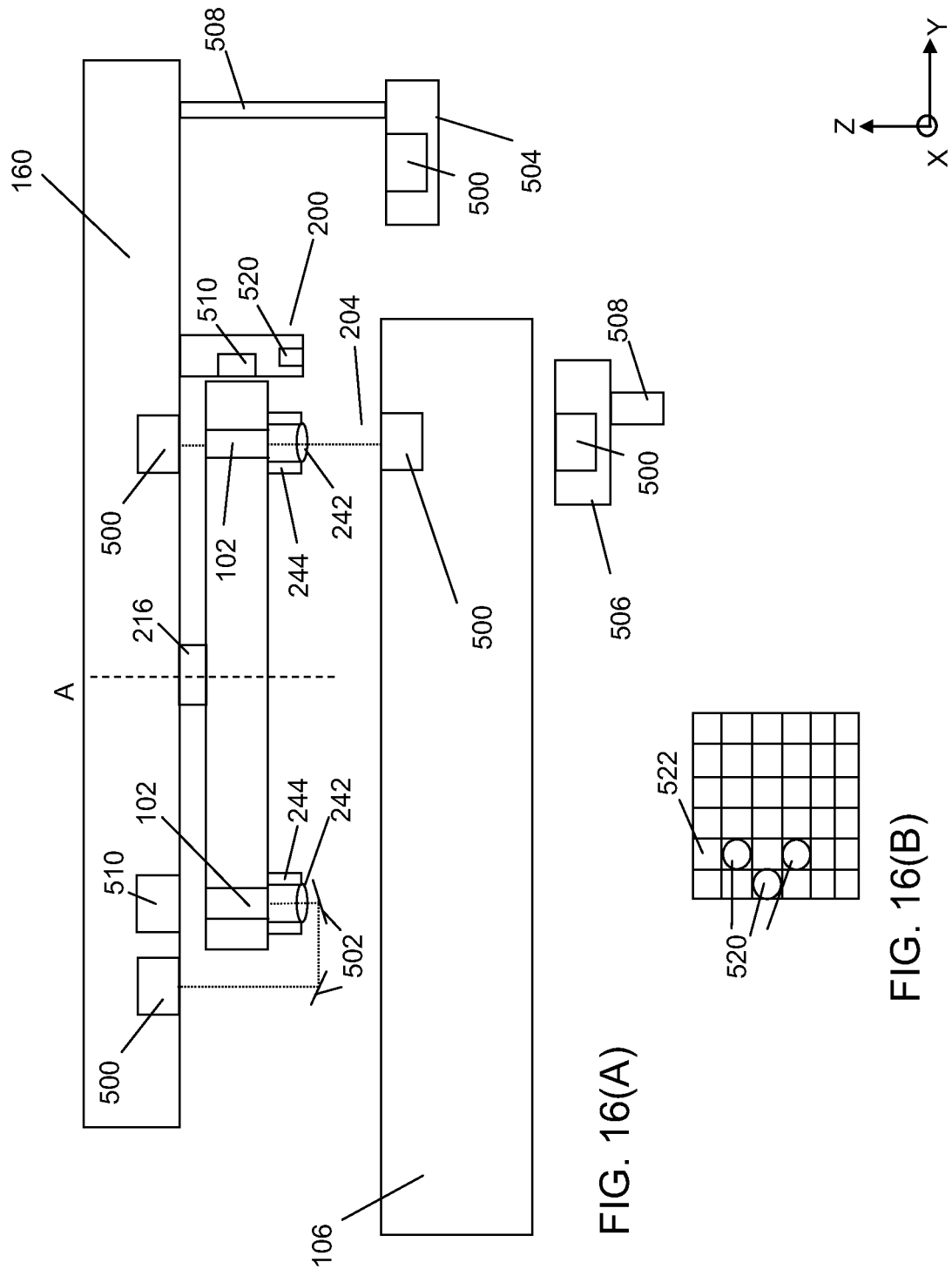
FIG. 16(A) depicts a schematic side view of a part of a lithographic apparatus according to an embodiment of the present invention.
FIG. 16(B) depicts a schematic position of a detection region of a sensor relative to a substrate.

Referring to FIG. 16(A), a schematic side view of a part of a lithographic apparatus according to an embodiment of the invention is depicted. In this example, only a single array 200 is depicted and other parts of the lithographic apparatus are omitted for clarity; the sensors described herein may be applied to each or some of the arrays 200. Some additional or alternative examples of the location of sensor 500 are depicted in FIG. 16(A) (in addition to the sensor 500 of the substrate table 106). A first example is a sensor 500 on the frame 160 that receives radiation from an individually controllable element 102 via a beam redirecting structure 502 (e.g., a reflective mirror arrangement). In this first example, the individually controllable elements 102 move in the X-Y plane and so different ones of the individually controllable element 102 can be located to provide radiation to the beam redirecting structure 502. A second additional or alternative example is a sensor 500 on the frame 160 that receives radiation from an individually controllable element 102 from the back side of the individually controllable element 102, i.e., the side opposite from which the exposure radiation is provided. In this second example, the individually controllable elements 102 move in the X-Y plane and so different ones of the individually controllable element 102 can be located to provide radiation to the sensor 500. While the sensor 500 in the second example is shown in a path of an individually controllable element 102 at the exposure region 204, the sensor 500 may be located where sensor 510 is depicted. In an embodiment, the sensor 500 on the frame 160 is in a fixed position or else may be movable by virtue of, e.g., an associated actuator. The first and second examples above may be used to provide "on-the-fly" sensing in addition to or alternatively to pre- and/or post-exposure sensing. A third example is a sensor 500 on a structure 504, 506. The structure 504, 506 may be movable by means of an actuator 508. In an embodiment, the structure 504 is located under the path of where the substrate table would move (as shown in FIG. 16(A)) or at the side of the path. In an embodiment, the structure 504 may be moved by the actuator 508 to the position where the sensor 500 of substrate table 106 is shown in FIG. 16(A) if the substrate table 106 were not there, such movement may be in the Z-direction (as shown in FIG. 16(A)) or in the X- and/or Y-direction if the structure 504 were at the side of the path. In an embodiment, the structure 506 is located above the path of where the substrate table would move (as shown in FIG. 16(A)) or at the side of the path. In an embodiment, the structure 506 may be moved by the actuator 508 to the position where the sensor 500 of substrate table 106 is shown in FIG. 16(A) if the substrate table 106 were not there. Structure 506 may be attached to frame 160 and displaceable with respect to frame 160.

In operation to measure a characteristic of the radiation that is or to be transmitted toward the substrate by one or more individually controllable elements 102, the sensor 500 is located in a path of radiation from an individually controllable element 102, by moving the sensor 500 and/or moving the radiation beam of the individually controllable element 102. So, as an example, the substrate table 106 may be moved to position sensor 500 in a path of radiation from an individually controllable element 102 as shown in FIG. 16(A). In this case, the sensor 500 is positioned into a path of an individually controllable element 102 at the exposure region 204. In an embodiment, the sensor 500 may be positioned into a path of an individually controllable element 102 outside of the exposure region 204 (e.g., the individually controllable element 102 shown on the left hand side, if the beam redirecting structure 502 where not there). Once located in the path of radiation, the sensor 500 can detect the radiation and measure a characteristic of the radiation. To facilitate sensing, the sensor 500 may move with respect to the individually controllable element 102 and/or the individually controllable element 102 may be moved with respect to the sensor 500.

As a further example, an individually controllable element 102 may be moved to a position so that radiation from the individually controllable element 102 impinges on the beam redirecting structure 502. The beam redirecting structure 502 directs the beam to sensor 500 on the frame 160. To facilitate sensing, the sensor 500 may move with respect to the individually controllable element 102 and/or the individually controllable element 102 may be moved with respect to the sensor 500. In this example, the individually controllable element 102 is measured outside of the exposure region 204.

In an embodiment, the sensor 500 may be fixed or moving. If fixed, an individually controllable element 102 is desirably movable with respect to the fixed sensor 500 to facilitate sensing. For example, the array 200 may be moved (e.g., rotated or translated) with respect to the sensor 500 (e.g., sensor 500 on the frame 160) to facilitate sensing by the sensor 500. If sensor 500 is movable (e.g., sensor 500 on the substrate table 106), an individually controllable element 102 may be kept still for the sensing, or else moved to, for example, speed up sensing.

The sensor 500 may be used to calibrate one or more of the individually controllable elements 102. For example, the location of the spot of an individually controllable element 102 can be detected by the sensor 500 prior to exposure and the system accordingly calibrated. The exposure can then be regulated based on this expected location of the spot (e.g., the position of the substrate 114 is controlled, the position of the individually controllable element 102 is controlled, the turning OFF or ON of an individually controllable element 102 is controlled, etc.). Further, calibrations may take place subsequently. For example, a calibration may take place immediately after exposure before a further exposure using, for example, a sensor 500 on the trailing edge of the substrate table 106. Calibration may take place before each exposure, after a certain number of exposures, etc. Further, the location of the spot of an individually controllable element 102 may be detected "on-the-fly" using a sensor 500 and the exposure is accordingly regulated. The individually controllable element 102 may perhaps be recalibrated based on the "on-the-fly" sensing.

In an embodiment, one or more the individually controllable elements 102 may be coded so as to be able to detect which individually controllable element 102 is at a certain position or being used. In an embodiment, individually controllable element 102 may have a marker and a sensor 510 can be used to detect the marker, which may be a RFID, a bar code, etc. For example, each of a plurality of individually controllable elements 102 can be moved to be adjacent the sensor 510 to read the marker. With knowledge of which individually controllable element 102 is adjacent the sensor 510, it is possible to know which individually controllable element 102 is adjacent a sensor 500, is in the exposure region 204, etc. In an embodiment, each individually controllable element 102 may be used to provide radiation having a different frequency and the sensor 500, 510 can be used to detect which individually controllable element 102 is adjacent the sensor 500, 510. For example, each of a plurality of individually controllable elements 102 can be moved to be adjacent the sensor 500, 510 to receive radiation from the individually controllable elements 102 and then the sensor 500, 510 can demultiplex the received radiation to determine which individually controllable element 102 was adjacent the sensor 500, 510 at a particular time. With this knowledge, it is possible to know which individually controllable element 102 is adjacent a sensor 500, is in the exposure region 204, etc.

In an embodiment, as discussed above, a position sensor may be provided to determine the position of one or more of the individually controllable elements 102 in up to 6 degrees of freedom. For example, sensor 510 may be used for position detection. In an embodiment, the sensor 510 may comprise an interferometer. In an embodiment, the sensor 510 may comprise an encoder which may be used to detect one or more single dimension encoder gratings and/or one or more two dimensional encoder gratings.

In an embodiment, a sensor 520 may be provided to determine a characteristic of the radiation that has been transmitted to the substrate. In this embodiment, sensor 520 captures radiation redirected by the substrate. In an example use, the redirected radiation captured by sensor 520 may be used to facilitate determining the location of the spot of radiation from an individually controllable element 102 (e.g., misalignment of the spot of radiation from an individually controllable element 102). In particular, the sensor 520 may capture radiation redirected from a just exposed portion of the substrate, i.e., a latent image. A measurement of the intensity of this tail redirected radiation may give an indication of whether the spot was properly aligned. For example, the repeated measurement of this tail may give a repetitive signal, a deviation from which would indicate a misalignment of the spot (e.g., an out of phase signal can indicate misalignment). FIG. 16(B) depicts a schematic position of a detection region of sensor 520 relative to an exposed region 522 of substrate 114. In this embodiment, three detection regions are shown whose results may be compared and/or combined to facilitate recognition of the misalignment. Only one detection region need be used, for example, the one on the left hand side. In an embodiment, the detector 262 of individually controllable element 102 may be used in similar manner as sensor 520. For example, one or more individually controllable elements 102 outside the exposure region 204 of the arrays 200 on the right hand side may be used to detect radiation redirected from the latent image on the substrate.

Figure 17:
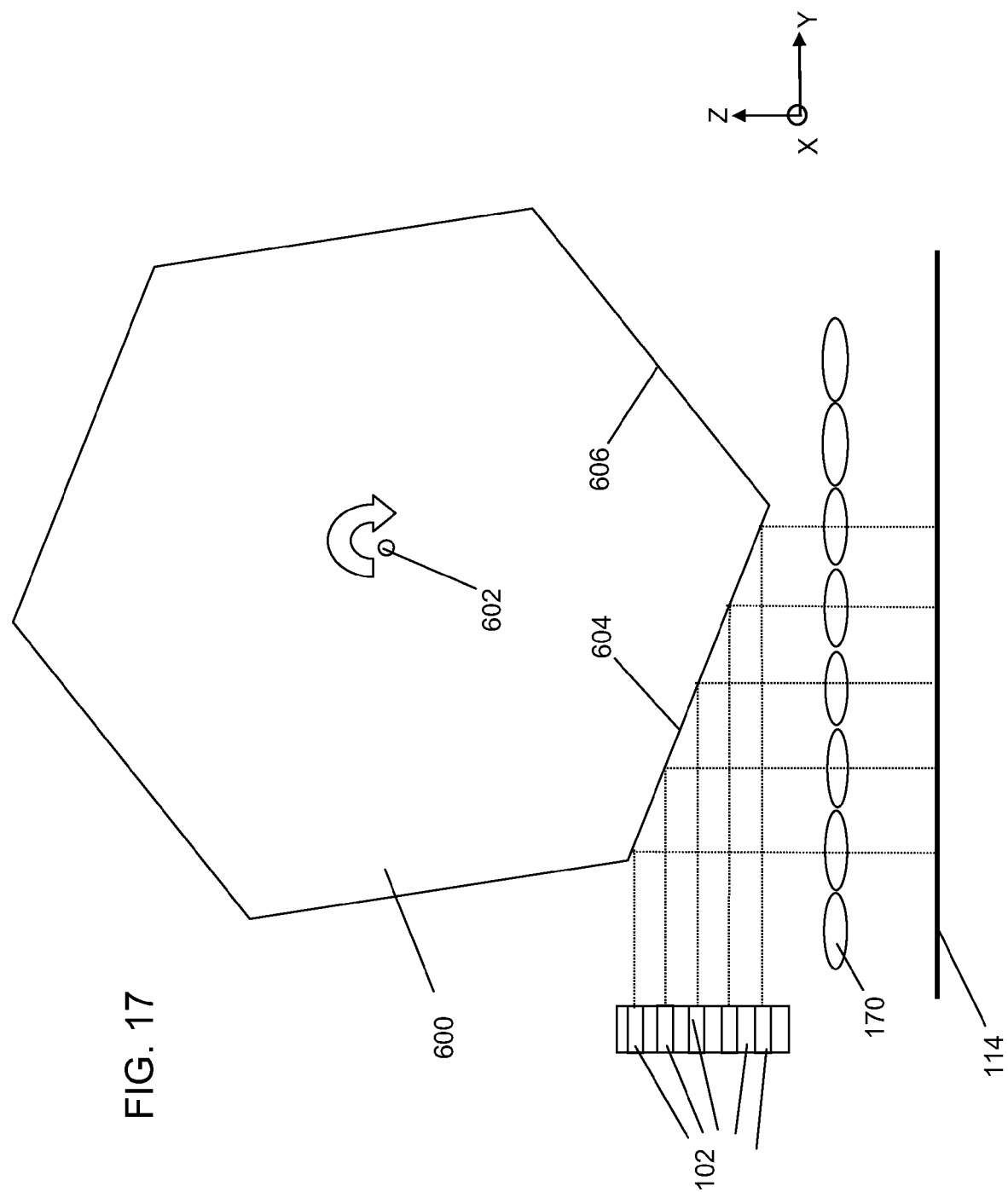
FIG. 17 depicts a schematic top view of a lithographic apparatus according to an embodiment of the present invention.

FIG. 17 depicts an embodiment of a lithographic apparatus. In this embodiment, a plurality of individually controllable elements 102 direct radiation toward a rotatable polygon 600. The surface 604 of the polygon 600 on which the radiation impinges redirects the radiation toward lens array 170. Lens array 170 directs the radiation toward substrate 114. During exposure, the polygon 600 rotates about axis 602 causing the respective beams from each of the plurality of individually controllable elements 102 to move in the Y-direction across the lens array 170. Specifically, the beams will repeatedly scan in the positive Y-direction across the lens array 170 as each new facet of the polygon 600 is impinged with radiation. The individually controllable elements 102 are modulated during exposure to provide the desired pattern as discussed herein. The polygon may have any number of appropriate sides. Further, the individually controllable elements 102 are modulated in timing with the rotating polygon 600 so that the respective beams impinge on the lenses of the lens array 170. In an embodiment, a further plurality of individually controllable elements 102 may be provided on the opposite side of the polygon, i.e., on the right hand side, so as to cause radiation to impinge on surface 606 of the polygon 600.

In an embodiment, a vibrating optical element may be used instead of polygon 600. The vibrating optical element has a certain fixed angle with respect to the lens array 170 and may translate back forth in the Y-direction to cause the beams to be scanned back and forth across the lens array 170 in the Y-direction. In an embodiment, an optical element rotating back and forth about axis 602 through an arc may be used instead of polygon 600. By rotating the optical element back and forth through an arc, the beams are caused to be scanned back and forth across the lens array 170 in the Y-direction. In an embodiment, polygon 600, vibrating optical element, and/or rotating optical element has one or more mirror surfaces. In an embodiment, polygon 600, vibrating optical element, and/or rotating optical element comprises a prism. In an embodiment, an acoustic-optical modulator may be used instead of polygon 600. The acoustic-optical modulator can be used to scan the beams across the lens array 170. In an embodiment, the lens array 170 may be placed in the radiation path between the plurality of individually controllable elements 102 and the polygon 600, vibrating optical element, rotating optical element, and/or acoustic-optical modulator.

Thus, generally, the width of an exposure area (e.g., the substrate) may be covered with fewer radiation outputs than the width of those radiation outputs divided into the width of the exposure area. In an embodiment, this may comprise moving the radiation beam source relative to the exposure area or moving the radiation beam relative to the exposure area.

Figure 18:
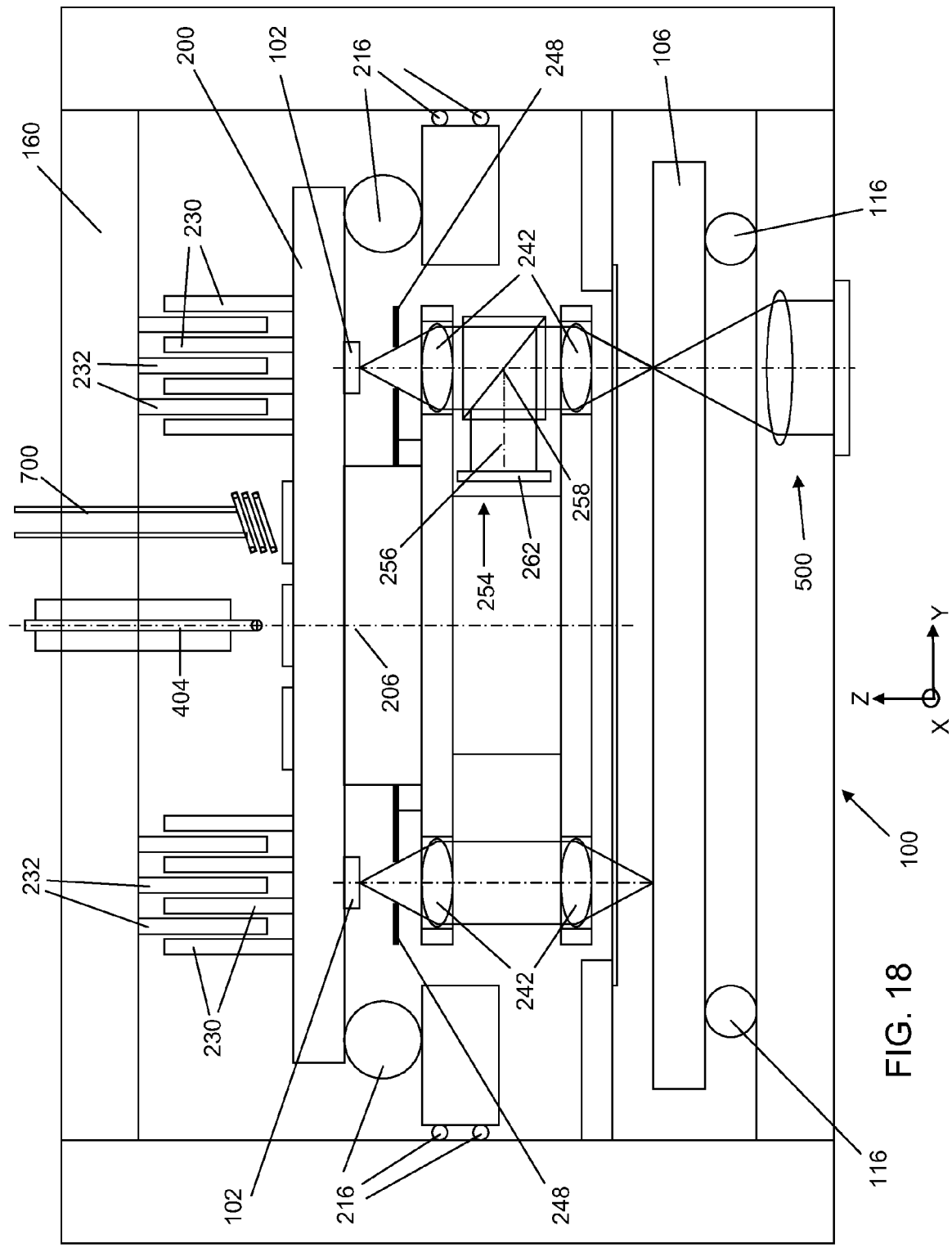
FIG. 18 depicts a schematic cross-sectional side view of a lithographic apparatus according to an embodiment of the invention.

FIG. 18 depicts a schematic cross-sectional side view of a lithographic apparatus according to an embodiment of the invention having movable individually controllable elements 102. Like the lithographic apparatus 100 shown in FIG. 5, the lithographic apparatus 100 comprises a substrate table 106 to hold a substrate, and a positioning device 116 to move the substrate table 106 in up to 6 degrees of freedom.

The lithographic apparatus 100 further comprises a plurality of individually controllable elements 102 arranged on a frame 160. In this embodiment, each of the individually controllable elements 102 is a radiation emitting diode, e.g., a laser diode, for instance a blue-violet laser diode. The individually controllable elements 102 are arranged into an array 200 of individually controllable elements 102 extending along the Y-direction. While one array 200 is shown, the lithographic apparatus may have a plurality of arrays 200 as shown, for example, in FIG. 5.

In this embodiment, the array 200 is a rotatable plate having a plurality of spatially separated individually controllable elements 102 arranged around the plate. In use, the plate rotates about its own axis 206, for example, in the directions shown by the arrows in FIG. 5. The plate of array 200 is rotated about the axis 206 using motor 216. Further, the plate of array 200 may be moved in a Z direction by motor 216 so that the individually controllable elements 102 may be displaced relative to the substrate table 106.

In this embodiment, the array 200 may have one or more fins 230 to increase the surface area for heat dissipation. The fin(s) 230 may be, for example, on a top surface of the array 200. Optionally, one or more further fins 232 may be provided to cooperate with the fin(s) 230 to facilitate heat dissipation. For example, the fin(s) 232 is able to absorb heat from the fin(s) 230 and may comprise a fluid (e.g., liquid) conducting channel and an associated heat exchanger/pump similar to as shown in and described with respect to FIG. 7(F).

In this embodiment, a lens 242 may be located in front of each individually controllable element 102 and be movable with the individually controllable element 102 (e.g., rotatable about axis A). In FIG. 18, two lenses 242 are shown and are attached to the array 200. Further, the lens 242 may be displaceable with respect to the individually controllable element 102 (e.g., in the Z-direction).

In this embodiment, an aperture structure 248 having an aperture therein may be located above lens 242 between the lens 242 and the associated individually controllable element 102. The aperture structure 248 can limit diffraction effects of the lens 242, the associated individually controllable element 102, and/or of adjacent lenses 242/individually controllable elements 102.

In this embodiment, a sensor 254 may be provided with an individually addressable element 102 (or with a plurality of individually addressable elements 102 of the array 200). In this embodiment, the sensor 254 is arranged to detect focus. A focus detection beam 256 is redirected (e.g., reflected) off the substrate surface, passes through the lens 242 and is directed toward a detector 262 by, e.g., a half-silvered mirror 258. In an embodiment, the focus detection beam 256 may be radiation used for exposure that happens to be redirected from the substrate. In an embodiment, the focus detection beam 256 may be a dedicated beam directed at the substrate and which, upon redirected by the substrate, becomes the beam 256. An example focus sensor is described above with respect to FIG. 7(O). The mirror 258 and detector 262 may be mounted to the array 200.

In this embodiment, the control signals may be supplied to the individually controllable elements 102 and/or one or more other devices (e.g., a sensor) by wired or wireless communication. Further, signals from the individually controllable elements 102 and/or from one or more other devices (e.g., a sensor) may be communicated to a controller. In FIG. 18, the line(s) 404 may be provided along the axis of rotation 206. In an embodiment, the line(s) 404 may be an optical line. In that case, the signal may be an optical signal where, for example, different control signals may be carried at different wavelengths. In a similar manner to the control signals, power may be supplied to the individually controllable elements 102 or one or more other devices (e.g., a sensor) by wired or wireless means. For example, in a wired embodiment, power may be supplied by one or more lines 404, whether the same as the ones that carry the signals or different. In a wireless embodiment, power may be delivered by RF coupling as shown at 700.

In this embodiment, the lithographic apparatus may comprise a sensor 500 to measure a characteristic of the radiation that is or to be transmitted toward the substrate by one or more individually controllable elements 102. Such a sensor may be a spot sensor or a transmission image sensor. The sensor may be used to, for example, determine the intensity of radiation from an individually controllable element 102, uniformity of radiation from an individually controllable element 102, a cross-sectional size or area of the spot of radiation from an individually controllable element 102, and/or the location (in the X-Y plane) of the spot of radiation from an individually controllable element 102. In this embodiment, the sensor 500 is on the frame 160 and may be adjacent the substrate table 106 or accessible through the substrate table 106.

In an embodiment, rather than having the individually controllable elements 102 being movable in the X-Y plane, the individually controllable elements 102 are substantially stationary in the X-Y plane during exposure of the substrate. This is not to say that the controllable elements 102 may not be movable in the X-Y plane. For example, they may be movable in the X-Y plane to correct their position. A possible advantage of having the controllable elements 102 substantially stationary is easier power and/or data transfer to the controllable elements 102. A further or alternative possible advantage is improved ability to locally adjust the focus to compensate for height difference in the substrate that is more than the focal depth of the system and is on a higher spatial frequency than the pitch of moving controllable elements.

In this embodiment, while the controllable elements 102 are substantially stationary, there is at least one optical element that moves relative to the individually controllable elements 102. Various arrangements of individually controllable elements 102 substantially stationary in the X-Y plane and an optical element movable with respect thereto are described hereafter.

In the description hereafter, the term "lens" should be understood generally to encompass, where the context allows, any one or combination of various types of optical components, including refractive, reflective, magnetic, electromagnetic and electrostatic optical components, such as any refractive, reflective, and/or diffractive optical element that provides the same function as the referenced lens. For example, an imaging lens may be embodied in the form of a conventional refractive lens having optical power, in the form of a Schwarzschild reflective system having optical power, and/or in the form of a zone plate having optical power. Moreover, an imaging lens may comprise non-imaging optics if the resulting effect is to produce a converged beam on the substrate.

Further, in the description hereafter, reference is made to a plurality of individually controllable elements 102, such as mirrors of a mirror array modulator or a plurality of radiation sources. However, the description should be understood more generally to refer to a modulator arranged to output a plurality of beams. For example, the modulator may be an acoustic-optical modulator to output a plurality of beams from a beam provided by a radiation source.

Figure 19:
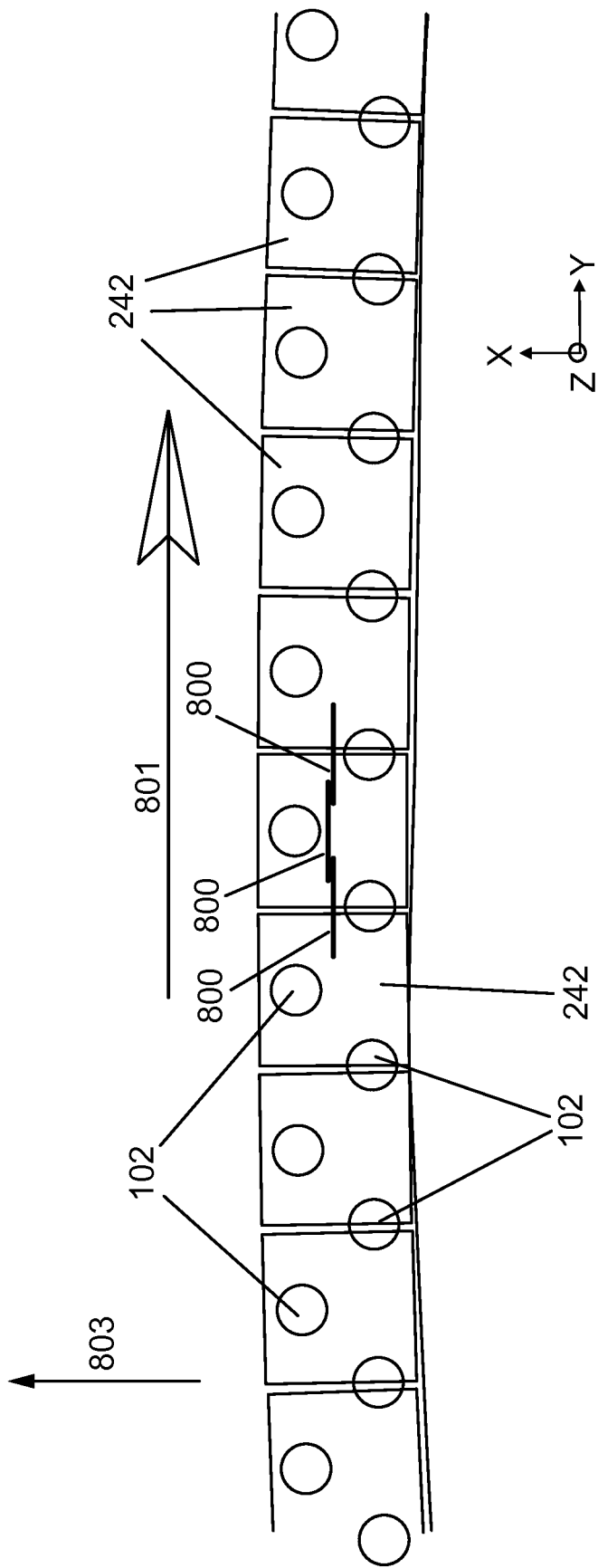
FIG. 19 depicts a schematic top view layout of a portion of a lithographic apparatus having individually controllable elements substantially stationary in the X-Y plane and an optical element movable with respect thereto according to an embodiment of the invention.

FIG. 19 depicts a schematic top view layout of portion of a lithographic apparatus having a plurality of individually controllable elements 102 (e.g., laser diodes) that are substantially stationary in the X-Y plane and an optical element 242 movable with respect thereto according to an embodiment of the invention. In this embodiment, the plurality of individually controllable elements 102 are attached to a frame and are substantially stationary in the X-Y plane, a plurality of imaging lenses 242 move substantially in the X-Y plane (as shown in FIG. 19 by the indication of the rotation of the wheel 801) with respect to those individually controllable elements 102, and the substrate moves in the direction 803. In an embodiment, the imaging lenses 242 move with respect to the individually controllable elements 102 by rotating about an axis. In an embodiment, the imaging lenses 242 are mounted on a structure that rotates about the axis (e.g., in the direction shown in FIG. 19) and arranged in a circular manner (e.g., as partially shown in FIG. 19).

Each of the individually controllable elements 102 provide a collimated beam to a moving imaging lens 242. In an embodiment, the individually controllable elements 102 are associated with one or more collimating lenses to provide the collimated beam. In an embodiment, the collimating lens(es) is substantially stationary in the X-Y plane and attached to the frame to which the individually controllable elements 102 are attached.

In this embodiment, the cross-sectional width of the collimated beams are smaller than the cross-sectional width of the imaging lenses 242. So, as soon as a collimated beam would fall completely within the optically transmissive portion of an imaging lens 242, the individually controllable element 102 (e.g., the diode laser) can be switched on. The individually controllable element 102 (e.g., the diode laser) is then switched off when the beam falls outside of the optically transmissive portion of the imaging lens 242. Thus, in an embodiment, the beam from an individually controllable element 102 passes through a single imaging lens 242 at any one time. The resulting traversal of the imaging lens 242 with respect to the beam from an individually controllable element 102 yields an associated imaged line 800 on the substrate from each individually controllable element 102 that is turned on. In FIG. 19, three imaged lines 800 are shown relative to each of three example individually controllable elements 102 in FIG. 19, although as will be apparent the other individually controllable elements 102 in FIG. 19 can produce an associated imaged line 800 on the substrate.

In the FIG. 19 layout, the imaging lens 242 pitch may be 1.5 mm and the cross-sectional width (e.g., diameter) of the beam from each of the individually controllable elements 102 is a little smaller than 0.5 mm. With this configuration, it is possible to write, with each individually controllable element 102, a line of about 1 mm in length. So, in this arrangement of beam diameter of 0.5 mm and an imaging lens 242 diameter of 1.5 mm, the duty cycle can be as high as 67%. With an appropriate positioning of individually controllable elements 102 with respect to the imaging lenses 242, a full coverage across the width of the substrate is possible. So, for example, if only standard 5.6 mm diameter laser diodes are used, several concentric rings, as shown in FIG. 19, of laser diodes can be used to get a full coverage across the width of the substrate. So, in this embodiment, it may be possible to use fewer individually controllable elements 102 (e.g., laser diodes) than with using merely a fixed array of individually controllable elements 102 or perhaps with the moving individually controllable elements 102 described herein.

In this embodiment, each of the imaging lenses 242 should be identical because each individually controllable element 102 will be imaged by all the moving imaging lenses 242. In this embodiment, all the imaging lenses 242 are without the need to image a field although a higher NA lens is needed, for example, greater than 0.3, greater than 0.18, or greater than 0.15. With this single element optics, diffraction limited imaging is possible.

Figure 20:
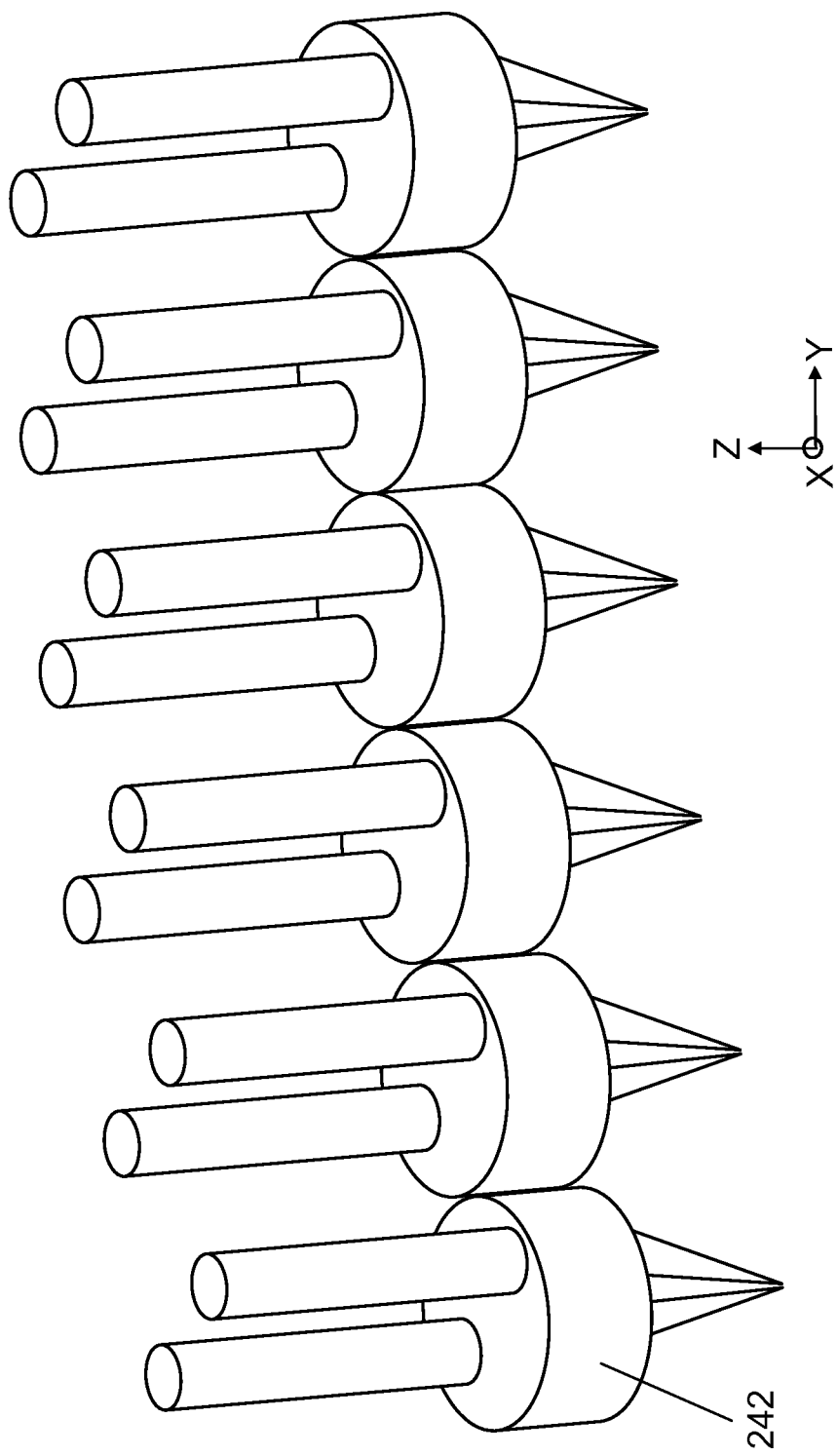
FIG. 20 depicts a schematic three-dimensional drawing of a portion of the lithographic apparatus of FIG. 19.

The focal point of the beam on the substrate is fixed to the optical axis of the imaging lens 242 independent of where the collimated beam enters the lens (see, e.g., FIG. 20 which depicts a schematic three-dimensional drawing of a portion of the lithographic apparatus of FIG. 19). A disadvantage of this arrangement is that the beam from the imaging lens 242 towards the substrate is not telecentric and as a consequence, a focus error could occur possibly leading overlay error.

In this embodiment, adjusting the focus by using an element that is not moving in the X-Y plane (e.g., at the individually controllable element 102) will likely cause vignetting. Accordingly, desired adjustment of focus should occur in the moving imaging lens 242. This accordingly may require an actuator of higher frequency than the moving imaging lens 242.

Figure 21:
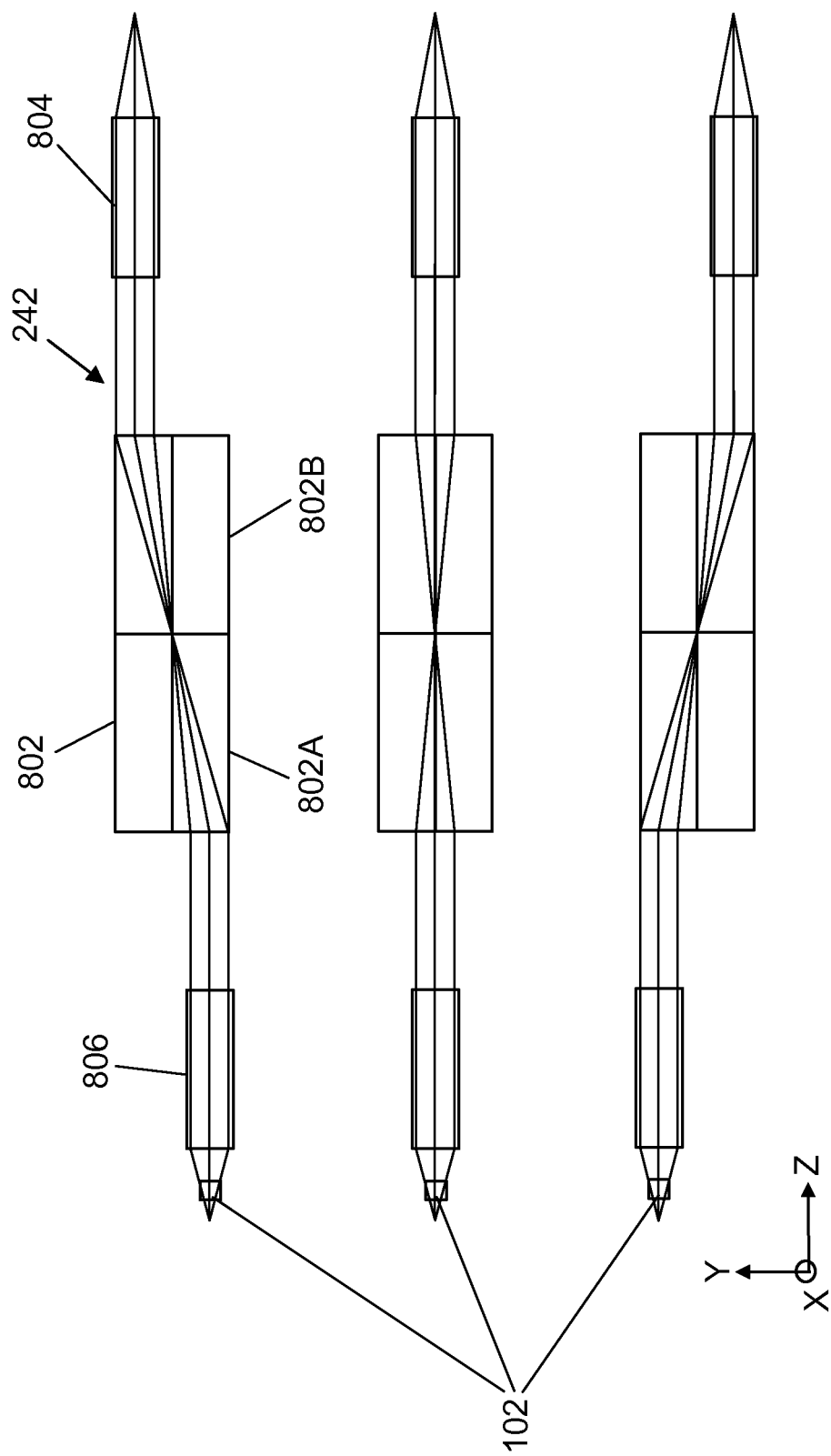
FIG. 21 depicts a schematic side view layout of a portion of a lithographic apparatus having individually controllable elements substantially stationary in the X-Y plane and an optical element movable with respect thereto according to an embodiment of the invention and showing three different rotation positions of an optical element 242 set with respect to an individually controllable element.

FIG. 21 depicts a schematic side view layout of a portion of a lithographic apparatus having individually controllable elements substantially stationary in the X-Y plane and an optical element movable with respect thereto according to an embodiment of the invention and showing three different rotation positions of an imaging lens 242 set with respect to an individually controllable element. In this embodiment, the lithographic apparatus of FIGS. 19 and 20 is extended by having the imaging lens 242 comprise two lenses 802, 804 to receive the collimated beam from an individually controllable element 102. Like in FIG. 19, the imaging lens 242 moves relative to an individually controllable element 102 in the X-Y plane (e.g., rotates about an axis where the imaging lenses 242 are arranged at least partially in a circular manner). In this embodiment, the beam from an individually controllable element 102 is collimated by lens 806 before reaching imaging lens 242, although in an embodiment such a lens need not be provided. The lens 806 is substantially stationary in the X-Y plane. The substrate moves in the X-direction.

The two lenses 802, 804 are arranged in the optical path of the collimated beam from an individually controllable element 102 to the substrate, to make the beam towards the substrate telecentric. The lens 802, between the individually controllable element 102 and the lens 804, comprises two lenses 802A, 802B with substantially equal focal length. The collimated beam from the individually controllable element 102 is focused between the two lenses 802A, 802B such that lens 802B will collimate the beam towards the imaging lens 804. The imaging lens 804 images the beam onto the substrate.

In this embodiment, the lens 802 moves at a certain speed in the X-Y plane (e.g., certain revolutions per minute (RPM)) with respect to an individually controllable element 102. Thus, in this embodiment, the outgoing collimated beam from the lens 802 would have twice the speed in the X-Y plane as the moving imaging lens 804 if it were moving at the same speed as the lens 802. So, in this embodiment, the imaging lens 804 moves at a speed, different than that of lens 802, with respect to an individually controllable element 102. In particular, the imaging lens 804 is moved in the X-Y plane at twice the speed as the lens 802 (e.g., twice the RPM of the lens 802) so that the beams will be focused telecentrically on the substrate. This aligning of the outgoing collimated beam from the lens 802 to the imaging lens 804 is schematically shown in three example positions in FIG. 21. Further, since the actual writing on the substrate will be done at twice the speed compared to the example of FIG. 19, the power of the individually controllable elements 102 should be doubled.

In this embodiment, adjusting the focus by using an element that is not moving in the X-Y plane (e.g., at the individually controllable element 102) will likely lead to loss of telecentricity and cause vignetting. Accordingly, desired adjustment of focus should occur in the moving imaging lens 242.

Further, in this embodiment, all the imaging lenses 242 are without the need to image a field. With this single element optics, diffraction limited imaging is possible. A duty cycle of about 65% is possible. In an embodiment, the lenses 806, 802A, 802B and 804 may comprise 2 aspherical and 2 spherical lenses.

In an embodiment, about 380 individually controllable elements 102 (e.g., standard laser diodes) may be used. In an embodiment, about 1400 imaging lens 242 sets may be used. In an embodiment using a standard laser diode, about 4200 imaging lens 242 sets may be used, which may be arranged in 6 concentric rings on a wheel. In an embodiment, a rotating wheel of imaging lenses would rotate at about 12,000 RPM.

Figure 22:
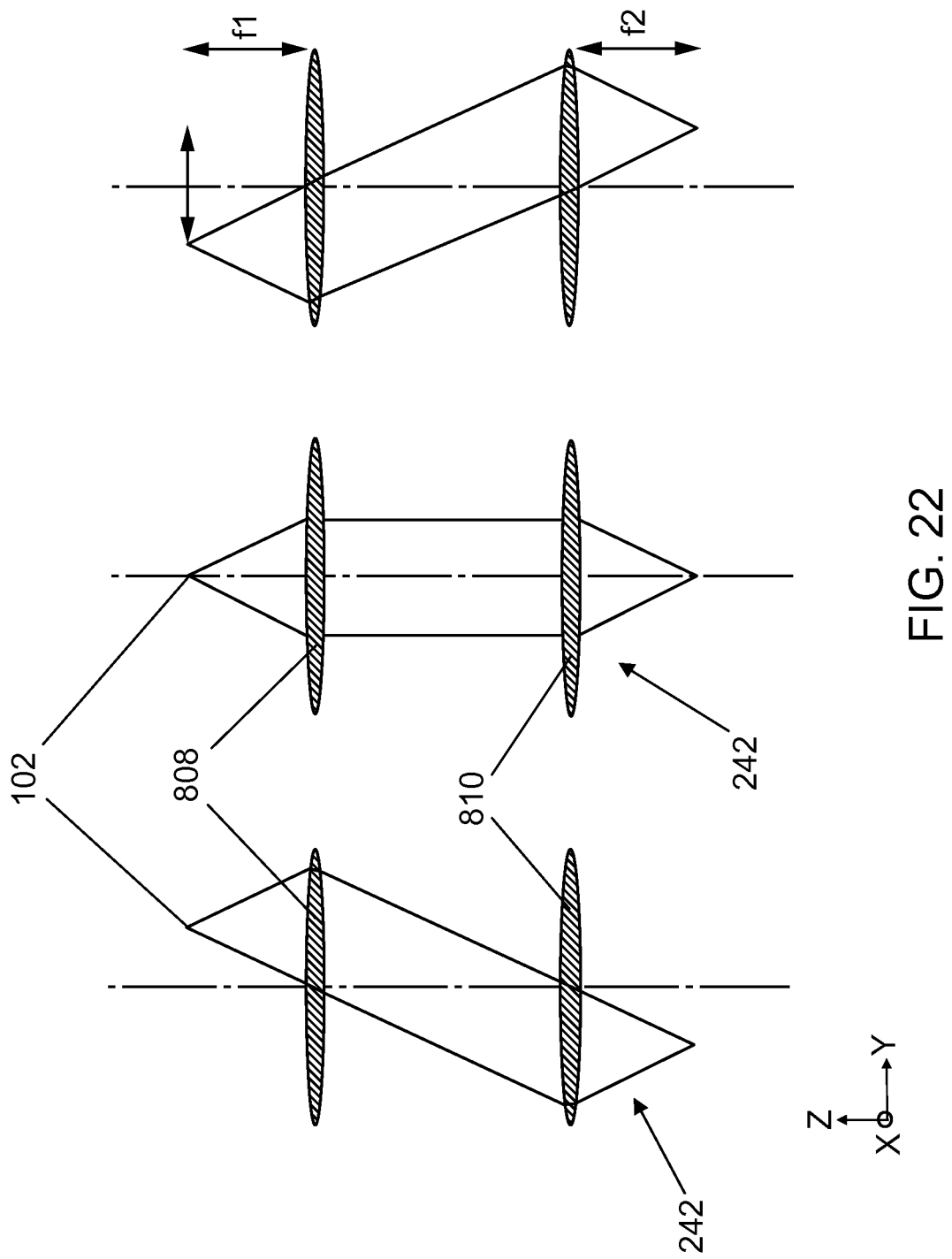
FIG. 22 depicts a schematic side view layout of a portion of a lithographic apparatus having individually controllable elements substantially stationary in the X-Y plane and an optical element movable with respect thereto according to an embodiment of the invention and showing three different rotation positions of an optical element 242 set with respect to an individually controllable element.

FIG. 22 depicts a schematic side view layout of a portion of a lithographic apparatus having individually controllable elements substantially stationary in the X-Y plane and an optical element movable with respect thereto according to an embodiment of the invention and showing three different rotation positions of an imaging lens 242 set with respect to an individually controllable element. In this embodiment, to avoid moving lenses at different speeds as described with respect to FIG. 21, a so called 4f telecentric in/telecentric out imaging system for moving imaging lens 242 could be used as shown in FIG. 22. The moving imaging lens 242 comprises two imaging lenses 808, 810 that are moved at substantially the same speed in the X-Y plane (e.g., rotated about an axis where the imaging lenses 242 are arranged at least partially in a circular manner) and receives a telecentric beam as an input and outputs to the substrate a telecentric imaging beam. In this arrangement with a magnification of 1, the image on the substrate moves twice as fast as the moving imaging lens 242. The substrate moves in the X-direction. In this arrangement, the optics would likely need to image a field with a relatively large NA, for example, greater than 0.3, greater than 0.18, or greater than 0.15. This arrangement may not be possible with two single element optics. Six or more elements with very accurate alignment tolerances may be needed to get a diffraction limited image. A duty cycle of about 65% is possible. In this embodiment, it is also relatively easy to focus locally with an element that does not move along or in conjunction with movable imaging lenses 242.

Figure 23:
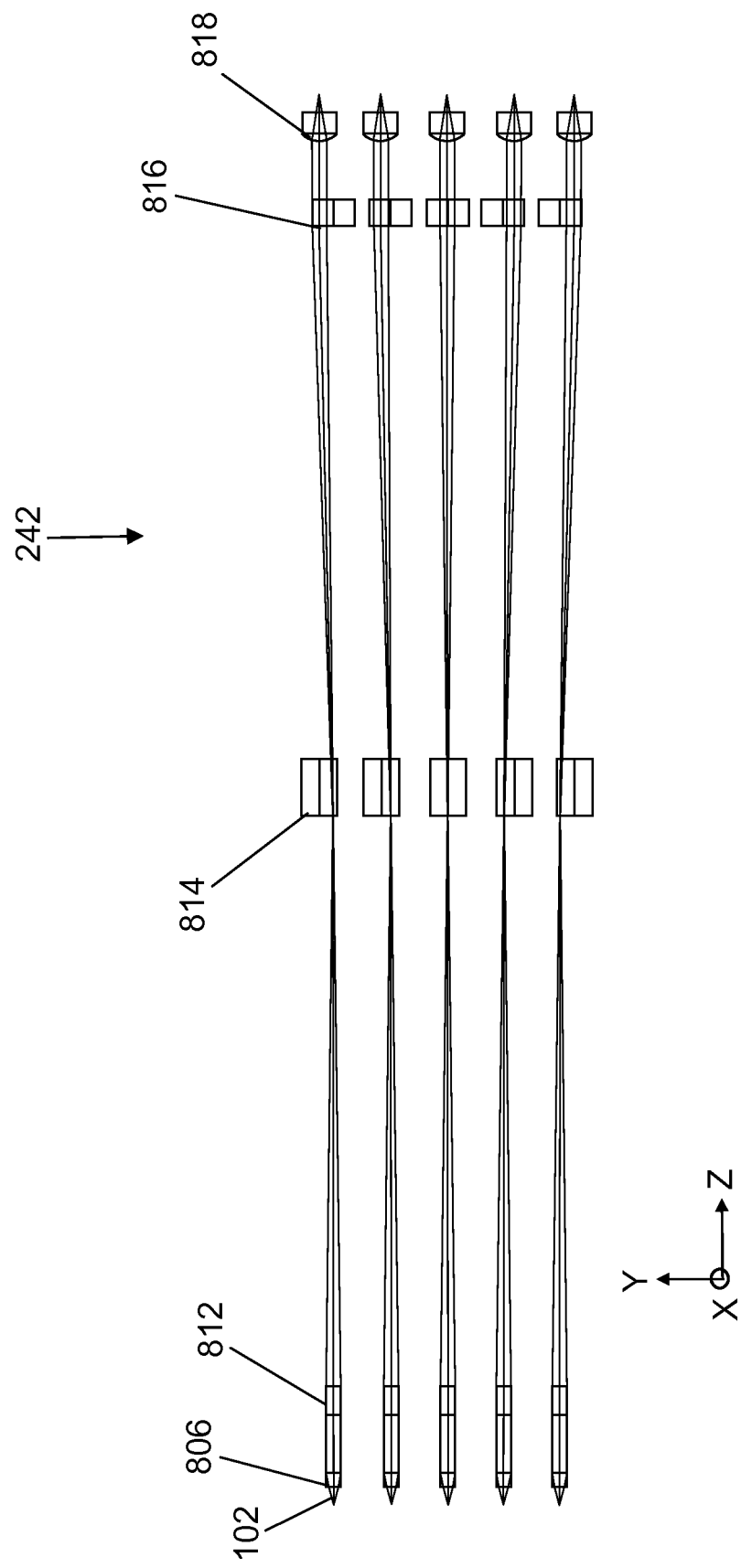
FIG. 23 depicts a schematic side view layout of a portion of a lithographic apparatus having individually controllable elements substantially stationary in the X-Y plane and an optical element movable with respect thereto according to an embodiment of the invention and showing five different rotation positions of an optical element 242 set with respect to an individually controllable element.

FIG. 23 depicts a schematic side view layout of a portion of a lithographic apparatus having individually controllable elements substantially stationary in the X-Y plane and an optical element movable with respect thereto according to an embodiment of the invention and showing five different rotation positions of an imaging lens 242 set with respect to an individually controllable element. In this embodiment, to avoid moving lenses at different speeds as described with respect to FIG. 21 and to have optics without imaging a field as noted with respect to FIG. 22, a combination of lenses that are substantially stationary in the X-Y plane are combined with the moving imaging lens 242. Referring to FIG. 23, an individually controllable element 102 is provided that is substantially stationary in the X-Y plane. An optional collimating lens 806 that is substantially stationary in the X-Y is provided to collimate the beam from the individually controllable element 102 and to provide the collimated beam (having, for example, a cross-sectional width (e.g., diameter) of 0.5 mm) to a lens 812.

Lens 812 is also substantially stationary in the X-Y plane and focuses the collimated beam to a field lens 814 (having, for example, a cross-sectional width (e.g., diameter) of 1.5 mm) of moving imaging lens 242. The lens 814 has a relatively large focal length (e.g., f=20 mm).

The field lens 814 of movable imaging lens 242 moves relative to the individually controllable elements 102 (e.g., rotates about an axis where the imaging lenses 242 are arranged at least partially in a circular manner). The field lens 814 directs the beam toward imaging lens 818 of the movable imaging lens 242. Like field lens 814, the imaging lens 818 moves relative to the individually controllable elements 102 (e.g., rotates about an axis where the imaging lenses 242 are arranged at least partially in a circular manner). In this embodiment, the field lens 814 moves at the substantially same speed as the imaging lens 818. A pair of field lens 814 and imaging lens 818 are aligned with respect to each other. The substrate moves in the X-direction.

Between field lens 814 and the imaging lens 818 is a lens 816. Lens 816 is substantially stationary in the X-Y plane and collimates the beam from field lens 814 to the imaging lens 818. The lens 816 has a relatively large focal length (e.g., f=20 mm).

In this embodiment, the optical axis of a field lens 814 should coincide with the optical axis of the corresponding imaging lens 816. The field lens 814 is designed such that the beam will be folded so that the chief ray of the beam that is collimated by the lens 816 coincides with the optical axis of the imaging lens 818. In this way the beam towards the substrate is telecentric.

Lenses 812 and 816 may be simple spherical lenses due to the large f-number. The field lens 814 should not affect the image quality and may also be a spherical element. In this embodiment, the collimating lens 806 and the imaging lens 818 are lenses without the need to image field. With this single element optics, diffraction limited imaging is possible. A duty cycle of about 65% is possible.

Figure 24:
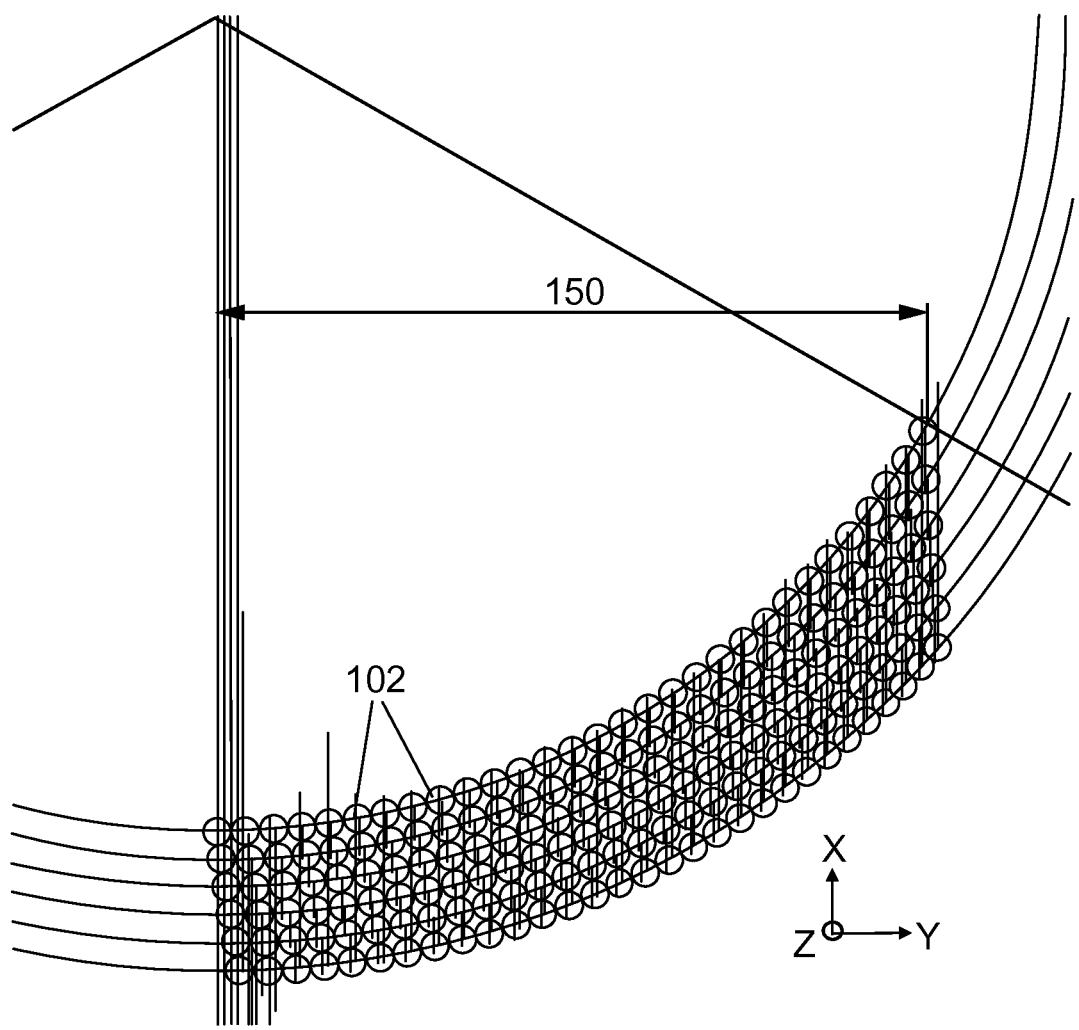
FIG. 24 depicts a schematic layout of a portion of the individually controllable elements 102 if standard laser diodes are used with a diameter of 5.6 mm to obtain full coverage across the width of the substrate.
Figure 25:
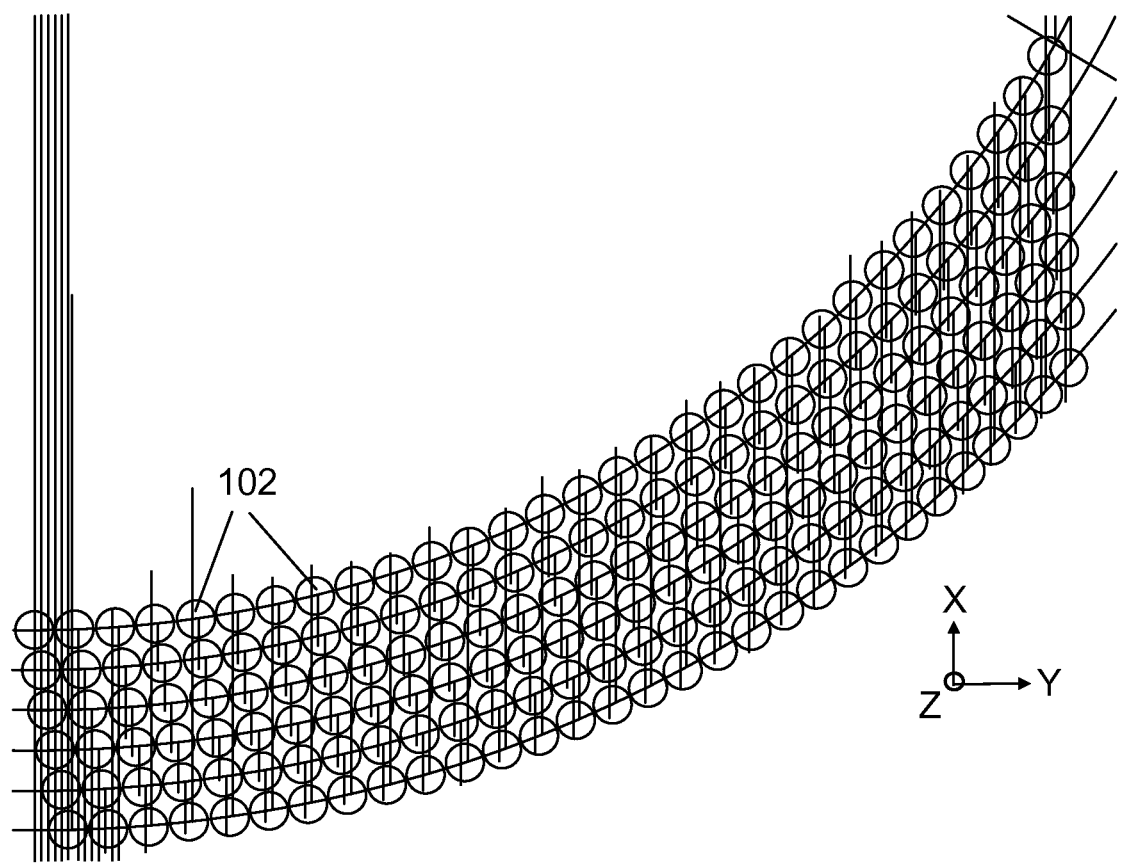
FIG. 25 depicts a schematic layout of a detail of FIG. 24.

In an embodiment, where the movable imaging lens 242 is rotatable, at least two concentric rings of lenses and individually controllable elements 102 are provided to obtain full coverage across the width of the substrate. In an embodiment, the individually controllable elements 102 on these rings are arranged at a pitch of 1.5 mm. If a standard laser diode with a diameter of 5.6 mm is used, at least 6 concentric rings may be needed for full coverage. FIGS. 24 and 25 depict the arrangement of concentric rings of individually controllable elements 102 according to these arrangements. This would lead, in an embodiment, to approximately 380 individually controllable elements 102 with corresponding lenses that are substantially stationary in the X-Y plane. The moving imaging lens 242 would have 700×6 rings=4200 sets of lenses 814, 818. With this configuration, it is possible to write, with each individually controllable element 102, a line of about 1 mm in length. In an embodiment, about 1400 imaging lens 242 sets may be used. In an embodiment, the lenses 812, 814, 816 and 818 may comprise 4 aspherical lenses.

In this embodiment, adjusting the focus by using an element that is not moving in the X-Y plane (e.g., at the individually controllable element 102) will likely lead to loss of telecentricity and cause vignetting. Accordingly, desired adjustment of focus should occur in the moving imaging lens 242. This accordingly may require an actuator of higher frequency than the moving imaging lens 242.

Figure 26:
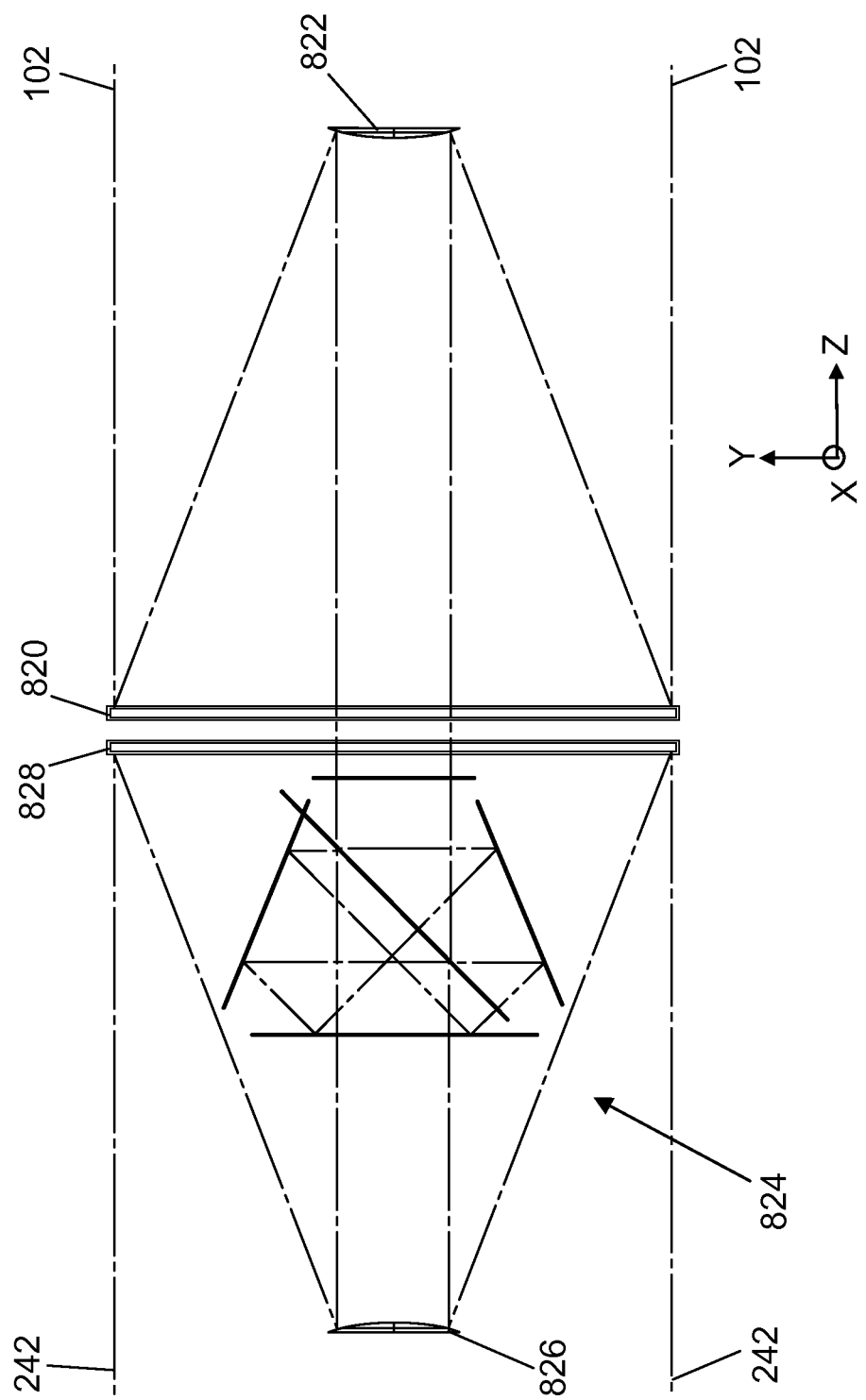
FIG. 26 depicts a schematic side view layout of a portion of a lithographic apparatus having individually controllable elements substantially stationary in the X-Y plane and an optical element movable with respect thereto according to an embodiment of the invention.

FIG. 26 depicts a schematic side view layout of a portion of a lithographic apparatus having individually controllable elements substantially stationary in the X-Y plane and an optical element movable with respect thereto according to an embodiment of the invention. In this embodiment, an optical derotator is used to couple the individually controllable elements 102 that are substantially stationary in the X-Y plane to moving imaging lenses 242.

In this embodiment, the individually controllable elements 102, along with optional collimating lenses, are arranged in a ring. Two parabola mirrors 820, 822 reduce the ring of collimated beams from the individually controllable elements 102 to an acceptable diameter for the derotator 824. In FIG. 26 a pechan prism is used as a derotator 824. If the derotator rotates at half the speed compared to the speed of the imaging lenses 242, each individually controllable element 102 appears substantially stationary with respect to its respective imaging lens 242. Two further parabola mirrors 826, 828 expand the ring of derotated beams from derotator 824 to an acceptable diameter for the moving imaging lenses 242. The substrate moves in the X-direction.

In this embodiment, each individually controllable element 102 is paired to an imaging lens 242. Therefore, it may not be possible to mount the individually controllable elements 102 on concentric rings and thus, full coverage across of the width of the substrate may not be obtained. A duty cycle of about 33% is possible. In this embodiment, the imaging lenses 242 are lenses without the need to image field.

Figure 27:
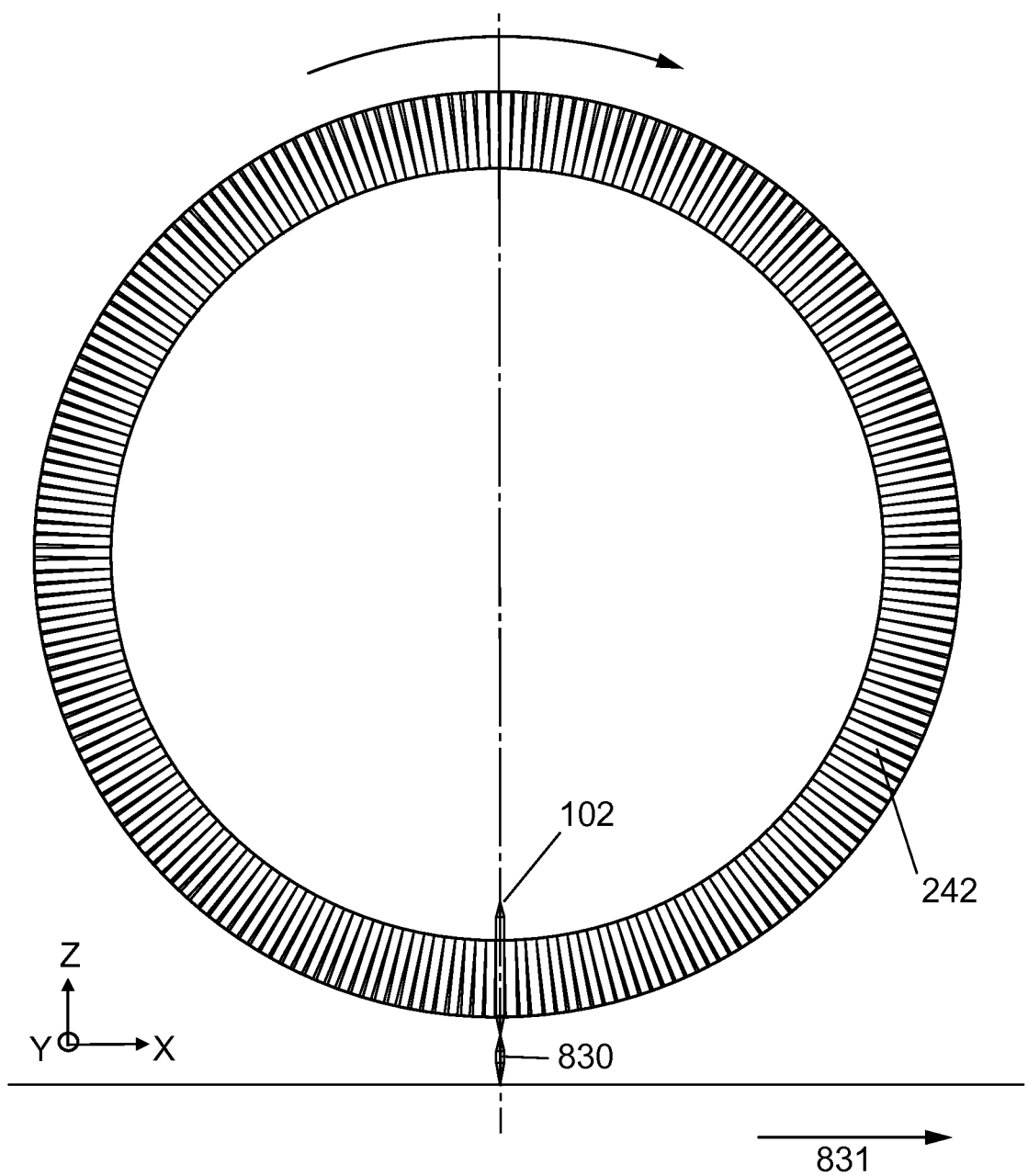
FIG. 27 depicts a schematic side view layout of a portion of a lithographic apparatus having individually controllable elements substantially stationary in the X-Y plane and an optical element movable with respect thereto according to an embodiment of the invention.

FIG. 27 depicts a schematic side view layout of a portion of a lithographic apparatus having individually controllable elements substantially stationary in the X-Y plane and an optical element movable with respect thereto according to an embodiment of the invention. In this arrangement, imaging lenses 242 are arranged to rotate around a direction extending in the X-Y plane (e.g., a rotating drum rather than a rotating wheel as described, for example, with respect to FIGS. 19-26). Referring to FIG. 27, movable imaging lenses 242 are arranged on a drum arranged to rotate around, for example, the Y-direction. Movable imaging lenses 242 receive radiation from individually controllable elements 102 extending in a line in the Y-direction between the axis of rotation of the drum and the movable imaging lenses 242. In principle, a line that would be written by the movable imaging lenses 242 of such a drum would be parallel to the scan direction 831 of the substrate. Accordingly, a derotator 830 mounted at 45° is arranged to rotate a line made by the movable imaging lenses 242 of the drum by 90° so that the imaged line is perpendicular to the scan direction of the substrate. The substrate moves in the X-direction.

For every stripe on the substrate, a circle of movable imaging lenses 242 would be needed on the drum. If one such circle can write a 3 mm width stripe on the substrate and the substrate is 300 mm wide, 700 (optics on the circumference of the drum)×100=70000 optical assemblies may be required on the drum. It could be less if cylindrical optics are used on the drum. Further, the imaging optics in this embodiment may need to image a certain field which may make the optics more complicated. A duty cycle of about 95% is possible. An advantage of this embodiment is that the imaged stripes can be of substantially equal length and be substantially parallel and straight. In this embodiment, it is relatively easy to focus locally with an element that does not move along or in conjunction with movable imaging lenses 242.

Figure 28:
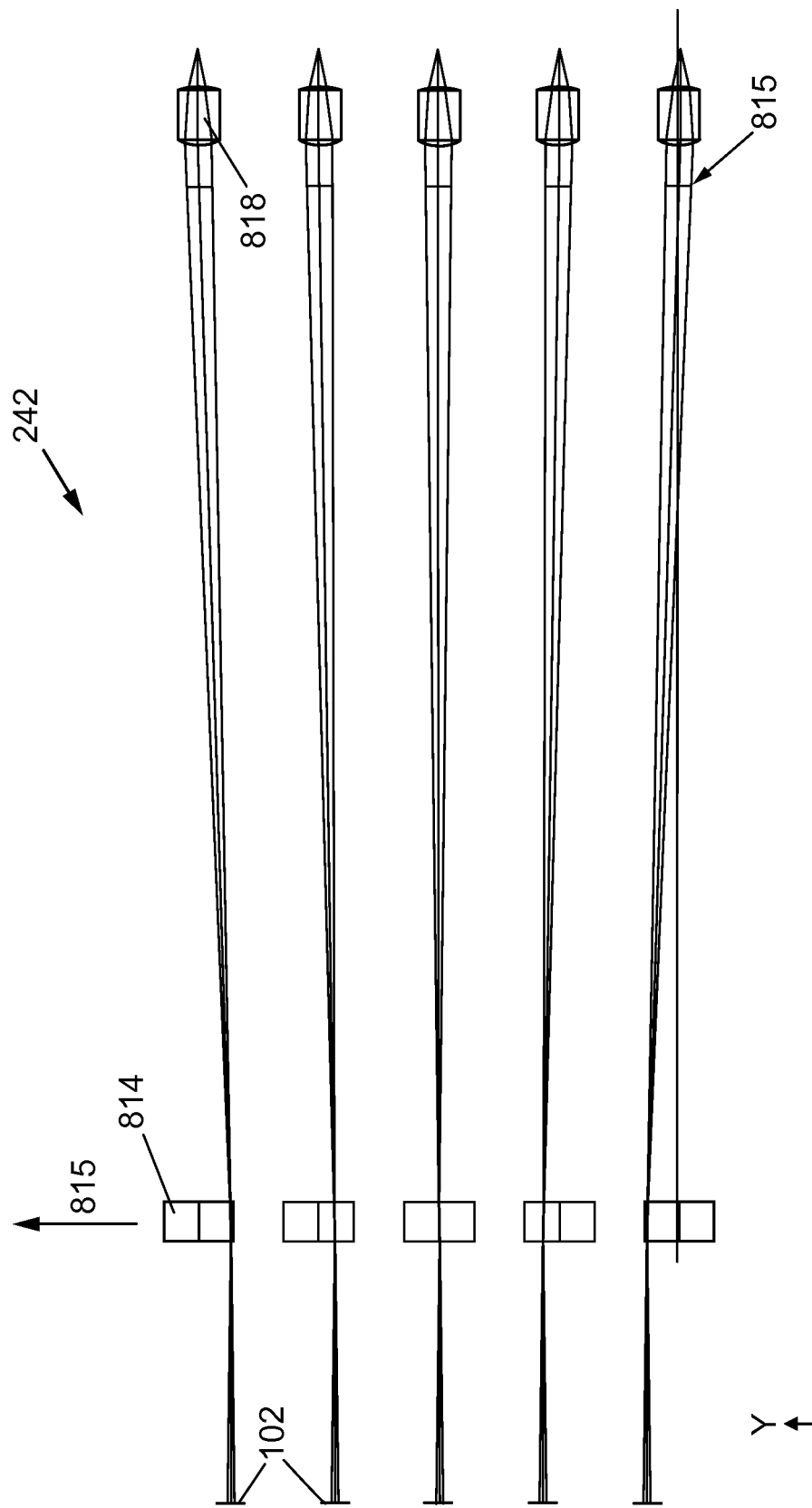
FIG. 28 depicts a schematic side view layout of a portion of a lithographic apparatus having individually controllable elements substantially stationary in the X-Y plane and an optical element movable with respect thereto according to an embodiment of the invention and showing five different rotation positions of an optical element 242 set with respect to an individually controllable element.

FIG. 28 depicts a schematic side view layout of a portion of a lithographic apparatus having individually controllable elements substantially stationary in the X-Y plane and an optical element movable with respect thereto according to an embodiment of the invention and showing five different rotation positions of an imaging lens 242 set with respect to an individually controllable element.

Referring to FIG. 28, an individually controllable element 102 is provided that is substantially stationary in the X-Y plane. The movable imaging lens 242 comprises a plurality of sets of lenses, each set of lenses comprising a field lens 814 and an imaging lens 818. The substrate moves in the X-direction.

The field lens 814 (e.g., a spherical lens) of movable imaging lens 242 moves relative to the individually controllable elements 102 in direction 815 (e.g., rotates about an axis where the imaging lenses 242 are arranged at least partially in a circular manner). The field lens 814 directs the beam toward imaging lens 818 (e.g., an aspherical lens such as a double aspherical surface lens) of the movable imaging lens 242. Like field lens 814, the imaging lens 818 moves relative to the individually controllable elements 102 (e.g., rotates about an axis where the imaging lenses 242 are arranged at least partially in a circular manner). In this embodiment, the field lens 814 moves at the substantially same speed as the imaging lens 818.

The focal plane of the field lens 814 coincides at location 815 with the back focal plane of the imaging lens 818 which gives a telecentric in/telecentric out system. Contrary to the arrangement of FIG. 23, the imaging lens 818 images a certain field. The focal length of the field lens 814 is such that the field size for the imaging lens 818 is smaller than 2 to 3 degrees half angle. In this case it is still possible to get diffraction limited imaging with one single element optics (e.g., a double aspherical surface single element). The field lenses 814 are arranged be mounted without spacing between the individual field lenses 814. In this case the duty cycle of the individually controllable elements 102 can be about 95%.

The focal length of the imaging lenses 818 is such that, with a NA of 0.2 at the substrate, these lenses will not become larger than the diameter of the field lenses 814. A focal length of the imaging lens 818 equal to the diameter of the field lens 814 will give a diameter of the imaging lens 818 that leaves enough space for mounting the imaging lens 818.

Due to the field angle, a slightly larger line than the pitch of the field lenses 814 can be written. This gives an overlap, also depending on the focal length of the imaging lens 818, between the imaged lines of neighboring individually controllable elements 102 on the substrate. Accordingly, the individually controllable elements 102 may be mounted on the same pitch as the imaging lenses 242 on one ring.

Figure 29:
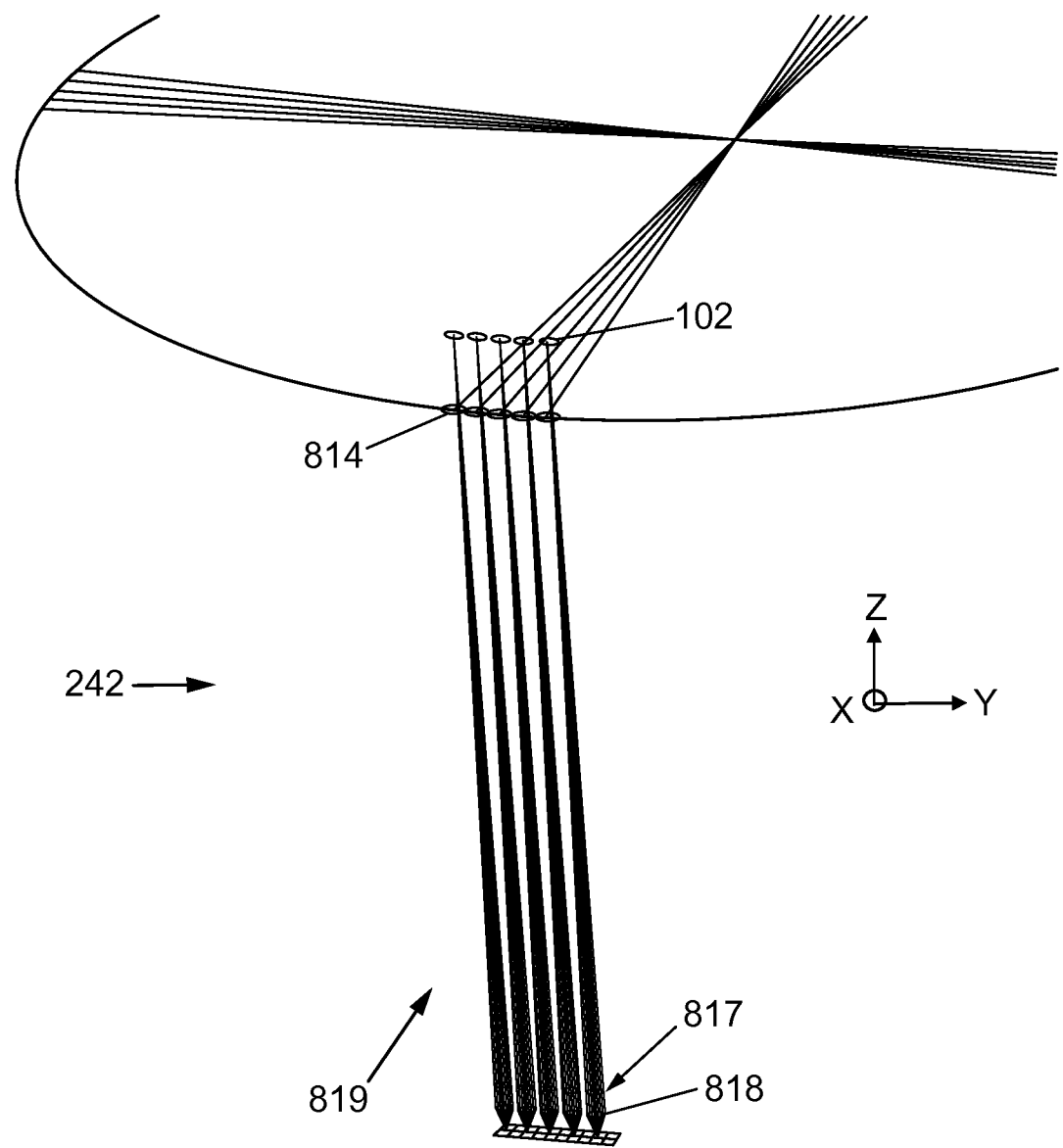
FIG. 29 depicts a schematic three-dimensional drawing of a portion of the lithographic apparatus of FIG. 28.

FIG. 29 depicts a schematic three-dimensional drawing of a portion of the lithographic apparatus of FIG. 28. In this depiction, 5 individually controllable elements 102 are depicted with 5 associated movable imaging lens sets 242. As will be apparent, further individually controllable elements 102 and associated movable imaging lens sets 242 may be provided. The substrate moves in the X-direction as shown by arrow 829. In an embodiment, the field lenses 814 are arranged without spacing between. A pupil plane is located at 817.

Figure 30:
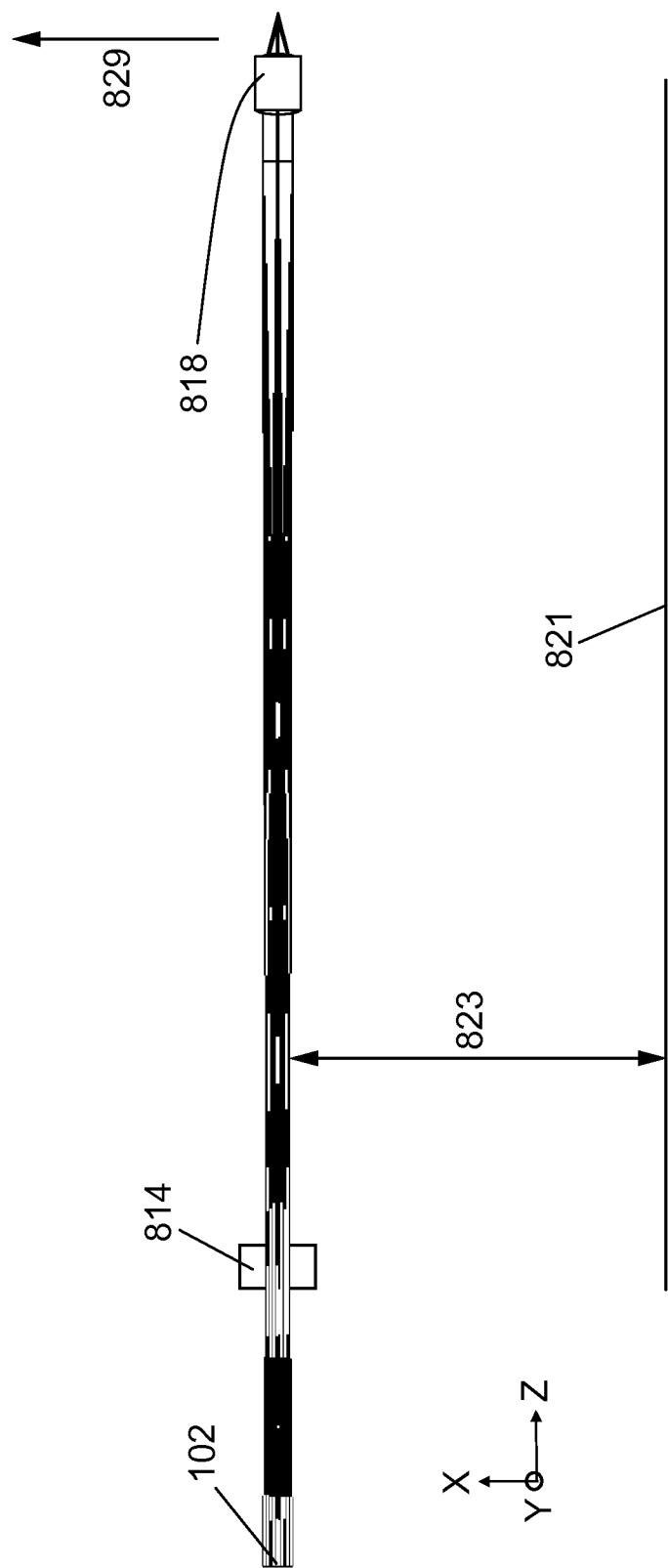
FIG. 30 depicts schematically an arrangement of 8 lines being written simultaneously by a single movable optical element 242 set of FIGS. 28 and 29.

To avoid relatively small double aspherical imaging lenses 818, reduce the amount of optics of the moving imaging lenses 242 and to use standard laser diodes as individually controllable elements 102, there is a possibility in this embodiment to image multiple individually controllable elements 102 with a single lens set of the movable imaging lenses 242. As long as an individually controllable element 102 is telecentrically imaged on the field lens 814 of each movable imaging lens 242, the corresponding imaging lens 818 will re-image the beam from the individually controllable element 102 telecentrically on the substrate. If, for example 8 lines are written simultaneously, the field lens 814 diameter and the focal distance of the imaging lens 818 can be increased by a factor 8 with the same throughput while the amount of movable imaging lenses 242 can be decreased by a factor 8. Further, the optics that are substantially stationary in the X-Y plane could be reduced since a part of the optics needed for imaging the individually controllable elements 102 on the field lenses 814 could be common. Such an arrangement of 8 lines being written simultaneously by a single movable imaging lens 242 set is schematically depicted in FIG. 30 with rotation axis 821 of the imaging lens 242 set and the radius 823 of the imaging lens 242 set from the rotation axis 821. Going from a pitch of 1.5 mm to 12 mm (when 8 lines are written simultaneously by a single movable imaging lens 242 set) leaves enough space for mounting standard laser diodes as individually controllable elements 102. In an embodiment, 224 individually controllable elements 102 (e.g., standard laser diodes) may be used. In an embodiment, 120 imaging lens 242 sets may be used. In an embodiment, 28 substantially stationary optics sets may be used with the 224 individually controllable elements 102.

Figure 31:
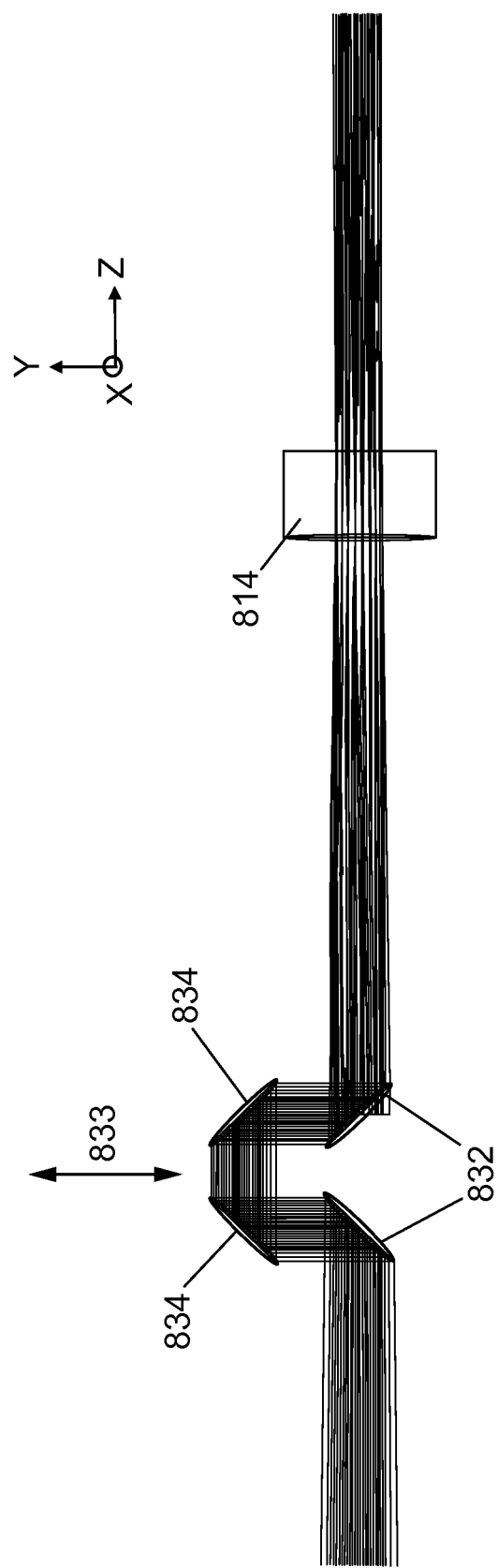
FIG. 31 depicts a schematic arrangement to control focus with a moving rooftop in the arrangement of FIGS. 28 and 29.

In this embodiment, it is also relatively easy to focus locally with an element that does not move along or in conjunction with movable imaging lenses 242. As long as the telecentric images of the individually controllable elements 102 on the field lens 814 are moved along the optical axis and kept telecentric, the focus of the images on the substrate will only change and the images will remain telecentric. FIG. 31 depicts a schematic arrangement to control focus with a moving rooftop in the arrangement of FIGS. 28 and 29. Two folding mirrors 832 with a rooftop (e.g., a prism or a mirror set) 834 are placed in the telecentric beams from the individually controllable elements 102 before the field lens 814. By moving the rooftop 834 away or towards the folding mirrors 832 in the direction 833, the image is shifted along the optical axis and therefore also with respect to the substrate. Because there is a large magnification along the optical axis since the axial focus change is equal to the quadratic ratio of the F/numbers, a 25 μm defocus at the substrate with a F/2.5 beam will give a focus shift at the field lens 814 with a f/37.5 beam of 5.625 mm $(37.5/2.5)^2$. This means that the rooftop 834 has to move half of that.

Figure 32:
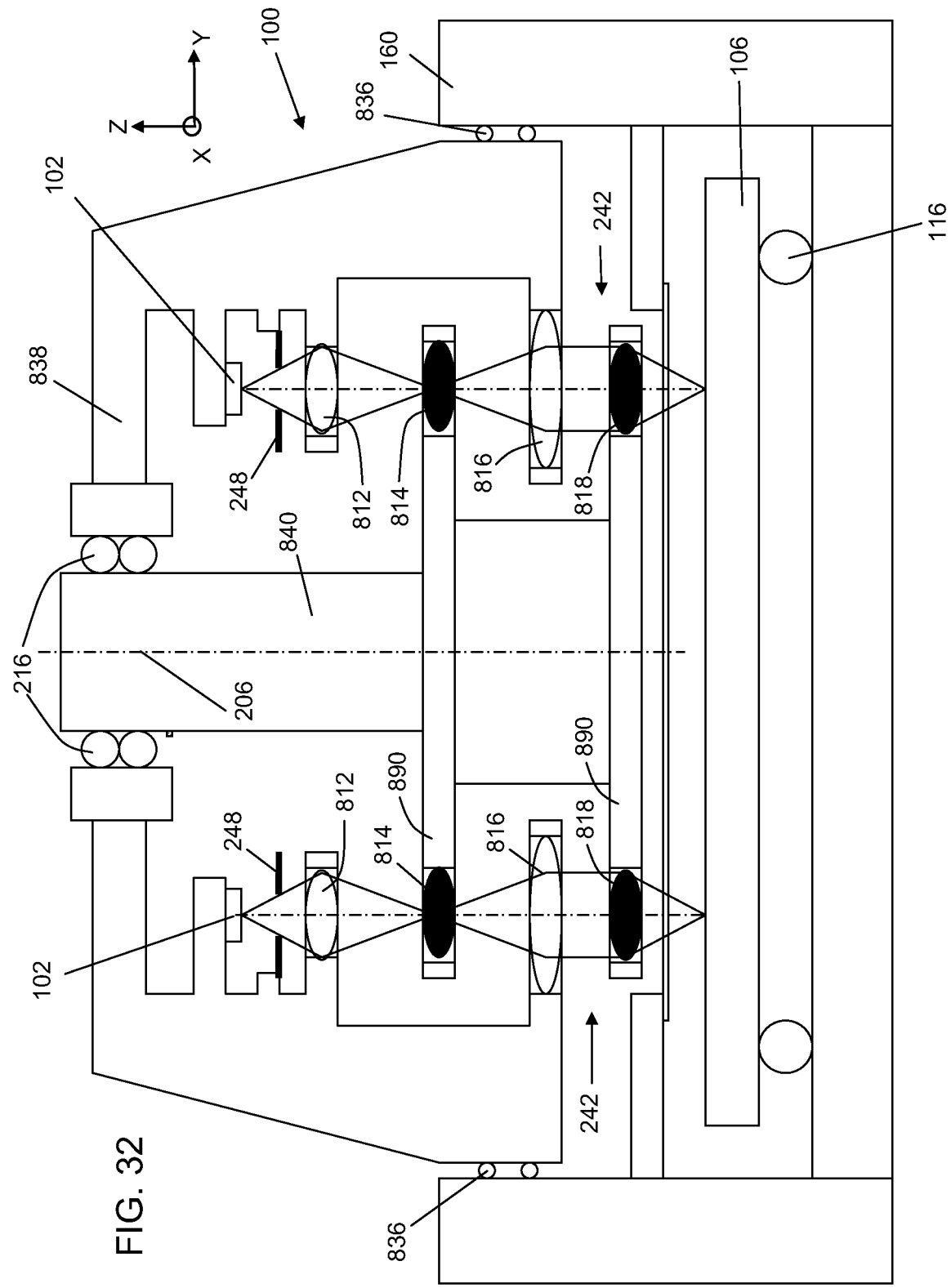
FIG. 32 depicts a schematic cross-sectional side view of a lithographic apparatus according to an embodiment of the invention having individually controllable elements substantially stationary in the X-Y plane and an optical element movable with respect thereto according to an embodiment of the invention.

FIG. 32 depicts a schematic cross-sectional side view of a lithographic apparatus according to an embodiment of the invention having individually controllable elements substantially stationary in the X-Y plane and an optical element movable with respect thereto according to an embodiment of the invention. While FIG. 32 depicts an arrangement similar to FIG. 23, it may be modified as appropriate to suit any of the embodiments of FIGS. 19-22 and/or FIGS. 24-31.

Referring to FIG. 32, the lithographic apparatus 100 comprises a substrate table 106 to hold a substrate, and a positioning device 116 to move the substrate table 106 in up to 6 degrees of freedom.

The lithographic apparatus 100 further comprises a plurality of individually controllable elements 102 arranged on a frame 160. In this embodiment, each of the individually controllable elements 102 is a radiation emitting diode, e.g., a laser diode, for instance a blue-violet laser diode. The individually controllable elements 102 are arranged on a frame 838 and extend along the Y-direction. While one frame 838 is shown, the lithographic apparatus may have a plurality of frames 838 as shown similarly as arrays 200 in, for example, FIG. 5. Further arranged on the frame 838 are lenses 812 and 816. Frame 838 and thus individually controllable elements 102 and lenses 812 and 816 are substantially stationary in the X-Y plane. Frame 838, individually controllable elements 102 and lenses 812 and 816 may be moved in the Z-direction by actuator 836.

In this embodiment, a frame 840 is provided that is rotatable. Arranged on the frame 840 are field lenses 814 and imaging lenses 818, wherein a combination of a field lens 814 and an imaging lens 818 forms a movable imaging lens 242. In use, the plate rotates about its own axis 206, for example, in the directions shown by the arrows in FIG. 5 with respect to arrays 200. The frame 840 is rotated about the axis 206 using motor 216. Further, the frame 840 may be moved in a Z direction by motor 216 so that the movable imaging lenses 242 may be displaced relative to the substrate table 106.

In this embodiment, an aperture structure 248 having an aperture therein may be located above lens 812 between the lens 812 and the associated individually controllable element 102. The aperture structure 248 can limit diffraction effects of the lens 812, the associated individually controllable element 102, and/or of adjacent lenses 812/individually controllable elements 102.

In an embodiment, the lithographic apparatus 100 comprises one or more movable plates 890 (e.g. a rotatable plate, for instance a rotatable disc) comprising optical elements, e.g. lenses. In the embodiment of FIG. 32, a plate 890 with field lenses 814 and a plate 890 with imaging lenses 818 is shown. In an embodiment, the lithographic apparatus is absent any reflective optical elements that rotate when in use. In an embodiment, the lithographic apparatus is absent any reflective optical elements, which receive radiation from any or all the individually controllable elements 102, that rotate when in use. In an embodiment, one or more (e.g. all) plates 890 are substantially flat, e.g. have no optical elements (or parts of optical elements) sticking out above or below one or more surfaces of the plate. This may be achieved, for instance, by ensuring the plate 890 is sufficiently thick (i.e. at least thicker than the height of the optical elements and positioning the optical elements such that they do not stick out) or by providing a flat cover plate over the plate 890 (not shown). Ensuring one or more surfaces of the plate is substantially flat may assist in, e.g., noise reduction when the apparatus is in use.

Figure 33:
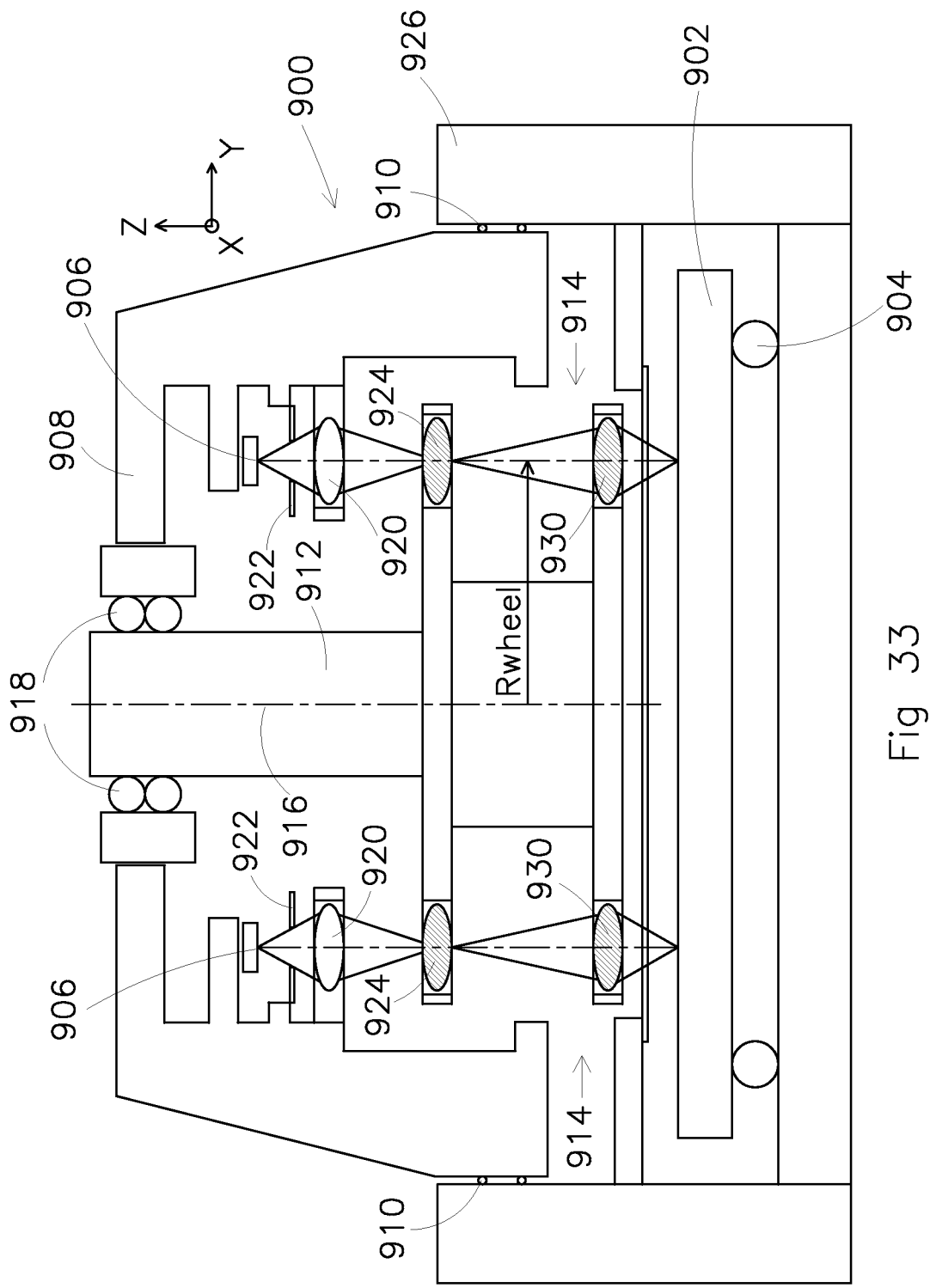
FIG. 33 depicts a part of a lithographic apparatus according to an embodiment of the invention.

FIG. 33 schematically depicts a schematic cross-sectional side view of a part of a lithographic apparatus. In an embodiment, the lithographic apparatus has individually controllable elements substantially stationary in the X-Y plane as described further below, however it need not be the case. The lithographic apparatus 900 comprises a substrate support 902 to hold a substrate, and a positioning device 904 to move the substrate support 902 in up to 6 degrees of freedom. The substrate may be a resist-coated substrate (e.g. a silicon wafer or a glass plate) or a flexible substrate (e.g., a foil).

The lithographic apparatus 900 further comprises a plurality of individually controllable self-emissive contrast devices 906 configured to emit a plurality of beams. In an embodiment, the self-emissive contrast device 906 is a radiation emitting diode, such as a light emitting diode (LED), an organic LED (OLED), a polymer LED (PLED), or a laser diode (e.g., a solid state laser diode). In an embodiment, each of the individually controllable elements 906 is a blue-violet laser diode (e.g., Sanyo model no. DL-3146-151). Such diodes may be supplied by companies such as Sanyo, Nichia, Osram, and Nitride. In an embodiment, the diode emits radiation having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 1-5 micrometers$^2$. In an embodiment, the laser diode has a divergence angle selected from the range of 7-44 degrees. In an embodiment, the diodes have a configuration (e.g., emission area, divergence angle, output power, etc.) to provide a total brightness more than or equal to about $6.4 \times 10^8$ W/(m$^2$·sr).

The self-emissive contrast devices 906 are arranged on a frame 908 and may extend along the Y-direction and/or the X direction. While one frame 908 is shown, the lithographic apparatus may have a plurality of frames 908. Further arranged on the frame 908 is lens 920. Frame 908 and thus self-emissive contrast device 906 and lens 920 are substantially stationary in the X-Y plane. Frame 908, self-emissive contrast devices 906 and lens 920 may be moved in the Z-direction by actuator 910. Alternatively or additionally, lens 920 may be moved in the Z-direction by an actuator related to the particular lens 920. Optionally, each lens 920 may be provided with an actuator.

The self-emissive contrast device 906 may be configured to emit a beam and the projection system 920, 924 and 930 may be configured to project the beam onto a target portion of the substrate. The self-emissive contrast device 906 and the projection system form an optical column. The lithographic apparatus 900 may comprise an actuator (e.g. motor 918) to move the optical column or a part thereof with respect to the substrate. Frame 912 with arranged thereon field lens 924 and imaging lens 930 may be rotatable with the actuator. A combination of field lens 924 and imaging lens 930 forms movable optics 914. In use, the frame 912 rotates about its own axis 916, for example, in the directions shown by the arrows in FIG. 34. The frame 912 is rotated about the axis 916 using an actuator e.g. motor 918. Further, the frame 912 may be moved in a Z direction by motor 910 so that the movable optics 914 may be displaced relative to the substrate support 902.

An aperture structure 922 having an aperture therein may be located above lens 920 between the lens 920 and the self-emissive contrast device 906. The aperture structure 922 can limit diffraction effects of the lens 920, the associated self-emissive contrast device 906, and/or of an adjacent lens 920/self-emissive contrast device 906. In FIG. 33 two optical columns are shown at opposite sides of the lithographic apparatus. In practice, the lithographic apparatus may comprise more than two optical columns distributed over, e.g., a periphery of the lithographic apparatus. Each optical column includes one or more self-emissive contrast devices 906 and a stationary part of the projection system 920. The rotatable part of an optical column, including lenses 924, 930, may be used with respect to a plurality of optical columns, e.g., when frame 912 is rotated.

The depicted apparatus may be used by rotating the frame 912 and simultaneously moving the substrate on the substrate support 902 underneath the optical column. The self-emissive contrast device 906 can emit a beam through the lenses 920, 924, and 930 when the lenses are substantially aligned with each other. By moving the lenses 924 and 930, the image of the beam on the substrate is scanned over a portion of the substrate. By simultaneously moving the substrate on the substrate table 902 underneath the optical column, the portion of the substrate which is subjected to an image of the self-emissive contrast device 906 is also moving. By switching the self-emissive contrast device 906 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 906, and controlling the speed of the substrate, a desired pattern can be imaged in the resist layer on the substrate.

Figure 34:
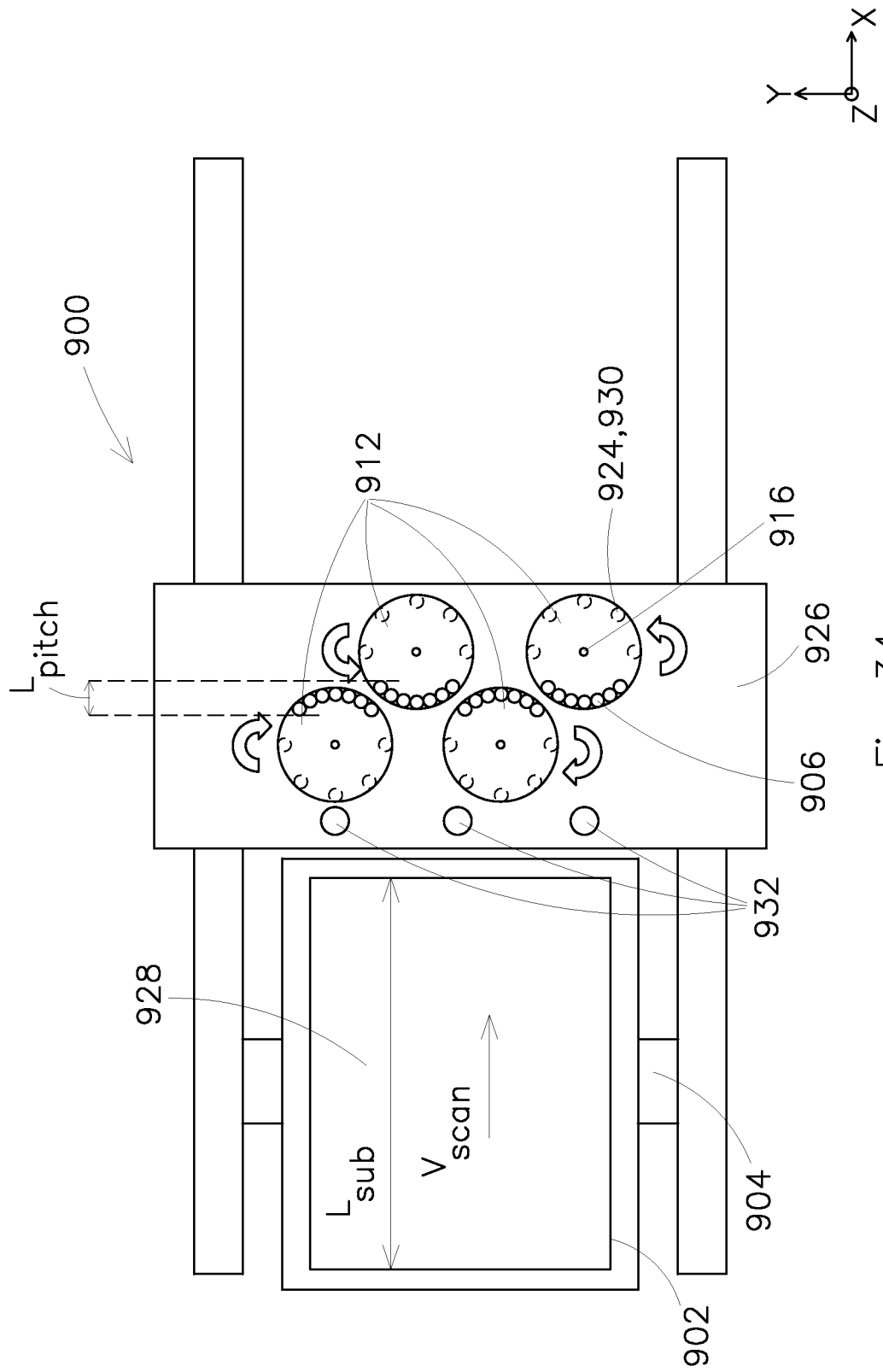
FIG. 34 depicts a top view of the lithographic apparatus of FIG. 33 according to an embodiment of the invention.

FIG. 34 depicts a schematic top view of the lithographic apparatus of FIG. 33 having self-emissive contrast devices 906. Like the lithographic apparatus 900 shown in FIG. 33, the lithographic apparatus 900 comprises a substrate support 902 to hold a substrate 928, a positioning device 904 to move the substrate support 902 in up to 6 degrees of freedom, an alignment/level sensor 932 to determine alignment between the self-emissive contrast device 906 and the substrate 928, and to determine whether the substrate 928 is at level with respect to the projection of the self-emissive contrast device 906. As depicted the substrate 928 has a rectangular shape, however round shape substrates may be processed.

The self-emissive contrast device 906 is arranged on a frame 926. The self-emissive contrast device 906 may be a radiation emitting diode, e.g., a laser diode, for instance a blue-violet laser diode. As shown in FIG. 34, the contrast devices 906 may be arranged as an array extending in the X-Y plane, one or more contrast devices 906 being associated with each optical column. The array may be an elongate line. In an embodiment, the array may be a single dimensional array of self-emissive contrast devices 906. In an embodiment, the array may be a two dimensional array of self-emissive contrast devices 906. The contrast devices 906 are divided over four lithographic wheels as shown in FIG. 34. Each lithographic wheel includes a number of optical columns mounted on a stationary frame 908 and a rotatable frame 912. Within a lithographic wheel, the optical columns may share a part of the optical column mounted on the rotatable frame 912, such as lenses 924, 930, i.e. when the frame is rotated the lenses 924, 930 may subsequently be used by different optical columns of the lithographic wheel.

A rotatable frame 912 may be provided which may be rotating in a direction depicted by the respective arrow. The rotatable frame may be provided with lenses 924, 930 (shown in FIG. 33) to provide an image of each of the self-emissive contrast devices 906. In this application, the terms "radial" and "tangential" are used in relation with the rotatable frame 912 and its longitudinal axis 916. The apparatus may be provided with an actuator to rotate the rotatable frame 912, and therewith the rotary part of the optical column including the lenses 924, 930.

The lithographic apparatus is part of a production process in which, for instance, flat panel displays or chips are manufactured. To streamline the production process it is desirable that the production time of the lithographic apparatus, i.e. the time to create a pattern on the whole surface of the substrate, is optimized. In many production processes the production time in a single stage of the production process is limited to a time period, for example 60 seconds. In this time period, a pattern with the desired resolution has to be provided on the complete substrate.

During the creation of the pattern the substrate is desirably moved with a substantially constant scanning speed vscan in a scanning direction. To move the substrate at a substantially constant speed, time is required to accelerate and to decelerate the substrate. To minimize the time for acceleration and deceleration, the whole substrate is desirably exposed to a beam creating a pattern in a single scanning movement of the substrate.

Therefore, the substrate may be divided in the direction perpendicular to the scanning direction in a number of strips 934, each strip being associated with its own optical column, each optical column comprising a number of self-emissive contrast devices 906 and a stationary part of the projection system 920. The rotatable part of the optical column, including lenses 924, 930, may be used with respect to other strips 934 covered by the rotatable frame 912. Each strip is divided in the scanning direction in a number of adjacent and partially overlapping target portions 936. During the scanning movement of the substrate the target portions 936 of a single strip 934 are subsequently exposed to beams of the self-emissive contrast devices 906 of the associated optical column. Desirably, for all strips in the direction perpendicular to the scanning direction, an optical column is provided so that a pattern can be created on the substrate by a single scan.

Figure 35:
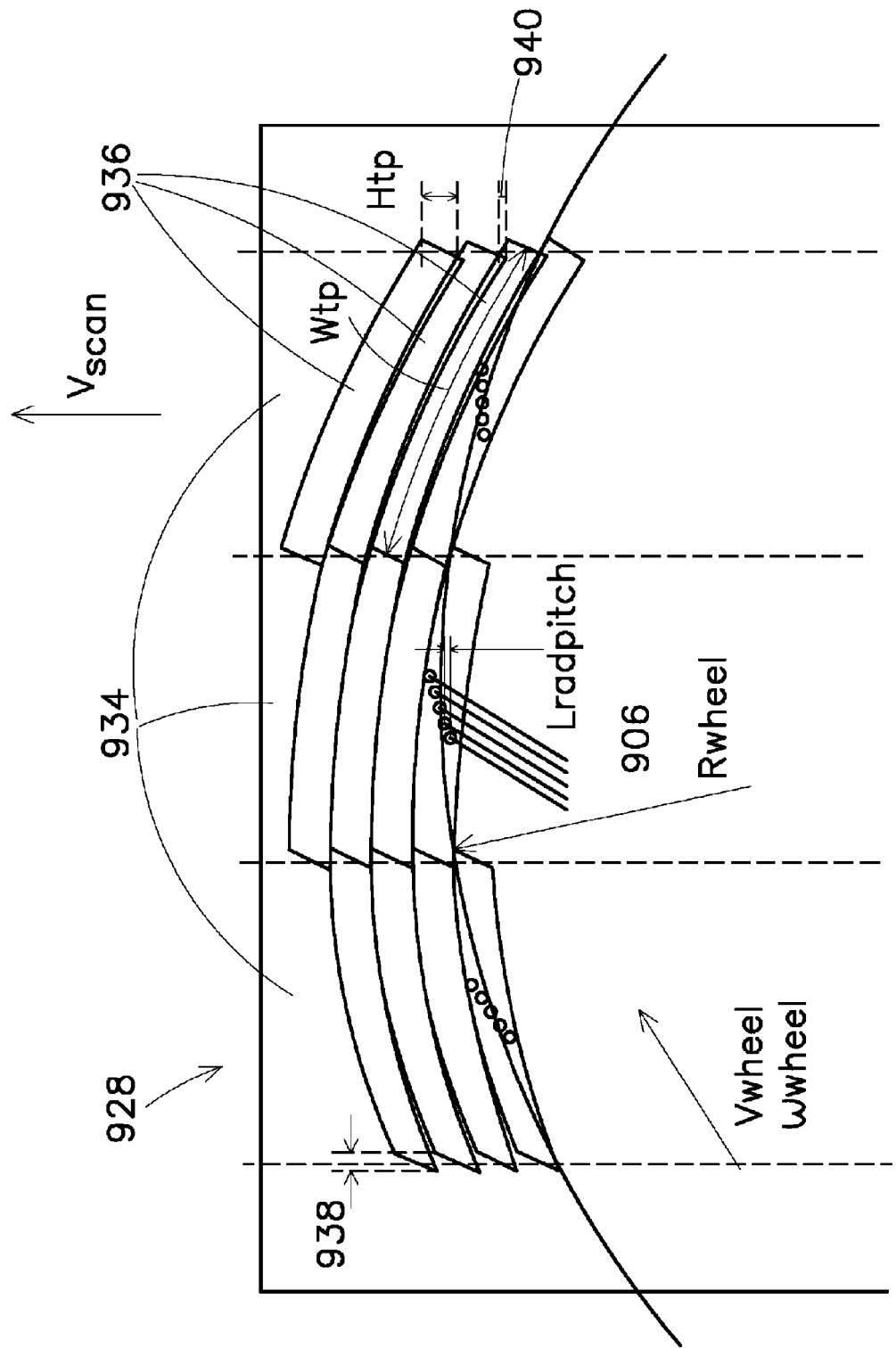
FIG. 35 depicts schematically a number of target portions projected or to be projected on a substrate according to an embodiment of the invention.

FIG. 35 depicts schematically a number of target portions 936 projected or to be projected on a substrate 928. The circumference of the rotatable frame 912 is schematically shown. In the direction perpendicular to the scanning direction indicated by scanning speed Vscan, the substrate is divided in a number of strips 934, each strip 934 being associated with an optical column, or at least the stationary part thereof. On these strips 934 a number of target portions 936 are indicated. The target portions 936 have an overlap 938 with adjacent target portions 936 of adjacent strips 934 and an overlap 940 with adjacent target portions 936 within the same strip 934. This overlap may be required to obtain a reliable pattern over the whole substrate surface.

A part of the projection system of each optical column, including lenses 924, 930 is mounted on the rotatable frame 912. In practice, multiple lenses 924, 930 will be divided over the circumference of the rotatable frame 912, and adjacent lenses 924, 930 on the circumference are desirably located close to each other. During projection, the rotatable frame 912 will rotate and for each target portion a different set of lenses 924, 930 may be used for projection of a pattern. Thus, each strip 934 is in particular associated with one or more self-emissive contrast devices 906 and the parts of the projection system mounted on the stationary frame 926, while the lenses 924, 930 are used by more, desirably all self-emissive contrast devices 906, during projection of a pattern on the different target portions 936 associated with the respective rotatable frame 912.

The time required for the single scanning movement is referred to as the exposure time Texp. The substrate has a length Lsub and a width. Assuming the substrate is arranged in the lithographic apparatus such that the length of the substrate is in the same direction as the scanning direction, the exposure time Texp of the substrate is at least the length of the substrate Lsub divided by the scanning speed vscan.

However, since not all optical columns have to be arranged at the same position in the scanning direction (see FIG. 34), there will be extra time required for the substrate to move from the first optical column to the last optical column in the scanning direction. This distance is referred to as the pitch length Lpitch (shown in FIG. 34). The exposure time Texp substantially corresponds to the sum of the length of the substrate Lsub plus the pitch length Lpitch divided by the scan speed vscan. Thus, $$T\exp = \frac{Lsub + Lpitch}{v_{scan}}$$

The time required for exposure of a beam on a target portion 936 equals to the height Htp of the target portion in the scanning direction, divided by the scanning speed vscan. During this time the beam will run over the width Wtp of the target portion with a rotation speed Vwheel at the location of the lenses 924, 930. This rotation speed is determined by 2 times pi multiplied by the radius Rwheel of the lenses 924, 930 on the rotatable frame 912, i.e. the radius of the central axis of the optical column, multiplied by the rotary frequency ωwheel of the wheel.

It is desirable to have multiple self-emissive contrast devices per optical column so that the relative overlap of adjacent target portions in the scanning direction is not too large. At the same time the number of self-emissive contrast devices per column is practically limited by the size and complexity of the lens system required for an increasing number of self-emissive contrast devices within an optical column.

The height Htp of the target portion is mainly determined by the number of self-emissive contrast devices per optical column, the radial pitch between the self-emissive contrast devices within an optical column, and the spot width of the outer self-emissive contrast devices at the image plane.

The radial pitch, Lradpitch, at the projection image plane on the substrate, is selected from the range of 50% to 95%, in the range of 70% to 90%, or in the range of 75% to 85% of a projection resolution of the lithographic apparatus. In earlier lithographic systems, it was believed that the radial pitch should be chosen substantially equal to the projection resolution. Unexpectedly, a radial pitch between the self-emissive contrast devices of an optical column which is in these ranges has a large effect on the resulting quality. With a radial pitch within the above indicated ranges the desired resolution can be obtained more reliably.

The projection resolution of the lithographic apparatus is smaller than or equal to 10 μm, smaller than or equal to 5 μm, or smaller than or equal to 2 μm. In an embodiment, the projection resolution is about 1 μm, and the radial pitch Lradpitch is about 0.8 μm.

When it is desired to create a pattern on a larger substrate having a larger substrate length Lsub within the same exposure time Texp or when it is desired to increase the resolution within the same exposure time Texp, a number of the above described parameters of the lithographic apparatus can be adapted to fulfill such a requirement.

Generally, it will be desirable to decrease the relative exposure time, i.e. the exposure time divided by the substrate length. Decrease of the relative exposure time means that more substrate length can be processed in the same process time.

For instance, the number of self-emissive contrast devices per optical column can be increased. This has an advantage that the overlap between adjacent target portions in the scanning direction may become smaller, but also that the height of the target portion Htp becomes larger. Practically, an increase in the number of self-emissive contrast devices to a larger number, for instance more than 20, results in a relatively large and complex lens system for each optical column.

The number of self-emissive contrast devices per optical column is desirably in the range of 2 to 40 diodes per optical column, in the range of 5 to 20 diodes per optical column, or in the range of 8 to 15 diodes per optical column.

Increasing the radial pitch between the self-emissive contrast devices within an optical column will also result in an increase of the height Htp of the target portion. This has a positive decreasing effect on the exposure time. However, the radial pitch also relates to the projection resolution of the pattern projected on the substrate. Therefore, the radial pitch will usually not be increased to decrease the relative exposure time.

Increasing the diameter of the rotatable frame 912 or increasing the rotating frequency ωwheel will also result in a decrease in the relative exposure time. However, an increase of these parameters results in a relatively large rotation speed at the circumference of the rotatable frame 912, in particular at the lenses 924, 930. Such large rotation speed vwheel may result in turbulence or heat generation at the lenses 924, 930 which may have a substantial negative effect on the projection quality of the projection system. Thus, the maximum size of the rotatable frame 912 is limited by the dimensions of the lithographic apparatus itself. An increase of the diameter of the rotatable frame 912 may lead to an increase of the distance between the optical columns of different rotatable frames 912 in the scanning direction, resulting in a counter effect on the relative exposure time.

The rotating frequency ωwheel of the rotatable frame 912 lies desirably in the range of 2500 to 10000 rpm, in the range of 4000 to 6000 rpm, or in the range of 4500 to 5000 rpm, while the radius Rwheel of the lenses 924, 930, i.e. the location, in particular the central axis, of the optical column on the rotatable frame 912, is desirably in the range of 50 to 500 mm, in the range of 100 to 350 mm, or in the range of 200 to 250 mm.

The resulting rotation speed Vwheel of the lenses 924, 930 is desirably in the range of 25 to 400 m/s, in the range of 50 to 200 m/s, or in the range of 75 to 140 m/s.

Another method to decrease the relative exposure time is to decrease the width of a strip 934, and therewith the width of a target portion Wtp in the tangential direction. However, decrease of the strip width will also require more optical columns since there will be more strips in the direction perpendicular to the scanning direction. Practically, it will be desirable that the number of optical columns be limited.

The width of a target portion Wtp is desirably in the range of 5 to 40 mm, in the range of 8 to 20 mm, or in the range of 10 to 15 mm.

Each optical column desirably comprises in the range of 10 to 100 stationary optical column parts, in the range of 20 to 50 stationary optical column parts, or in the range of 25 to 30 stationary optical column parts.

Each rotatable frame 912 desirably comprises in the range of 25 to 400 lenses 924, 930 divided over the circumference of the rotatable frame 912, in the range of 50 to 200 lenses 924, 930 divided over the circumference of the rotatable frame 912, or in the range of 80 to 110 lenses 924, 930 divided over the circumference of the rotatable frame 912. The lenses 924, 930 are desirably arranged directly adjacent to each other.

In order to obtain a small relative exposure time, it is desirable to keep the distance Lpitch between the optical columns in the scanning direction as small as possible so that the scanning length, i.e. the substrate length Lsub plus the pitch length Lpitch, is kept as small as possible.

When it is desired to increase the projection resolution, the radial pitch between the self-emissive contrast devices within an optical column may be decreased. However, this will lead, without further measurements, to a smaller height of the target portion Htp, and thus to a larger relative exposure time.

As described above, the relative exposure time can be decreased by increasing the number of self-emissive contrast devices per optical column, increasing the diameter of the rotatable frame 912, increasing the rotating frequency ωwheel of the rotatable frame 912, and/or decreasing the width Wtp of a target portion to compensate for the decrease in relative exposure time due to the smaller projection resolution.

Embodiments are also provided below in numbered clauses:

1. A lithographic apparatus comprising:
    a substrate holder constructed to hold a substrate;
    a modulator configured to expose an exposure area of the substrate to a plurality of beams modulated according to a desired pattern; and
    a projection system configured to project the modulated beams onto the substrate and comprising an array of lenses to receive the plurality of beams, the projection system configured to move the array of lenses with respect to the modulator during exposure of the exposure area.
2. The lithographic apparatus of embodiment 1, wherein each lens comprises at least two lenses arranged along a beam path of at least one of the plurality of beams from the modulator to the substrate.
3. The lithographic apparatus of embodiment 2, wherein a first lens of the at least two lenses comprises a field lens and a second lens of the at least two lenses comprises an imaging lens.
4. The lithographic apparatus of embodiment 3, wherein the focal plane of the field lens coincides with the back focal plane of the imaging lens.
5. The lithographic apparatus of embodiment 3 or embodiment 4, wherein the imaging lens comprises a double aspherical surface lens.
6. The lithographic apparatus of any one of embodiments 3-5, wherein the focal length of the field lens is such that the field size for the imaging lens is smaller than 2 to 3 degrees half angle.
7. The lithographic apparatus of any one of embodiments 3-6, wherein the focal length of the imaging lens is such that, with a NA of 0.2 at the substrate, the imaging lens does not become larger than the diameter of the field lens.
8. The lithographic apparatus of embodiment 7, wherein the focal length of the imaging lens is equal to the diameter of the field lens.
9. The lithographic apparatus of any one of embodiments 3-8, wherein a plurality of the beams are imaged with a single combination of the field lens and the imaging lens.
10. The lithographic apparatus of any one of embodiments 3-9, further comprising a focus control device arranged along a beam path of at least one of the plurality of beams from the modulator to the field lens.
11. The lithographic apparatus of embodiment 10, wherein the focus control device comprises a folding mirror and a movable rooftop.
12. The lithographic apparatus of embodiment 3, further comprising a lens in the path to collimate the beam from the first lens to the second lens.
13. The lithographic apparatus of embodiment 12, wherein the lens in the path to collimate the beam is substantially stationary relative to the modulator.
14. The lithographic apparatus of any one of embodiments 3, 12 or 13, further comprising a lens in the path between the modulator and the first lens, to focus at least one of the plurality of beams toward the first lens.
15. The lithographic apparatus of embodiment 14, wherein the lens in the path to focus the beam is substantially stationary relative to the modulator.
16. The lithographic apparatus of any one of embodiments 3 or 12-15, wherein the optical axis of the field lens coincides with the optical axis of the imaging lens.
17. The lithographic apparatus of embodiment 2, wherein a first lens of the at least two lenses comprises at least two sub-lenses, wherein at least one of the plurality of beams is focused intermediate the two sub-lenses.
18. The lithographic apparatus of embodiment 17, wherein each of the at least two sub-lenses has a substantially equal focal length.
19. The lithographic apparatus of any one of embodiments 2, 17 or 18, wherein the first lens is arranged to output a collimated beam toward a second lens of the at least two lenses.
20. The lithographic apparatus of any one of embodiments 2 or 17-19, configured to move a first lens of the at least two lenses at a different speed than a second lens of the at least two lenses.
21. The lithographic apparatus of embodiment 20, wherein the speed of the second lens is twice that of the first lens.
22. The lithographic apparatus of embodiment 1, wherein each lens comprises a 4f telecentric in/telecentric out imaging system.
23. The lithographic apparatus of embodiment 22, wherein the 4f telecentric in/telecentric out imaging system comprises at least 6 lenses.
24. The lithographic apparatus of embodiment 1, further comprising a derotator between the modulator and the array of lenses.
25. The lithographic apparatus of embodiment 24, wherein the derotator comprises a pechan prism.
26. The lithographic apparatus of embodiment 24 or embodiment 25, wherein the derotator is arranged to move at half the speed of the array of lenses.
27. The lithographic apparatus of any one of embodiments 24-26, further comprising a parabola mirror to reduce the size of the beams between the modulator and the derotator.
28. The lithographic apparatus of any one of embodiments 24-27, further comprising a parabola mirror to increase the size of the beams between the derotator and the array of lenses.
29. The lithographic apparatus of any one of embodiments 1-28, wherein the array of lenses are rotated with respect to the modulator.
30. The lithographic apparatus of any one of embodiments 1-29, wherein the modulator comprises a plurality of individually controllable radiation sources to emit electromagnetic radiation.
31. The lithographic apparatus of any one of embodiments 1-29, wherein the modulator comprises a micromirror array.
32. The lithographic apparatus of any one of embodiments 1-29, wherein the modulator comprises a radiation source and an acoustic-optical modulator.
33. A device manufacturing method comprising:
    providing a plurality of beams modulated according to a desired pattern; and
    projecting the plurality of beams onto a substrate using an array of lenses that receive the plurality of beams; and
    moving the array of lenses with respect to the beams during the projecting.

34. The method of embodiment 33, wherein each lens comprises at least two lenses arranged along a beam path of at least one of the plurality of beams from a source of the at least one beam to the substrate.

35. The method of embodiment 34, wherein a first lens of the at least two lenses comprises a field lens and a second lens of the at least two lenses comprises an imaging lens.

36. The method of embodiment 35, wherein the focal plane of the field lens coincides with the back focal plane of the imaging lens.

37. The method of embodiment 35 or embodiment 36, wherein the imaging lens comprises a double aspherical surface lens.

38. The method of any one of embodiments 35-37, wherein the focal length of the field lens is such that the field size for the imaging lens is smaller than 2 to 3 degrees half angle.

39. The method of any one of embodiments 35-38, wherein the focal length of the imaging lens is such that, with a NA of 0.2 at the substrate, the imaging lens does not become larger than the diameter of the field lens.

40. The method of embodiment 39, wherein the focal length of the imaging lens is equal to the diameter of the field lens.

41. The method of any one of embodiments 35-40, wherein a plurality of the beams are imaged with a single combination of the field lens and the imaging lens.

42. The method of any one of embodiments 35-41, further comprising using a focus control device between a source of at least one of the plurality of beams and the field lens.

43. The method of embodiment 42, wherein the focus control device comprises a folding mirror and a movable rooftop.

44. The method of embodiment 35, further comprising collimating the at least one beam between the first lens and the second lens using a lens.

45. The method of embodiment 44, wherein the lens to collimate the at least one beam is substantially stationary relative to the at least one beam.

46. The method of any one of embodiments 35, 44 or 45, further comprising focusing at least one of the plurality of beams toward the first lens using a lens in the path between a source of the at least one beam and the first lens.

47. The method of embodiment 46, wherein the lens to focus the at least one beam is substantially stationary relative to the at least one beam.

48. The method of any one of embodiments 35 or 44-47, wherein the optical axis of the field lens coincides with the optical axis of the corresponding imaging lens.

49. The method of embodiment 34, wherein a first lens of the at least two lenses comprises at least two sub-lenses, wherein at least one of the plurality of beams is focused intermediate the two sub-lenses.

50. The method of embodiment 49, wherein each of the at least two sub-lenses has a substantially equal focal length.

51. The method of any one of embodiments 34, 49 or 50, wherein the first lens is arranged to output a collimated beam toward a second lens of the at least two lenses.

52. The method of any one of embodiments 34 or 49-51, comprising moving a first lens of the at least two lenses at a different speed than a second lens of the at least two lenses.

53. The method of embodiment 52, wherein the speed of the second lens is twice that of the first lens.

54. The method of embodiment 33, wherein each lens comprises a 4f telecentric in/telecentric out imaging system.

55. The method of embodiment 54, wherein the 4f telecentric in/telecentric out imaging system comprises at least 6 lenses.

56. The method of embodiment 33, further comprising derotating the beams using a derotator between a source of the beams and the array of lenses.

57. The method of embodiment 56, wherein the derotator comprises a pechan prism.

58. The method of embodiment 56 or embodiment 57, comprising moving the derotator at half the speed of the array of lenses.

59. The method of any one of embodiments 56-58, further comprising reducing the size of the beams between a source of the beam and the derotator using a parabola mirror.

60. The method of any one of embodiments 56-59, further comprising increasing the size of the beams between the derotator and the array of lenses using a parabola mirror.

61. The method of any one of embodiments 33-60, comprising rotating the array of lenses with respect to the beams.

62. The method of any one of embodiments 33-61, wherein each of a plurality of individually controllable radiation sources emit each of the plurality of beams.

63. The method of any one of embodiments 33-61, wherein a micromirror array emits the plurality of beams.

64. The method of any one of embodiments 33-61, wherein a radiation source and an acoustic-optical modulator produce the plurality of beams.

65. A lithographic apparatus comprising:
a substrate holder constructed to hold a substrate;
a modulator, comprising a plurality of individually controllable radiation sources to emit electromagnetic radiation, configured to expose an exposure area of the substrate to a plurality of beams modulated according to a desired pattern; and
a projection system configured to project the modulated beams onto the substrate and comprising an array of lenses to receive the plurality of beams, the projection system configured to move the array of lenses with respect to the individually controllable radiation sources during exposure of the exposure area.

66. A device manufacturing method comprising:
providing a plurality of beams modulated according to a desired pattern using a plurality of individually controllable radiation sources; and
projecting the plurality of beams onto a substrate using an array of lenses that receive the plurality of beams; and
moving the array of lenses with respect to the individually controllable radiation sources during the projecting.

67. A lithographic apparatus comprising:
a substrate holder constructed to hold a substrate;
a modulator configured to expose an exposure area of the substrate to a plurality of beams modulated according to a desired pattern; and
a projection system configured to project the modulated beams onto the substrate and comprising a plurality of arrays of lenses to receive the plurality of beams, each of the arrays separately arranged along the beam path of the plurality of beams.

68. The lithographic apparatus of embodiment 67, wherein the projection system is configured to move the arrays of lenses with respect to the modulator during exposure of the exposure area.

69. The lithographic apparatus of embodiment 67 or embodiment 68, wherein the lenses of each array are arranged in a single body.

70. A lithographic apparatus comprising:
a substrate holder constructed to hold a substrate;
a modulator, comprising a plurality of individually controllable radiation sources to emit electromagnetic radiation, configured to expose an exposure area of the substrate to a plurality of beams modulated according to a desired pattern, and configured to move the plurality of radiation sources with respect to the exposure area during exposure of the exposure area such that only less than all of the plurality of radiation sources can expose the exposure area at any one time; and a projection system configured to project the modulated beams onto the substrate.

71. A lithographic apparatus comprising:

a plurality of individually controllable radiation sources configured to provide a plurality of beams modulated according to a desired pattern, at least one radiation source of the plurality of radiation sources movable between a location where it emits radiation and a location where it does not;

a substrate holder constructed to hold a substrate; and a projection system configured to project the modulated beams onto the substrate.

72. A lithographic apparatus comprising:

a substrate holder constructed to hold a substrate;

a modulator, comprising a plurality of individually controllable radiation sources to emit electromagnetic radiation, configured to expose an exposure area of the substrate to a plurality of beams modulated according to a desired pattern, and configured to move at least one radiation source of the plurality of radiation sources with respect to the exposure area during exposure of the exposure area such that radiation from the at least one radiation source at the same time abuts or overlaps radiation from at least one other radiation source of the plurality of radiation sources; and a projection system configured to project the modulated beams onto the substrate.

73. A lithographic apparatus comprising:

a substrate holder constructed to hold a substrate;

a plurality of individually controllable radiation sources configured to provide a plurality of beams modulated according to a desired pattern to an exposure area of the substrate, at least one radiation source of the plurality of radiation sources movable between a location where it can emit radiation to the exposure area and a location where it can not emit radiation to the exposure area; and a projection system configured to project the modulated beams onto the substrate.

74. A lithographic apparatus comprising:

a substrate holder constructed to hold a substrate;

a modulator, comprising a plurality of individually controllable radiation sources, configured to provide a plurality of beams modulated according to a desired pattern to an exposure area of the substrate, and configured to move the plurality of radiation sources with respect to the exposure area during exposure of the exposure area, the modulator having an output of the plurality of beams to the exposure area, the output having an area less than the area of the output of the plurality of radiation sources; and a projection system configured to project the modulated beams onto the substrate.

75. A lithographic apparatus comprising:

a substrate holder constructed to hold a substrate;

a modulator, comprising a plurality of arrays of individually controllable radiation sources, configured to provide a plurality of beams modulated according to a desired pattern to a respective exposure area of the substrate, and configured to move each array with respect to its respective exposure area, or move the plurality of beams from each array with respect to its respective exposure area, or move both the array and the plurality of beams with respect to the respective exposure area, wherein, in use, a respective exposure area of an array of the plurality of arrays abuts or overlaps a respective exposure area of another array of the plurality of arrays; and a projection system configured to project the modulated beams onto the substrate.

76. A lithographic apparatus, comprising:

a substrate holder constructed to hold a substrate;

a modulator, comprising a plurality of individually controllable radiation sources, configured to provide a plurality of beams modulated according to a desired pattern to an exposure area of the substrate, and configured to move each of the plurality of radiation sources with respect to the exposure area, or move the plurality of beams with respect to the exposure area, or move both each of the plurality of radiation sources and the plurality of beams with respect to the exposure area, wherein, during use, each of the radiation sources are operated in the steep part of its respective power/forward current curve; and a projection system configured to project the modulated beams onto the substrate.

77. A lithographic apparatus, comprising:

a substrate holder constructed to hold a substrate;

a modulator, comprising a plurality of individually controllable radiation sources, configured to provide a plurality of beams modulated according to a desired pattern to an exposure area of the substrate, and configured to move each of the plurality of radiation sources with respect to the exposure area, or move the plurality of beams with respect to the exposure area, or move both each of the plurality of radiation sources and the plurality of beams with respect to the exposure area, wherein each of the individually controllable radiation sources comprises a blue-violet laser diode; and a projection system configured to project the modulated beams onto the substrate.

78. A lithographic apparatus, comprising:

a substrate holder constructed to hold a substrate;

a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged in at least two concentric circular arrays; and a projection system configured to project the modulated beams onto the substrate.

79. The lithographic apparatus according to embodiment 78, wherein at least one circular array of the circular arrays is arranged in a staggered manner to at least one other circular array of the circular arrays.

80. A lithographic apparatus, comprising:

a substrate holder constructed to hold a substrate;

a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged around a center of a structure and the structure having inward of the plurality of radiation source an opening extending through the structure; and a projection system configured to project the modulated beams onto the substrate.

81. The lithographic apparatus according to embodiment 80, further comprising a support to hold support structure at or outside of the radiation sources.

82. The lithographic apparatus according to embodiment 81, wherein the support comprises a bearing to permit movement of the structure.

83. The lithographic apparatus according to embodiment 81 or embodiment 82, wherein the support comprises a motor to move the structure.

84. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged around a center of a structure;
a support to support the structure at or outside of the radiation sources, the support configured to rotate or allow rotation of the structure; and
a projection system configured to project the modulated beams onto the substrate.

85. The lithographic apparatus according to embodiment 84, wherein the support comprises a bearing to permit rotation of the structure.

86. The lithographic apparatus according to embodiment 84 or embodiment 85, wherein the support comprises a motor to rotate the structure.

87. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged on a movable structure, which is in turn arranged on a movable plate; and
a projection system configured to project the modulated beams onto the substrate.

88. The lithographic apparatus according to embodiment 87, wherein the movable structure is rotatable.

89. The lithographic apparatus according to embodiment 87 or embodiment 88, wherein the movable plate is rotatable.

90. The lithographic apparatus according to embodiment 89, wherein the center of rotation of the movable plate is not coincident with the center of rotation of the movable structure.

91. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged in or on a movable structure;
a fluid channel arranged in the movable structure to provide a temperature controlling fluid to at least adjacent the plurality of radiation sources; and
a projection system configured to project the modulated beams onto the substrate.

92. The lithographic apparatus according to embodiment 91, further comprising a sensor located in or on the movable structure.

93. The lithographic apparatus according to embodiment 91 or embodiment 92, further comprising a sensor located at a position adjacent to at least one radiation source of the plurality of radiation sources but not in or on the movable structure.

94. The lithographic apparatus according to embodiment 92 or embodiment 93, wherein the sensor comprises a temperature sensor.

95. The lithographic apparatus according to any one of embodiments 92-94, wherein the sensor comprises a sensor configured to measure an expansion and/or contraction of the structure.

96. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged in or on a movable structure;
a fin arranged in or on the movable structure to provide temperature control of the structure; and
a projection system configured to project the modulated beams onto the substrate.

97. The lithographic apparatus according to embodiment 96, further comprising a stationary fin to cooperate with the fin in or on the movable structure.

98. The lithographic apparatus according to embodiment 97, comprising at least two fins in or on the movable structure and the stationary fin is located between at least one fin of the fins in or on the movable structure and at least one other fin of the fins in or on the movable structure.

99. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged in or on a movable structure;
a fluid supply device configured to supply a fluid to an outside surface of the structure to control a temperature of the structure; and
a projection system configured to project the modulated beams onto the substrate.

100. The lithographic apparatus according to embodiment 99, wherein the fluid supply device is configured to supply gas.

101. The lithographic apparatus according to embodiment 99, wherein the fluid supply device is configured to supply a liquid.

102. The lithographic apparatus according to embodiment 101, further comprising a fluid confinement structure configured to maintain the liquid in contact with the structure.

103. The lithographic apparatus according to embodiment 102, wherein the fluid confinement structure is configured to maintain a seal between the structure and the fluid confinement structure.

104. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area;
a structurally separated lens attached near or to each radiation source of the plurality of radiation sources and movable with respective radiation source.

105. The lithographic apparatus according to embodiment 104, further comprising an actuator configured to displace a lens relative its respective radiation source.

106. The lithographic apparatus according to embodiment 104 or embodiment 105, further comprising an actuator configured to displace a lens and its respective radiation source relative a structure supporting the lens and its respective radiation source.

107. The lithographic apparatus according to embodiment 105 or embodiment 106, wherein the actuator is configured to move the lens in up to 3 degrees of freedom.

108. The lithographic apparatus according to any one of embodiments 104-107, further comprising an aperture structure downstream from at least one radiation source of the plurality of radiation sources.

109. The lithographic apparatus according to any one of embodiments 104-107, wherein the lens is attached to a structure supporting the lens and its respective radiation source with a high thermal conductivity material.

110. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area;
a spatial coherence disrupting device configured to scramble radiation from at least one radiation source of the plurality of radiation sources; and
a projection system configured to project the modulated beams onto the substrate.

111. The lithographic apparatus according to embodiment 110, wherein the spatial coherence disrupting device comprises a stationary plate and the at least radiation source is movable with respect to the plate.

112. The lithographic apparatus according to embodiment 110, wherein the spatial coherence disrupting device comprises at least one selected from the following: a phase modulator, a rotating plate or a vibrating plate.

113. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area;
a sensor configured to measure focus associated with at least one radiation source of the plurality of radiation sources, at least part of the sensor in or on the at least one radiation source; and
a projection system configured to project the modulated beams onto the substrate.

114. The lithographic apparatus according to embodiment 113, wherein the sensor is configured to measure focus associated with each of the radiation sources individually.

115. The lithographic apparatus according to embodiment 113 or embodiment 114, wherein the sensor is knife edge focus detector.

116. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area;
a transmitter configured to wirelessly transmit a signal and/or power to the plurality of radiation sources to respectively control and/or power the plurality of radiation sources; and
a projection system configured to project the modulated beams onto the substrate.

117. The lithographic apparatus according to embodiment 116, wherein the signal comprises a plurality of signals and further comprising a demultiplexer to send each of the plurality of signals toward a respective radiation source.

118. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged in or on a movable structure;
a single line, connecting a controller to the movable structure, to transmit a plurality of signals and/or power to the plurality of radiation sources to respective control and/or power the plurality of radiation sources; and
a projection system configured to project the modulated beams onto the substrate.

119. The lithographic apparatus according to embodiment 118, wherein the signal comprises a plurality of signals and further comprising a demultiplexer to send each of the plurality of signals toward a respective radiation source.

120. The lithographic apparatus according to embodiment 118 or embodiment 119, wherein the line comprises an optical line.

121. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area;
a sensor to measure a characteristic of radiation that is or to be transmitted toward the substrate by at least one radiation source of the plurality of radiation sources; and
a projection system configured to project the modulated beams onto the substrate.

122. The lithographic apparatus according to embodiment 121, wherein at least part of the sensor is located in or on the substrate holder.

123. The lithographic apparatus according to embodiment 122, wherein the at least part of the sensor is located in or on the substrate holder at a position outside of an area on which the substrate is supported on the substrate holder.

124. The lithographic apparatus according to any one of embodiments 121-123, wherein at least part of the sensor is located at a side of the substrate that, in use, substantially extends in a scanning direction of the substrate.

125. The lithographic apparatus according to any one of embodiments 121-124, wherein at least part of the sensor is mounted in or on a frame to support the movable structure.

126. The lithographic apparatus according to any one of embodiments 121-125, wherein the sensor is configured to measure radiation from the at least one radiation source outside of the exposure area.

127. The lithographic apparatus according to any one of embodiments 121-126, wherein at least part of the sensor is movable.

128. The lithographic apparatus according to any one of embodiments 121-127, further comprising a controller configured to calibrate the at least one radiation source based on the sensor results.

129. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, the plurality of radiation sources arranged in or on a movable structure;
a sensor to measure a position of the movable structure; and
a projection system configured to project the modulated beams onto the substrate.

130. The lithographic apparatus according to embodiment 129, wherein at least part of the sensor is mounted in or on a frame that supports the movable structure.

131. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area, each of the plurality of radiation sources having or providing an identification;
a sensor configured to detect the identification; and
a projection system configured to project the modulated beams onto the substrate.

132. The lithographic apparatus according to embodiment 131, wherein at least part of the sensor is mounted in or on a frame that supports the plurality of radiation sources.

133. The lithographic apparatus according to embodiment 131 or embodiment 132, wherein the identification comprises a frequency of radiation from a respective radiation source.

134. The lithographic apparatus according to any one of embodiments 131-133, wherein the identification comprises at least one selected from the following: a bar code, a radio frequency identification, or a mark.

135. A lithographic apparatus, comprising:
a substrate holder constructed to hold a substrate;
a modulator, comprising a plurality of individually controllable radiation sources, configured to provide a plurality of beams modulated according to a desired pattern to an exposure area of the substrate, and configured to move each of the plurality of radiation sources with respect to the exposure area;
a sensor configured to detect radiation from at least one radiation source of the plurality of radiation sources, redirected by the substrate; and
a projection system configured to project the modulated beams onto the substrate.

136. The lithographic apparatus according to embodiment 135, wherein the sensor is configured to determine a location of a spot of the radiation from the at least one radiation source incident on the substrate from the redirected radiation.

137. The lithographic apparatus according to any one of embodiments 70-136, wherein the modulator is configured to rotate at least one radiation source around an axis substantially parallel to a direction of propagation of the plurality of beams.

138. The lithographic apparatus according to any one of embodiments 70-137, wherein the modulator is configured to translate at least one radiation source in a direction transverse to a direction of propagation of the plurality of beams.

139. The lithographic apparatus according to any one of embodiments 70-138, wherein the modulator comprises a beam deflector configured to move the plurality of beams.

140. The lithographic apparatus according to embodiment 139, wherein the beam deflector is selected from the group consisting of: mirror, prism, or acoustic-optical modulator.

141. The lithographic apparatus according to embodiment 139, wherein the beam deflector comprises a polygon.

142. The lithographic apparatus according to embodiment 139, wherein the beam deflector is configured to vibrate.

143. The lithographic apparatus according to embodiment 139, wherein the beam deflector is configured to rotate.

144. The lithographic apparatus according to any one of embodiments 70-143, wherein the substrate holder is configured to move the substrate in a direction along which the plurality of beams are provided.

145. The lithographic apparatus according to embodiment 144, wherein the movement of the substrate is a rotation.

146. The lithographic apparatus according any one of embodiments 70-145, wherein the plurality of radiation sources are movable together.

147. The lithographic apparatus according to any one of embodiments 70-146, wherein the plurality of radiation sources are arranged in a circular manner.

148. The lithographic apparatus according to any one of embodiments 70-147, wherein the plurality of radiation sources are arranged in a plate and spaced apart from each other.

149. The lithographic apparatus according to any one of embodiments 70-148, wherein the projection system comprises a lens array.

150. The lithographic apparatus according to any one of embodiments 70-149, wherein the projection system consists essentially of a lens array.

151. The lithographic apparatus according to embodiment 149 or embodiment 150, wherein a lens of the lens array has a high numerical aperture and the lithographic apparatus is configured to have the substrate out of the focus of the radiation associated with the lens to effectively lower the numerical aperture of the lens.

152. The lithographic apparatus according to any one of embodiments 70-151, wherein each of the radiation sources comprises a laser diode.

153. The lithographic apparatus according to embodiment 152, wherein each laser diode is configured to emit radiation having a wavelength of about 405 nm 154. The lithographic apparatus according to any one of embodiments 70-153, further comprising a temperature controller configured to maintain the plurality of radiation sources at a substantially constant temperature during exposure.

155. The lithographic apparatus according to embodiment 154, wherein the controller is configured to heat the plurality of radiation sources to a temperature at or near the substantially constant temperature prior to exposure.

156. The lithographic apparatus according to any one of embodiments 70-155, comprising at least 3 separate arrays arranged along a direction, each of the arrays comprising a plurality of radiation sources.

157. The lithographic apparatus according to any one of embodiments 70-156, wherein the plurality of radiation sources comprises at least about 1200 radiation sources.

158. The lithographic apparatus according to any one of embodiments 70-157, further comprising an alignment sensor to determine alignment between at least one radiation source of the plurality of radiation sources and the substrate.

159. The lithographic apparatus according to any one of embodiments 70-158, further comprising a level sensor to determine a position of the substrate relative to a focus of at least one beam of the plurality of beams.

160. The lithographic apparatus according to embodiment 158 or embodiment 159, further comprising a controller configured to alter the pattern based on alignment sensor results and/or level sensor results.

161. The lithographic apparatus according any one of embodiments 70-160, further comprising a controller configured to alter the pattern based on a measurement of a temperature of or associated with at least one radiation source of the plurality of radiation sources.

162. The lithographic apparatus according any one of embodiments 70-161, further comprising a sensor to measure a characteristic of radiation that is or to be transmitted toward the substrate by at least one radiation source of the plurality of radiation sources.

163. A lithographic apparatus comprising:
a plurality of individually controllable radiation sources configured to provide a plurality of beams modulated according to a desired pattern;
a lens array comprising a plurality of lenslets; and
a substrate holder constructed to hold a substrate,
wherein, during use, there are no other optics besides the lens array between the plurality of radiation sources and the substrate.

164. A programmable patterning device, comprising:
a substrate having thereon an array of radiation emitting diodes spaced apart in at least one direction; and
a lens array on a radiation downstream side of the radiation emitting diodes.

165. The programmable patterning device according to embodiment 164, wherein the lens array comprises a microlens array having a plurality of microlenses, a number of the microlenses corresponding to a number of radiation emitting diodes and positioned to focus radiation selectively passed by respective ones of the radiation emitting diodes into an array of microspots.

166. The programmable patterning device according to embodiment 164 or embodiment 165, wherein the radiation emitting diodes are spaced apart in at least two orthogonal directions.

167. The programmable patterning device according to any one of embodiments 164-166, wherein the radiation emitting diodes are embedded in a material of low thermal conductivity.

168. A device manufacturing method comprising:
providing a plurality of beams modulated according to a desired pattern toward an exposure area of a substrate using a plurality of individually controllable radiation sources;
moving at least one of the plurality of radiation sources while providing the plurality of beams such that only less than all of the plurality of radiation sources can expose the exposure area at any one time; and
projecting the plurality of beams onto the substrate.

169. A device manufacturing method comprising:
providing a plurality of beams modulated according to a desired pattern using a plurality of individually controllable radiation sources;
moving at least one of the plurality of radiation sources between a location where it emits radiation and a location where it does not; and
projecting the plurality of beams onto a substrate.

170. A device manufacturing method comprising providing a beam modulated according to a desired pattern using a plurality of individually controllable radiation sources and projecting the modulated beam from the plurality of individually controllable radiation sources to a substrate using only a lens array.

171. A device manufacturing method comprising:
providing a plurality of beams of electromagnetic radiation modulated according to a desired pattern using a plurality of individually controllable radiation sources;
moving at least one radiation source of the plurality of radiation sources with respect to an exposure area during exposure of the exposure area such that radiation from the at least one radiation source at the same time abuts or overlaps radiation from at least one other radiation source of the plurality of radiation sources; and
projecting the plurality of beams onto a substrate.

172. The method according to any one of embodiments 168-171, wherein the moving comprises rotating at least one radiation source around an axis substantially parallel to a direction of propagation of the plurality of beams.

173. The method according to any one of embodiments 168-172, wherein the moving comprises translating at least one radiation source in a direction transverse to a direction of propagation of the plurality of beams.

174. The method according to any one of embodiments 168-173, comprising moving the plurality of beams by using a beam deflector.

175. The method according to embodiment 174, wherein the beam deflector is selected from the group consisting of: mirror, prism, or acoustic-optical modulator.

176. The method according to embodiment 174, wherein the beam deflector comprises a polygon.

177. The method according to embodiment 174, wherein the beam deflector is configured to vibrate.

178. The method according to embodiment 174, wherein the beam deflector is configured to rotate.

179. The method according to any one of embodiments 168-178, comprising moving the substrate in a direction along which the plurality of beams are provided.

180. The method according to embodiment 179, wherein the movement of the substrate is a rotation.

181. The method according any one of embodiments 168-180, comprising moving the plurality of radiation sources together.

182. The method according to any one of embodiments 168-181, wherein the plurality of radiation sources are arranged in a circular manner.

183. The method according to any one of embodiments 168-182, wherein the plurality of radiation sources are arranged in a plate and spaced apart from each other.

184. The method according to any one of embodiments 168-183, wherein the projecting comprises forming an image of each of the beams onto the substrate using a lens array.

185. The method according to any one of embodiments 168-184, wherein the projecting comprises forming an image of each of the beams onto the substrate using essentially only a lens array.

186. The method according to any one of embodiments 168-185, wherein each of the radiation sources comprises a laser diode.

187. The method according to embodiment 186, wherein each laser diode is configured to emit radiation having a wavelength of about 405 nm.

188. A flat panel display manufactured according to the method of any one of embodiments 168-187.

189. An integrated circuit device manufactured according to the method of any one of embodiments 168-187.

190. A radiation system, comprising:
a plurality of movable radiation arrays, each radiation array comprising a plurality of individually controllable radiation sources configured to provide a plurality of beams modulated according to a desired pattern; and
a motor configured to move each of the radiation arrays.

191. The radiation system according to embodiment 190, wherein the motor is configured to rotate each of the radiation arrays around an axis substantially parallel to a direction of propagation of the plurality of beams.

192. The radiation system according to embodiment 190 or embodiment 191, wherein the motor is configured to translate each of the radiation arrays in a direction transverse to a direction of propagation of the plurality of beams.

193. The radiation system according to any one of embodiments 190-192, further comprising a beam deflector configured to move the plurality of beams.

194. The radiation system according to embodiment 193, wherein the beam deflector is selected from the group consisting of: mirror, prism, or acoustic-optical modulator.

195. The radiation system according to embodiment 193, wherein the beam deflector comprises a polygon.

196. The radiation system according to embodiment 193, wherein the beam deflector is configured to vibrate.

197. The radiation system according to embodiment 193, wherein the beam deflector is configured to rotate.

198. The radiation system according to any one of embodiments 190-197, wherein the plurality of radiation sources of each of the radiation arrays are movable together.

199. The radiation system according to any one of embodiments 190-198, wherein the plurality of radiation sources of each of the radiation arrays are arranged in a circular manner.

200. The radiation system according to any one of embodiments 190-199, wherein the plurality of radiation sources of each of the radiation arrays are arranged in a plate and spaced apart from each other.

201. The radiation system according to any one of embodiments 190-200, further comprising a lens array associated with each of the radiation arrays.

202. The radiation system according to embodiment 201, wherein each of the plurality of radiation sources of each of the radiation arrays is associated with a lens of a lens array associated with the radiation array.

203. The radiation system according to any one of embodiments 190-202, wherein each of the plurality of sources of each of the radiation arrays comprises a laser diode.

204. The radiation system according to embodiment 203, wherein each laser diode is configured to emit radiation having a wavelength of about 405 nm 205. A lithographic apparatus for exposing a substrate to radiation, the apparatus comprising a programmable patterning device having 100-25000 self-emissive individually addressable elements.

206. The lithographic apparatus according to embodiment 205, comprising at least 400 self-emissive individually addressable elements.

207. The lithographic apparatus according to embodiment 205, comprising at least 1000 self-emissive individually addressable elements.

208. The lithographic apparatus according to any one of embodiments 205-207, comprising less than 10000 self-emissive individually addressable elements.

209. The lithographic apparatus according to any one of embodiments 205-207, comprising less than 5000 self-emissive individually addressable elements.

210. The lithographic apparatus according to any one of embodiments 205-209, wherein the self-emissive individually addressable elements are laser diodes.

211. The lithographic apparatus according to any one of embodiments 205-209, wherein the self-emissive individually addressable elements are arranged to have a spot size on the substrate selected from the range of 0.1-3 microns.

212. The lithographic apparatus according to any one of embodiments 205-209, wherein the self-emissive individually addressable elements are arranged to have a spot size on the substrate of about 1 micron.

213. A lithographic apparatus for exposing a substrate to radiation, the apparatus comprising a programmable patterning device having, normalized to an exposure field length of 10 cm, 100-25000 self-emissive individually addressable elements.

214. The lithographic apparatus according to embodiment 213, comprising at least 400 self-emissive individually addressable elements.

215. The lithographic apparatus according to embodiment 213, comprising at least 1000 self-emissive individually addressable elements.

216. The lithographic apparatus according to any one of embodiments 213-215, comprising less than 10000 self-emissive individually addressable elements.

217. The lithographic apparatus according to any one of embodiments 213-215, comprising less than 5000 self-emissive individually addressable elements.

218. The lithographic apparatus according to any one of embodiments 213-217, wherein the self-emissive individually addressable elements are laser diodes.

219. The lithographic apparatus according to any one of embodiments 213-217, wherein the self-emissive individually addressable elements are arranged to have a spot size on the substrate selected from the range of 0.1-3 microns.

220. The lithographic apparatus according to any one of embodiments 213-217, wherein the self-emissive individually addressable elements are arranged to have a spot size on the substrate of about 1 micron.

221. A programmable patterning device comprising a rotatable disk, the disk having 100-25000 self-emissive individually addressable elements.

222. The programmable patterning device according to embodiment 221, wherein the disk comprises at least 400 self-emissive individually addressable elements.

223. The programmable patterning device according to embodiment 221, wherein the disk comprises at least 1000 self-emissive individually addressable elements.

224. The programmable patterning device according to any one of embodiments 221-223, wherein the disk comprises less than 10000 self-emissive individually addressable elements.

225. The programmable patterning device according to any one of embodiments 221-223, wherein the disk comprises less than 5000 self-emissive individually addressable elements.

226. The programmable patterning device according to any one of embodiments 221-225, wherein the self-emissive individually addressable elements are laser diodes.

227. Use of one or more of the present inventions in the manufacture of flat panel displays.

228. Use of one or more of the present inventions in integrated circuit packaging.

229. A lithographic method comprising exposing a substrate to radiation using a programmable patterning device having self-emissive elements, wherein the power consumption of the programmable patterning device, during the exposing, to operate said self-emissive elements is less than 10 kW.

230. The method according to embodiment 229, wherein the power consumption is less than 5 kW.

231. The method according to embodiment 229 or embodiment 230, wherein the power consumption is at least 100 mW.

232. The method according to any one of embodiments 229-231, wherein the self-emissive elements are laser diodes.

233. The method according to embodiment 232, wherein the laser diodes are blue-violet laser diodes.
234. A lithographic method comprising exposing a substrate to radiation using a programmable patterning device having self-emissive elements, wherein the optical output per emissive element, when in use, is at least 1 mW.
235. The method according to embodiment 234, wherein the optical output is at least 10 mW.
236. The method according to embodiment 234, wherein the optical output is at least 50 mW.
237. The method according to any one of embodiments 234-236, wherein the optical output is less than 200 mW.
238. The method according to any one of embodiments 234-237, wherein the self-emissive elements are laser diodes.
239. The method of embodiment 238, wherein the laser diodes are blue-violet laser diodes.
240. The method of embodiment 234, wherein the optical output is greater than 5 mW but less than or equal to 20 mW.
241. The method of embodiment 234, wherein the optical output is greater than 5 mW but less than or equal to 30 mW.
242. The method of embodiment 234, wherein the optical output is greater than 5 mW but less than or equal to 40 mW.
243. The method of any one of embodiments 234-242, wherein the self-emissive elements are operated in single mode.
244. A lithographic apparatus comprising:
 a programmable patterning device having self-emissive elements; and
 a rotatable frame having optical elements for receiving radiation from the self-emissive elements, the optical elements being refractive optical elements.
245. A lithographic apparatus comprising:
 a programmable patterning device having self-emissive elements; and
 a rotatable frame having optical elements for receiving radiation from the self-emissive elements, the rotatable frame having no reflective optical element to receive radiation from any or all of the self-emissive elements.
246. A lithographic apparatus comprising:
 a programmable patterning device; and
 a rotatable frame, the rotatable frame comprising a plate with optical elements, a surface of the plate with optical elements being flat.
247. Use of one or more of the inventions in the manufacture of flat panel displays.
248. Use of one or more of the inventions in integrated circuit packaging.
249. A flat panel display manufactured according to any of the methods.
250. An integrated circuit device manufactured according to any of the methods.
251. A lithographic apparatus comprising:
 an optical column capable of projecting a beam on a target portion of a substrate, the optical column comprising a projection system configured to project the beam onto the target portion;
 a scanning movement actuator to move the substrate with a scanning speed in a scanning direction with respect to the optical column; and
 a rotating movement actuator to rotate the optical column or a part thereof with a rotating frequency resulting in a tangential rotation speed of the beam on the target portion,
 wherein the target portion has a height in the scanning direction and a tangential width mainly perpendicular to the scanning direction, wherein the scanning speed divided by the height substantially corresponds with the rotation speed of the beam divided by the tangential width.

252. The apparatus of embodiment 251, wherein the rotating frequency of the rotatable column or part thereof is selected from the range of 2500 to 10000 rpm, from the range of 4000 to 6000 rpm, or from the range of 4500 to 5000 rpm.
253. The apparatus of embodiment 251 or embodiment 252, wherein the optical column comprises a self-emissive contrast device configured to emit the beam.
254. The apparatus of embodiment 253, wherein the self-emissive contrast device is mounted on a stationary part of the optical column.
255. The apparatus of embodiment 253 or embodiment 254, wherein the optical column comprises multiple self-emissive contrast devices arranged with a radial pitch.
256. The apparatus of embodiment 255, wherein the number of self-emissive contrast devices per optical column is selected from the range of 2 to 40, from the range of 5 to 20, or from the range of 8 to 15.
257. The apparatus of any of embodiments 254 to 256, wherein the radial pitch, at the projection image plane on the substrate, is selected from the range of 50% to 95%, from the range of 70% to 90%, or from the range of 75% to 85% of a projection resolution of the apparatus.
258. The apparatus of embodiment 257, wherein the projection resolution is smaller than or equal to 10 µm, or smaller than or equal to 5 µm, or smaller than or equal to 2 µm.
259. The apparatus of any of embodiments 251 to 258, wherein the radius of a central axis of the optical column comprising lenses is selected from the range of 50 to 500 mm, from the range of 100 to 350 mm, or from the range of 200 and 250 mm.
260. The apparatus of any of embodiments 251 to 259, wherein the rotation speed of the beam on the target portion is selected from the range of 25 to 400 m/s, from the range of 50 to 200 m/s, or from the range of 80 to 140 m/s.
261. The apparatus of any of embodiments 251 to 260, wherein the tangential width of the target portion is selected from the range of 5 to 40 mm, from the range of 8 to 20 mm, or from the range of 10 to 15 mm.
262. The apparatus of any of embodiments 251 to 261, comprising multiple optical columns, each optical column having one or more self-emissive contrast devices configured to project a beam on a respective target portion, the respective target portions of the multiple optical columns being spaced in a direction perpendicular to the scanning direction.
263. The apparatus of embodiment 262, wherein the respective target portions cover the dimension of the substrate in the direction perpendicular to the scanning direction.
264. The apparatus of any of embodiments 251 to 261, comprising multiple rotatable optical columns or parts thereof.
265. The apparatus of any of embodiments 251 to 264, wherein the target portions in the scanning direction and/or in the direction perpendicular to the scanning direction partially overlap.
266. Method of decreasing an exposure time divided by a substrate length in the lithographic apparatus of embodiment 251, comprising one or more selected from the following:
 increasing the number of self-emissive contrast devices per optical column,
 increasing the radius of a central axis of the optical column on the rotatable part,
 increasing the rotating frequency of the rotatable part,
 decreasing the width of a target portion,
 minimizing the distance between a plurality of optical columns in the scanning direction, and
 decreasing the width of a target portion in the tangential direction.

Although specific reference may be made in this text to the use of a lithographic apparatus in the manufacture of a specific device or structure (e.g. an integrated circuit or a flat panel display), it should be understood that the lithographic apparatus and lithographic method described herein may have other applications. Applications include, but are not limited to, the manufacture of integrated circuits, integrated optical systems, guidance and detection patterns for magnetic domain memories, flat panel displays, LCDs, OLED displays, thin film magnetic heads, micro-electromechanical devices (MEMS), micro-opto-electromechanical systems (MOEMS), DNA chips, packaging (e.g., flip chip, redistribution, etc.), flexible displays or electronics (which are displays or electronics that may be rollable, bendable like paper and remain free of deformities, conformable, rugged, thin, and/or lightweight, e.g., flexible plastic displays), etc. Also, for instance in a flat panel display, the present apparatus and method may be used to assist in the creation of a variety of layers, e.g. a thin film transistor layer and/or a color filter layer. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

A flat panel display substrate may be rectangular in shape. A lithographic apparatus designed to expose a substrate of this type may provide an exposure region which covers a full width of the rectangular substrate, or which covers a portion of the width (for example half of the width). The substrate may be scanned underneath the exposure region, while the patterning device is synchronously scanned through the patterned beam or the patterning device provides a varying pattern. In this way, all or part of the desired pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The term "patterning device", used herein should be broadly interpreted as referring to any device that can be used to modulate the cross-section of a radiation beam such as to create a pattern in (part of) the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, e.g., an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of an electronic devices (e.g., a computer), e.g., patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. The programmable mirror array may comprise a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate. In this manner, the beam becomes patterned according to the addressing pattern of the matrix-addressable surface. It will be appreciated that, as an alternative, the filter may filter out the diffracted radiation, leaving the undiffracted radiation to reach the substrate. An array of diffractive optical MEMS devices may also be used in a corresponding manner. A diffractive optical MEMS device may comprise a plurality of reflective ribbons that may be deformed relative to one another to form a grating that reflects incident radiation as diffracted radiation. A further embodiment of a programmable mirror array employs a matrix arrangement of tiny mirrors, each of which may be individually tilted about an axis by applying a suitable localized electric field, or by employing piezoelectric actuation means. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. No. 5,296,891 and U.S. Pat. No. 5,523,193, and PCT Patent Application Publication Nos. WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually controllable elements, each controlled independently of each other. In such an arrangement, some or all of the arrays of individually controllable elements may have at least one of a common illumination system (or part of an illumination system), a common support structure for the arrays of individually controllable elements and/or a common projection system (or part of the projection system).

It should be appreciated that where pre-biasing of features, optical proximity correction features, phase variation techniques and/or multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

The projection system and/or illumination system may include various types of optical components, e.g., refractive, reflective, magnetic, electromagnetic, electrostatic or other types of optical components, or any combination thereof, to direct, shape, or control the beam of radiation.

The lithographic apparatus may be of a type having two (e.g., dual stage) or more substrate tables (and/or two or more patterning device tables). In such "multiple stage" machines the additional table(s) may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are used to increase the NA of projection system. The term "immersion" as used herein does not mean that a structure, e.g., a substrate, must be submerged in liquid, but rather only means that liquid is located between the projection system and the substrate during exposure.

Further, the apparatus may be provided with a fluid processing cell to allow interactions between a fluid and irradiated parts of the substrate (e.g., to selectively attach chemicals to the substrate or to selectively modify the surface structure of the substrate).

In an embodiment, the substrate has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist). Properties of the substrate may be measured before or after exposure, for example in a metrology tool and/or an inspection tool.

In an embodiment, a resist layer is provided on the substrate. In an embodiment, the substrate is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color.

While, in an embodiment, the patterning device 104 is described and/or depicted as being above the substrate 114, it may instead or additionally be located under the substrate 114. Further, in an embodiment, the patterning device 104 and the substrate 114 may be side by side, e.g., the patterning device 104 and substrate 114 extend vertically and the pattern is projected horizontally. In an embodiment, a patterning device 104 is provided to expose at least two opposite sides of a substrate 114. For example, there may be at least two patterning devices 104, at least on each respective opposing side of the substrate 114, to expose those sides. In an embodiment, there may be a single patterning device 104 to project one side of the substrate 114 and appropriate optics (e.g., beam directing mirrors) to project a pattern from the single patterning device 104 onto another side of the substrate 114.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. For example, in an embodiment, the movable individually controllable elements embodiment of FIG. 5 may be combined with a non-movable array of individually controllable elements, for example, to provide or have a back-up system.

Thus, while various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the claims and their equivalents.

What is claimed is:

1. An apparatus comprising:
    an optical column capable of projecting a beam on a target portion of a substrate, the optical column comprising a projection system configured to project the beam onto the target portion;
    a scanning movement actuator to move the substrate with a scanning speed in a scanning direction with respect to the optical column; and
    a rotating movement actuator to rotate the optical column or a part thereof with a rotating frequency resulting in a tangential rotation speed of the beam on the target portion,
    wherein the target portion has a height in the scanning direction and a tangential width mainly perpendicular to the scanning direction, wherein the scanning speed divided by the height substantially corresponds with the tangential rotation speed of the beam divided by the tangential width.

2. The apparatus of claim 1, wherein the rotating frequency of the rotatable column or part thereof is selected from the range of 2500 to 10000 rpm.

3. The apparatus of claim 1, wherein the optical column comprises a self-emissive contrast device configured to emit the beam.

4. The apparatus of claim 3, wherein the self-emissive contrast device is mounted on a stationary part of the optical column.

5. The apparatus of claim 3, wherein the optical column comprises multiple self-emissive contrast devices arranged with a radial pitch.

6. The apparatus of claim 5, wherein the number of self-emissive contrast devices per optical column is selected from the range of 2 to 40.

7. The apparatus of claim 5, wherein the radial pitch, at the projection image plane on the substrate, is selected from the range of 50% to 95% of a projection resolution of the apparatus.

8. The apparatus of claim 7, wherein the projection resolution is smaller than or equal to 10 μm.

9. The apparatus of claim 1, wherein the radius of a central axis of the optical column comprising lenses is selected from the range of 50 to 500 mm.

10. The apparatus of claim 1, wherein the tangential rotation speed of the beam on the target portion is selected from the range of 25 to 400 m/s.

11. The apparatus of claim 1, wherein the tangential width of the target portion is selected from the range of 5 to 40 mm.

12. The apparatus of claim 1, comprising multiple optical columns, each optical column having one or more self-emissive contrast devices configured to project a beam on a respective target portion, the respective target portions of the multiple optical columns being spaced in a direction perpendicular to the scanning direction.

13. The apparatus of claim 12, wherein the respective target portions cover the dimension of the substrate in the direction perpendicular to the scanning direction.

14. The apparatus of claim 1, comprising multiple rotatable optical columns or parts thereof.

15. A device manufacturing method comprising:
    projecting a beam on a target portion of a substrate using an optical column, the optical column comprising a projection system configured to project the beam onto the target portion;
    moving the substrate with a scanning speed in a scanning direction with respect to the optical column; and
    rotating the optical column or a part thereof with a rotating frequency resulting in a tangential rotation speed of the beam on the target portion,
    wherein the target portion has a height in the scanning direction and a tangential width mainly perpendicular to the scanning direction, wherein the scanning speed divided by the height substantially corresponds with the tangential rotation speed of the beam divided by the tangential width.

16. The method of claim 15, wherein the radius of a central axis of the optical column comprising lenses is selected from the range of 50 to 500 mm.

17. The method of claim 15, wherein the tangential rotation speed of the beam on the target portion is selected from the range of 25 to 400 m/s.

18. The method of claim 15, wherein the tangential width of the target portion is selected from the range of 5 to 40 mm.

19. The method of claim 15, wherein the optical column comprises multiple self-emissive contrast devices arranged with a radial pitch, the radial pitch, at the projection image plane on the substrate, is selected from the range of 50% to 95% of a projection resolution of the apparatus.

20. The method of claim 15, comprising projecting a beam onto a plurality of target portions, wherein the target portions in the scanning direction and/or in the direction perpendicular to the scanning direction partially overlap.

* * * * *